(12) United States Patent
Barton et al.

(10) Patent No.: US 9,360,971 B2
(45) Date of Patent: Jun. 7, 2016

(54) MESH PATTERNS FOR TOUCH SENSOR ELECTRODES

(71) Applicant: 3M INNOVATIVE PROPERTIES COMPANY, St. Paul, MN (US)

(72) Inventors: Roger W. Barton, Afton, MN (US); Billy L. Weaver, Eagan, MN (US); Bernard O. Geaghan, Salem, NH (US); Brock A. Hable, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 616 days.

(21) Appl. No.: 13/689,935

(22) Filed: Nov. 30, 2012

(65) Prior Publication Data
US 2013/0207911 A1  Aug. 15, 2013

Related U.S. Application Data

(60) Provisional application No. 61/597,572, filed on Feb. 10, 2012.

(51) Int. Cl.
*G06F 3/044* (2006.01)
*G06F 3/0488* (2013.01)
*H01B 5/00* (2006.01)

(52) U.S. Cl.
CPC ............. *G06F 3/044* (2013.01); *G06F 3/0488* (2013.01); *H01B 5/00* (2013.01); *G06F 2203/04101* (2013.01); *G06F 2203/04103* (2013.01); *G06F 2203/04111* (2013.01); *G06F 2203/04112* (2013.01)

(58) Field of Classification Search
CPC ............ G06F 2203/04101; G06F 2203/04103; G06F 2203/04111; G06F 2203/04112; G06F 3/044; G06F 3/0488; H01B 5/00
See application file for complete search history.

(56) References Cited

U.S. PATENT DOCUMENTS

| | | | |
|---|---|---|---|
| 4,087,625 | A | 5/1978 | Dym |
| 5,126,007 | A | 6/1992 | Shmulovich |
| 5,386,219 | A | 1/1995 | Greanias |
| 5,492,611 | A | 2/1996 | Sugama |
| 5,512,131 | A | 4/1996 | Kumar |
| 5,844,606 | A | 12/1998 | Suemoto |
| 6,297,811 | B1 | 10/2001 | Kent |
| 6,775,907 | B1 | 8/2004 | Boyko |

(Continued)

FOREIGN PATENT DOCUMENTS

| | | |
|---|---|---|
| EP | 1868263 | 12/2007 |
| EP | 2 157 500 | 2/2010 |

(Continued)

OTHER PUBLICATIONS

International Search Report for PCT/US2012/067186, mailed Mar. 4, 2013, 4 pp.

(Continued)

*Primary Examiner* — Latanya Bibbins
(74) *Attorney, Agent, or Firm* — Steven A. Bern; Clifton F. Richardson

(57) ABSTRACT

An electrode for a touch sensitive device includes micro-wire conductors arranged to define an electrically continuous area and to include interior regions that are electrically discontinuous. The electrically continuous area may be patterned according to a one pattern, and the interior pattern may be patterned according to another pattern.

17 Claims, 27 Drawing Sheets

(56) References Cited

U.S. PATENT DOCUMENTS

| | | |
|---|---|---|
| 7,129,935 B2 | 10/2006 | Mackey |
| 8,004,499 B2 | 8/2011 | Geaghan |
| 8,269,744 B2 | 9/2012 | Agari |
| 8,279,187 B2 | 10/2012 | Geaghan |
| 2006/0119587 A1 | 6/2006 | Aroyan |
| 2007/0074914 A1 | 4/2007 | Geaghan |
| 2007/0160811 A1 | 7/2007 | Gaides |
| 2008/0277259 A1 | 11/2008 | Chang |
| 2009/0219257 A1* | 9/2009 | Frey et al. ............... 345/173 |
| 2009/0219258 A1 | 9/2009 | Geaghan |
| 2010/0026664 A1 | 2/2010 | Geaghan |
| 2010/0045615 A1 | 2/2010 | Gray |
| 2010/0123670 A1 | 5/2010 | Philipp |
| 2010/0156810 A1 | 6/2010 | Barbier |
| 2010/0156840 A1 | 6/2010 | Frey |
| 2010/0201633 A1 | 8/2010 | Mozdzyn |
| 2010/0265210 A1 | 10/2010 | Nakanishi et al. |
| 2010/0302201 A1 | 12/2010 | Ritter |
| 2011/0018557 A1 | 1/2011 | Badaye |
| 2011/0025639 A1 | 2/2011 | Trend |
| 2011/0096025 A1 | 4/2011 | Slobodin |
| 2011/0102370 A1* | 5/2011 | Kono ............... G06F 3/044 345/174 |
| 2011/0290631 A1 | 12/2011 | Kuriki |
| 2011/0291963 A1 | 12/2011 | Woo et al. |
| 2011/0310033 A1 | 12/2011 | Liu et al. |
| 2012/0194441 A1 | 8/2012 | Frey |
| 2013/0154954 A1* | 6/2013 | Chang ............... 345/173 |

FOREIGN PATENT DOCUMENTS

| | | | |
|---|---|---|---|
| EP | 2390771 | 11/2011 | |
| JP | 2006/344163 | 12/2006 | |
| JP | 2011-034183 | 2/2011 | |
| JP | 2012 032955 | 2/2012 | |
| WO | WO 2005/121940 | 12/2005 | |
| WO | WO 2010013679 A1 * | 2/2010 | ............. G06F 3/044 |
| WO | WO 2010-099132 | 9/2010 | |
| WO | WO 2011/093420 | 8/2011 | |

OTHER PUBLICATIONS

U.S. Appl. No. 61/032,273, "Methods of Patterning a Conductor on a Substrate", filed Feb. 28, 2008.
U.S. Appl. No. 61/076,731, "Methods of Formimg a Microstructure", filed Jun. 30, 2008.
U.S. Appl. No. 61/076,736, "Methods of Forming a Patterned Substrate", filed Jun. 30, 2008.
PCT International Search Report from PCT/US2013/025564 mailed May 7, 2013.

* cited by examiner

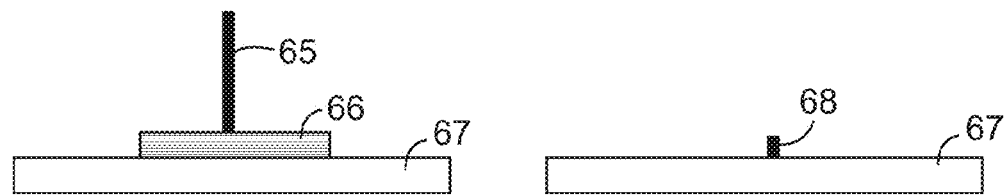
*Fig. 3a*  *Fig. 3b*
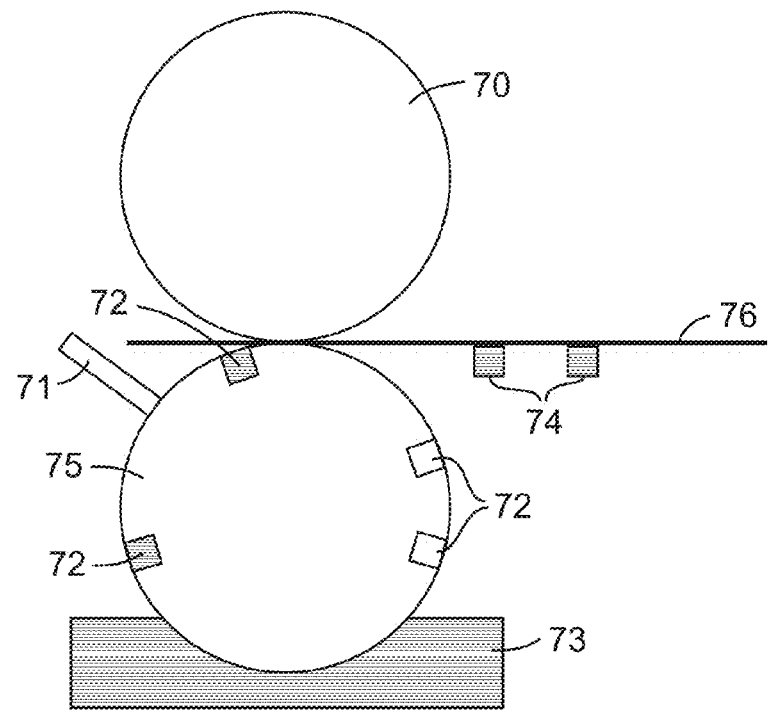
*Fig. 4*
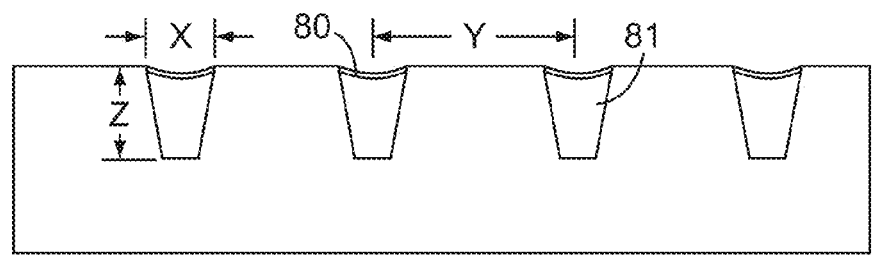
*Fig. 5*

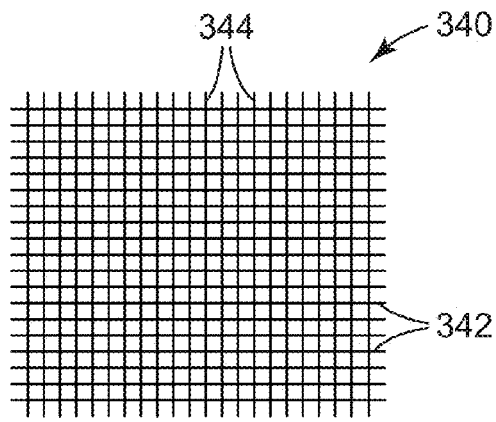
*Fig. 15c*
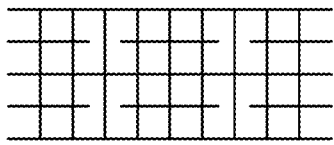 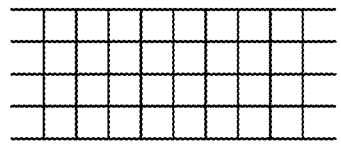
*Fig. 15d*      *Fig. 15e*
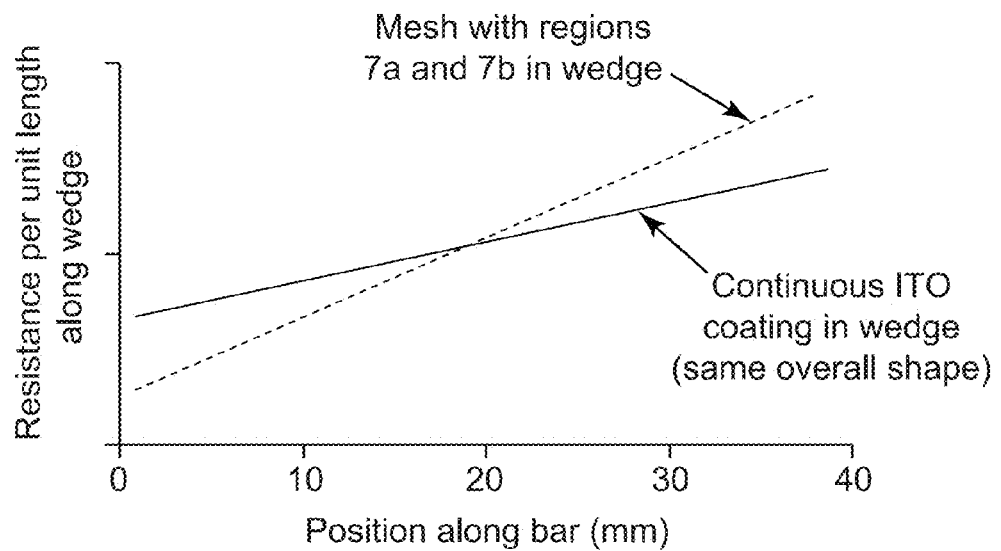
*Fig. 16*

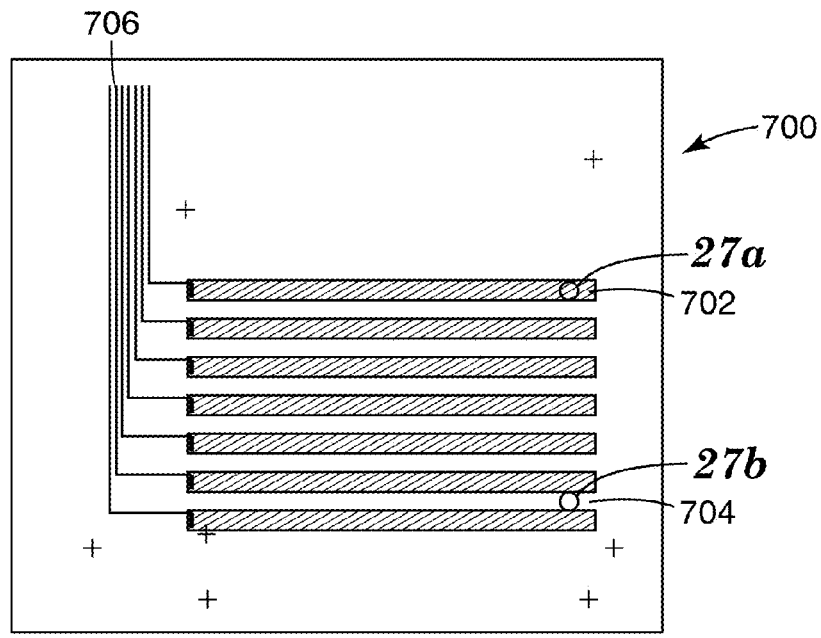
Fig. 27
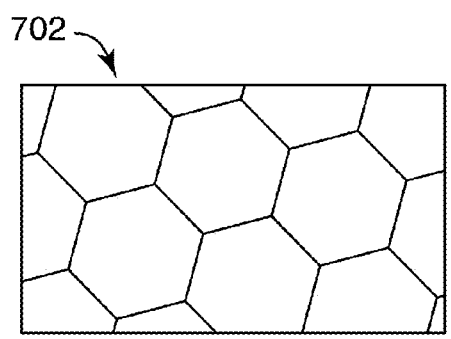 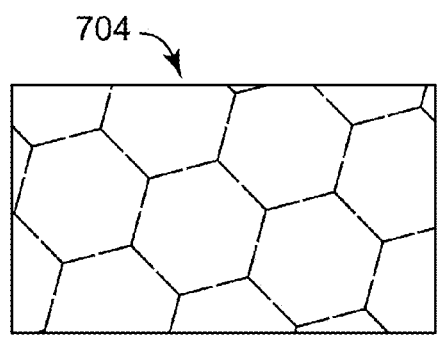
Fig. 27a          Fig. 27b

MESH PATTERNS FOR TOUCH SENSOR ELECTRODES

CROSS REFERENCE TO RELATED APPLICATIONS

This application claims the benefit of U.S. Provisional Patent Application No. 61/597,572, filed Feb. 10, 2012, the disclosure of which is incorporated by reference herein in its entirety.

BACKGROUND

Touch screen sensors detect the location of an object (e.g. a finger or a stylus) applied to the surface of a touch screen display or the location of an object positioned near the surface of a touch screen display. These sensors detect the location of the object along the surface of the display, e.g. in the plane of a flat rectangular display. Examples of touch screen sensors include capacitive sensors, resistive sensors, and projected capacitive sensors. Such sensors include transparent conductive elements that overlay the display. The elements are combined with electronic components that use electrical signals to probe the elements in order to determine the location of an object near or in contact with the display.

In the field of touch screen sensors, there is a need to have improved control over the electrical properties of the transparent touch screen sensors, without compromising optical quality or properties of the display. A transparent conductive region of a typical touch screen sensor includes a continuous coating of a transparent conducting oxide (TCO) such as indium tin oxide (ITO), the coating exhibiting electrical potential gradients based on the location or locations of contact to a voltage source and the overall shape of the region. This fact leads to a constraint on possible touch sensor designs and sensor performance, and necessitates such measures as expensive signal processing electronics or placement of additional electrodes to modify the electrical potential gradients. Thus, there is a need for transparent conductive elements that offer control over electrical potential gradients that is independent of the aforementioned factors.

There is an additional need in the field of touch screen sensors that relates to flexibility in the design of electrically conductive elements. The fabrication of touch screen sensors using patterned transparent conducting oxides (TCO) such as indium tin oxide (ITO) often places limitations on conductor design. The limitations relate to a constraint caused by patterning all of the conductive elements from a transparent sheet conductor that has a single value of isotropic sheet resistance.

SUMMARY

Micro-wire electrode configurations for use, for example, in a touch-sensing application. The electrodes comprise continuous micro-wires patterned coincident with an underlying reference mesh, as well as interior regions comprised of discontinuous micro-wires patterned according to a further pattern. The interior regions are rendered discontinuous by, for example, small breaks in the micro-wire conductors. In some embodiments, the further pattern is the same as that of the underlying reference mesh. The patterning of the interior regions may make them less noticeable to users, and discontinuity of the interior regions may make them more pervious to electric fields than other electrically continuous regions.

In one embodiment, a touch screen sensor is described, the touch screen sensor comprising an upper electrode layer comprising an array of composite electrodes comprised of a plurality of continuous micro-wire conductors disposed in a first pattern; a lower electrode layer comprising a plurality of electrodes; wherein the upper and lower electrodes are separated by a dielectric layer, and together define an electrode matrix having nodes where the upper and lower electrodes intersect; wherein the composite electrodes of the upper electrode layer form interior regions electrically isolated from the composite electrodes, the regions comprised of discontinuous micro-wire conductors.

This and other embodiments are described below.

BRIEF DESCRIPTION OF THE DRAWINGS

The invention may be more completely understood in consideration of the following detailed description of various embodiments of the invention in connection with the accompanying drawings, in which:

FIGS. 3a and 3b illustrates a process for creating microconductors using UV laser curing of a conductive ink;

FIG. 4 illustrates a gravure printing process for creating microconductors;

FIG. 5 illustrates a cross section view of microreplicated channels filled with conductive material;

FIGS. 15a-15e each illustrate a portion of the varying conductor micropattern illustrated in FIG. 15;

FIG. 16 illustrates the distribution of resistance per unit length along the long axis of the wedge-shaped transparent conductive region having regions 15a and 15b therein, as compared with the resistance per unit length for a similarly shaped region comprising only a uniform transparent conducting oxide, ITO;

FIGS. 27, 27a, and 27b illustrate various portions of a first patterned substrate;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Figure 1:
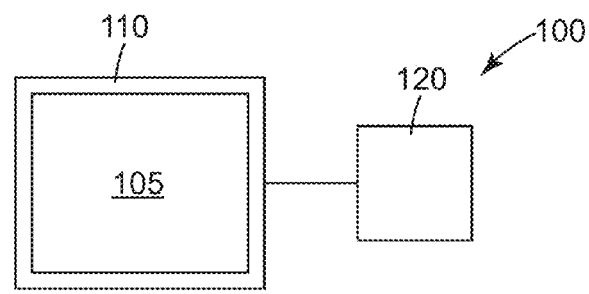
FIG. 1 illustrates a schematic diagram of a touch screen sensor 100.

In the following description, reference is made to the accompanying set of drawings that form a part hereof and in which are shown by way of illustration several specific embodiments. It is to be understood that other embodiments are contemplated and may be made without departing from the scope or spirit of the present invention. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the context clearly dictates otherwise. As used in this specification and the appended claims, the term "or" is generally employed in its sense including "and/or" unless the context clearly dictates otherwise.

As used herein, "visible light transparent" refers to the level of transmission being at least 60 percent transmissive to at least one polarization state of visible light, where the percent transmission is normalized to the intensity of the incident, optionally polarized light. It is within the meaning of visible light transparent for an article that transmits at least 60 percent of incident light to include microscopic features (e.g., dots, squares, or lines with minimum dimension, e.g. width, between 0.5 and 10 micrometers, or between 1 and 5 micrometers) that block light locally to less than 80 percent transmission (e.g., 0 percent); however, in such cases, for an approximately equiaxed area including the microscopic feature and measuring 1000 times the minimum dimension of the microscopic feature in width, the average transmittance is greater than 60 percent.

The present disclosure relates to touch screen sensors with electrical and optical properties that are engineered through design of conductor micropatterns comprised therein. There are several advantages that are created for touch screen sensors by the incorporation of the conductor micropatterns described herein. In some embodiments, the transparent conductive properties within a transparent conductive region are engineered to control the electrical potential gradient within the touch sensing region during use. This leads to simplicity of signal processing electronics and, for some touch screen sensor types simplicity in the design of (or elimination of the need for) additional conductor patterns that would otherwise be needed for electrical potential gradient (electrical field) linearization. In some embodiments, the electrical properties of the touch screen sensors described herein are designed to generate a controlled electrical potential gradient along a transparent sensor element. E.g., the electrical properties are designed to create a linear electrical potential gradient along a particular direction within a transparent conductive region, the overall shape of which would ordinarily lead to a non-linear gradient if a standard transparent conductor material was used (e.g., continuous ITO coating). In some embodiments, the electrical properties are designed to create a level of non-linearity of electrical potential gradient for a transparent conductive region that is greater than that which would be present within a transparent conductive region of the same shape but comprised of a standard transparent conductor material (e.g., continuous ITO coating). In more detail, for a rectangular capacitive touch screen comprising a contiguous transparent sheet conductor in the form of a micropatterned conductor with electrical connections made to the corners of the sensing area, the linearity of electrical potential gradient (and uniformity of electric field) across the sensing area in the vertical and horizontal directions can be improved by engineering the area distribution of sheet resistance values and anisotropy in such a way as to distribute the field more uniformly. In other embodiments, the sensor includes conductor elements comprised of the same conductor material at the same thickness (i.e., height), but with different effective sheet resistance by virtue of micropatterning. E.g., in some embodiments, the same conductor material at the same thickness (i.e., height) is used to generate conductive traces that define a first micropattern geometry, leading to a first level of sheet resistance in a transparent conductive region, and conductive traces that define a second micropattern geometry, leading to a second level of sheet resistance in a second transparent conductive region. This disclosure also allows for improved efficiency and resource utilization in the manufacture of transparent display sensors, e.g. through the avoidance of rare elements such as indium for some embodiments, e.g. embodiments based on micropatterned metal conductors.

The disclosure further relates to contact or proximity sensors for touch input of information or instructions into electronic devices (e.g., computers, cellular telephones, etc.) These sensors are visible light transparent and useful in direct combination with a display, overlaying a display element, and interfaced with a device that drives the display (as a "touch screen" sensor). The sensor element has a sheet like form and includes at least one electrically insulating visible light transparent substrate layer that supports one or more of the following: i) conductive material (e.g., metal) that is mesh patterned onto two different regions of the substrate surface with two different mesh designs so as to generate two regions with different effective sheet resistance values, where at least one of the regions is a transparent conductive region that lies within the touch-sensing area of the sensor; ii) conductive material (e.g., metal) that is patterned onto the surface of the substrate in a mesh geometry so as to generate a transparent conductive region that lies within the touch sensing area of the sensor and that exhibits anisotropic effective sheet resistance; and/or iii) conductive material (e.g., metal) that is patterned onto the surface of the substrate in a mesh geometry within an effectively electrically continuous transparent conductive region, the geometry varying within the region so as to generate different values of local effective sheet resistance in at least one direction (e.g., continuously varying sheet resistance for the transparent conductive region), where the region lies within the sensing area of the touch sensor.

The sensing area of a touch sensor is that region of the sensor that is intended to overlay, or that overlays, a viewable portion of an information display and is visible light transparent in order to allow viewability of the information display. Viewable portion of the information display refers to that portion of an information display that has changeable information content, e.g. the portion of a display "screen" that is occupied by pixels, e.g. the pixels of a liquid crystal display.

This disclosure further relates to touch screen sensors that are of the resistive, capacitive, and projected capacitive types. The visible light transparent conductor micropatterns are particularly useful for projected capacitive touch screen sensors that are integrated with electronic displays. As a component of projected capacitive touch screen sensors, the visible light transparent conductive micropattern are useful for enabling high touch sensitivity, multi-touch detection, and stylus input. The two or more different levels of sheet resistance, the anisotropy of the sheet resistance, or the varying level of sheet resistance within a transparent conductive region can be controlled by the geometries of two-dimensional meshes that make up the transparent micropatterned conductors, as described below.

While the present invention is not so limited, an appreciation of various aspects of the invention will be gained through a discussion of the examples provided below.

FIG. 1 illustrates a schematic diagram of a touch screen sensor 100. The touch screen sensor 100 includes a touch screen panel 110 having a touch sensing area 105. The touch sensing area 105 is electrically coupled to a touch sensor drive device 120. The touch screen panel 110 is incorporated into a display device.

Figure 2:
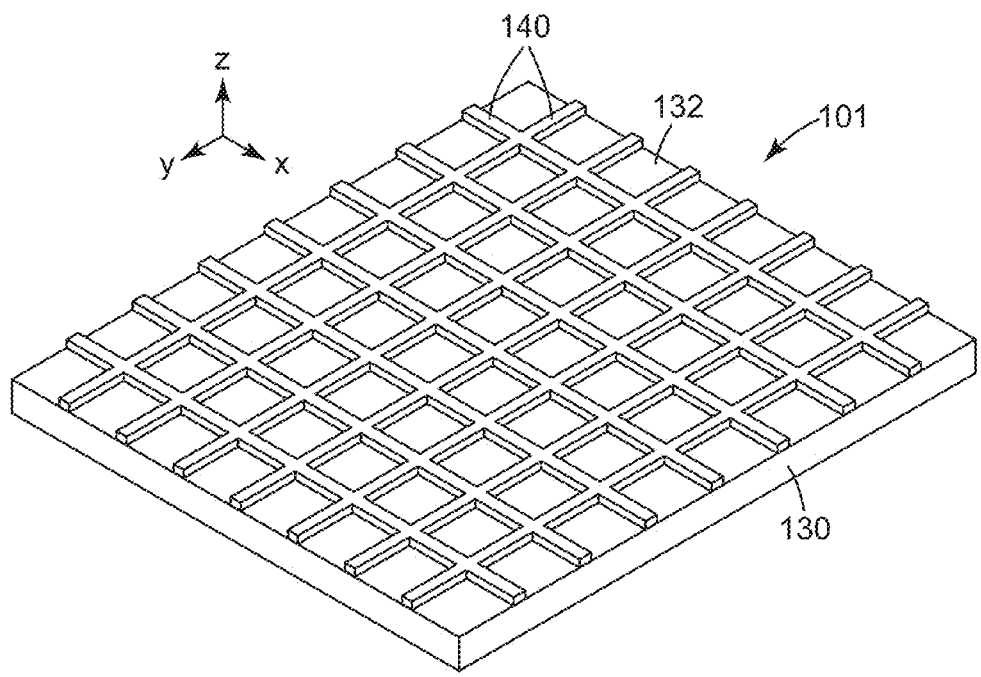
FIG. 2 illustrates a perspective view of a conductive visible light transparent region lying within a touch screen sensing area.

FIG. 2 illustrates a perspective view of a conductive visible light transparent region 101 that would lie within a touch sensing area of a touch screen panel, e.g., touch sensing area 105 in FIG. 1. The conductive visible light transparent region 101 includes a visible light transparent substrate 130 and an electrically conductive micropattern 140 disposed on or in the visible light transparent substrate 130. The visible light transparent substrate 130 includes a major surface 132 and is electrically insulating. The visible light transparent substrate 130 can be formed of any useful electrically insulating material such as, e.g., glass or polymer. Examples of useful polymers for light transparent substrate 130 include polyethylene terephthalate (PET) and polyethylene naphthalate (PEN). The electrically conductive micropattern 140 can be formed of a plurality of linear metallic features.

FIG. 2 also illustrates an axis system for use in describing the conductive visible light transparent region 101 that would lie within a touch sensing area of a touch screen panel. Generally, for display devices, the x and y axes correspond to the width and length of the display and the z axis is typically along the thickness (i.e., height) direction of a display. This convention will be used throughout, unless otherwise stated. In the axis system of FIG. 2, the x axis and y axis are defined to be parallel to a major surface 132 of the visible light transparent substrate 130 and may correspond to width and length directions of a square or rectangular surface. The z axis is perpendicular to that major surface and is typically along the thickness direction of the visible light transparent substrate 130. A width of the plurality of linear metallic features that form the electrically conductive micropattern 140 correspond to an x-direction distance for the parallel linear metallic features that extend linearly along the y axis and a y-direction distance for the orthogonal linear metallic features correspond to a width of the orthogonal linear metallic features. A thickness or height of the linear metallic features corresponds to a z-direction distance.

In some embodiments, the conductive visible light transparent region 101 that would lie within a touch sensing area of a touch screen panel includes two or more layers of visible light transparent substrate 130 each having a conductive micropattern 140.

The conductive micropattern 140 is deposited on the major surface 132. Because the sensor is to be interfaced with a display to form a touch screen display, or touch panel display, the substrate 130 is visible light transparent and substantially planar. The substrate and the sensor may be substantially planar and flexible. By visible light transparent, what is meant is that information (e.g., text, images, or figures) that is rendered by the display can be viewed through the touch sensor. The viewability and transparency can be achieved for touch sensors including conductors in the form of a deposited metal, even metal that is deposited with thickness great enough to block light, if the metal is deposited in an appropriate micropattern.

The conductive micropattern 140 includes at least one visible light transparent conductive region overlaying a viewable portion of the display that renders information. By visible light transparent conductive, what is meant is that the portion of the display can be viewed through the region of conductive micropattern and that the region of micropattern is electrically conductive in the plane of the pattern, or stated differently, along the major surface of the substrate onto which the conductive micropattern is deposited and to which it is adjacent. Preferred conductive micropatterns include regions with two dimensional meshes, e.g. square grids, rectangular (non-square) grids, or regular hexagonal networks, where conductive traces define enclosed open areas within the mesh that are not deposited with conductor that is in electrical contact with the traces of the mesh. The open spaces and associated conductor traces at their edges are referred to herein as cells. Other useful geometries for mesh cells include random cell shapes and irregular polygons.

In some embodiments, the conductive traces defining the conductive micropattern are designed not to include segments that are approximately straight for a distance greater than the combined edge length of five adjacent cells, preferably four adjacent cells, more preferably three adjacent cells, even more preferably two adjacent cells. Most preferably, the traces defining the micropattern are designed not to include segments that are straight for a distance greater than the edge length of a single cell. Accordingly, in some embodiments, the traces that define the micropattern are not straight over long distances, e.g., 10 centimeters, 1 centimeter, or even 1 millimeter. Patterns with minimal lengths of straight line segments, as just described, are particularly useful for touch screen sensors with the advantage of causing minimal disturbance of display viewability.

The two-dimensional geometry of the conductive micropattern (that is, geometry of the pattern in the plane or along the major surface of the substrate) can be designed, with consideration of the optical and electrical properties of the conductor material, to achieve special transparent conductive properties that are useful in touch screen sensors. E.g., whereas a continuous (un-patterned) deposit or coating of conductor material has a sheet resistance that is calculated as its bulk resistivity divided by its thickness, in the present invention different levels of sheet resistance are engineered by micropatterning the conductor as well.

In some embodiments, the two-dimensional conductive micropattern is designed to achieve anisotropic sheet resistance in a conductive region (e.g., a visible light transparent conductive region) of the sensor. By anisotropic sheet resistance, what is meant is that the magnitude of the sheet resistance of the conductive micropattern is different when measured or modeled along two orthogonal directions.

In contrast, in some embodiments, the two-dimensional conductive micropattern is designed to achieve isotropic sheet resistance in a conductive region (e.g., a visible light transparent conductive region) of the sensor. By isotropic sheet resistance, what is meant is that the magnitude of the sheet resistance of the conductive micropattern is the same when measured or modeled along any two orthogonal directions in the plane, as in the case for a square grid formed with traces of constant width for both directions.

Anisotropic sheet resistance within a region can include sheet resistance in one direction that is at least 10 percent greater than the sheet resistance in the orthogonal direction, or at least 25 percent greater, at least 50 percent greater, at least 100 percent greater, at least 200 percent greater, at least 500 percent greater, or even at least 10 times greater. In some embodiments, anisotropic sheet resistance within a region includes sheet resistance in one direction that is greater than the sheet resistance in the orthogonal direction by a factor of at least 1.5. In some embodiments, anisotropic sheet resistance within a region includes sheet resistance in one direction that is greater than the sheet resistance in the orthogonal direction by a factor between 1.1 and 10, in other embodiments between 1.25 and 5, and in yet other embodiments between 1.5 and 2.

An example of a conductive micropattern geometry that can generate anisotropic sheet resistance is approximately a rectangular microgrid (non-square) with fixed widths for the conductive traces. For such a rectangular microgrid (non-square), anisotropic sheet resistance can result from a repeating geometry for the cells of the grid that includes one edge that is 10 percent longer than the other, 25 percent longer than the other, at least 50 percent longer than the other, 100 percent longer than the other, or even 10 times longer than the other. Anisotropic sheet resistance can be created by varying the width of traces for different directions, e.g. in an otherwise highly symmetrical pattern of cells for a mesh. An example of the latter approach to generating anisotropic sheet resistance is a square grid of conductive traces, e.g. with pitch of 200 micrometers, wherein the traces in a first direction are 10 micrometers wide and the traces in the orthogonal direction are 9 micrometers in width, 7.5 micrometers in width, 5 micrometers in width, or even 1 micrometer in width. Anisotropic sheet resistance within a region can include a finite, measurable sheet resistance in one direction and essentially infinite sheet resistance in the other direction, as would be generated by a pattern of parallel conductive lines. In some embodiments, as described above, the anisotropic sheet resistance within a region includes a finite, measurable sheet resistance in a first direction and a finite, measurable sheet resistance in the direction orthogonal to the first direction.

For the purpose of determining whether a region of conductive micropattern is isotropic or anisotropic, it will be appreciated by those skilled in the art that the scale of the region of interest must be reasonably selected, relative to the scale of the micropattern, to make relevant measurements or calculations of properties. E.g., once a conductor is patterned at all, it is trivial for one to select a location and a scale on which to make a measurement that will yield a difference in sheet resistance for different directions of measurement. The following detailed example can make the point more clearly. If one considered a conductor pattern of isotropic geometry in the form of a square grid with 100 micrometer wide conductor traces and 1 millimeter pitch (leading to 900 micrometer by 900 micrometer square openings in the grid), and one made four point probe measurements of sheet resistance within one of the traces along the edge of a square opening with a probe having fixed spacing along the four linearly arranged probes of 25 micrometers (leading to a separation between the two current probes, the outside probes, of 75 micrometers), different levels of sheet resistance will be calculated by the measured values of current and voltage depending on whether the probes were aligned parallel to the trace or orthogonal to the trace. Thus, even though the square grid geometry would yield isotropic sheet resistance on a scale larger than the square grid cell size, it is possible for one to carry out measurements of sheet resistance that would suggest anisotropy. Thus, for the purpose of defining anisotropy of the sheet resistance of a conductive micropattern in the current disclosure, e.g. a visible light transparent conductive region of the micropattern that comprises a mesh, the relevant scale over which the sheet resistance should be measured or modeled is greater than the length scale of a cell in the mesh, preferably greater than the length scale of two cells. In some cases, the sheet resistance is measured or modeled over the length scale of five or more cells in the mesh, to show that the mesh is anisotropic in its sheet resistance.

In contrast to embodiments where the conductive micropattern exhibits anisotropy of sheet resistance in a region, sensors including transparent conducting oxide thin films (e.g., indium tin oxide, or ITO) exhibit isotropic sheet resistance in contiguous regions of the conductor. In the latter case, one can measure or model that as four-point probe measurements of sheet resistance of a contiguous region are made in different directions and with decreasing spacing between the probes, the same readings of current and voltage for different directions clearly indicate isotropy.

In some embodiments, the two-dimensional conductive micropattern is designed to achieve different levels, or magnitudes, of sheet resistance in two different patterned conductor regions of the sensor, when measured in a given direction. E.g., with respect to the different levels of sheet resistance, the greater of the two may exceed the lesser by a factor greater than 1.25, a factor greater than 1.5, a factor greater than 2, a factor greater than 5, a factor greater than 10, or even a factor greater than 100. In some embodiments, the greater of the two sheet resistance values exceeds the lesser by a factor between 1.25 and 1000, in other embodiments between 1.25 and 100, in other embodiments between 1.25 and 10, in other embodiments between 2 and 5. For a region to be regarded as having a different sheet resistance from that of another region, it would have a sheet resistance that is greater or lesser than that of the other region by a factor of at least 1.1.

In some embodiments, the micropattern is designed to achieve the aforementioned different levels of sheet resistance for two patterned conductor regions that are electrically contiguous, which is to say that they are patterned conductor regions that are in electrical contact with each other along a boundary between them. Each of the two patterned conductor regions that share a conductive boundary may have uniform respective pattern geometries, but again different. In some embodiments, the micropattern is designed to achieve the different levels of sheet resistance for two different patterned conductor regions that are electrically noncontiguous, which is to say that the they are patterned conductor regions that share no boundary between them for which the patterned regions are in electrical contact along that boundary. Each of the two patterned conductor regions that share no conductive boundary between them may have uniform respective pattern geometries, but again different. For electrically noncontiguous regions, it is within the scope of the disclosure for them both to make electrical contact in the pattern to the same solid conductor element, e.g. a bus bar or pad. In some embodiments, the micropattern is designed to achieve the different levels of sheet resistance for two regions that are electrically isolated from each other and thus can be addressed independently by electrical signals. Each of the two mesh regions that are electrically isolated may have a uniform pattern geometry, but again different. Finally, in some embodiments, the micropattern is designed to achieve different levels of sheet resistance for two different regions by creating continuously varying sheet resistance from the first region to the second, and example of two regions that are electrically contiguous.

The two dimensional conductive micropatterns that include two regions with different sheet resistance in a measurement direction are useful for designing a visible light transparent conductive region in the sensing area with a preferred level of sheet resistance for that region (e.g., low sheet resistance between 5 and 100 ohms per square), including varying or anisotropic sheet resistance optionally, and designing an electrical element, e.g. a resistor element, as part of the touch screen sensor that may or may not lie within the sensing area, the resistor element comprising a sheet conductor with sheet resistance selected optimally for the resistor function (e.g., higher sheet resistance between 150 and 1000 ohms per square) and possibly in light of other design constraints, e.g. the constraint of minimizing the footprint of the resistor.

The sheet resistance of the conductive micropattern, in regions and directions with finite sheet resistance that can be measured or modeled, as described above, may fall within the range of 0.01 ohms per square to 1 megaohm per square, or within the range of 0.1 to 1000 ohms per square, or within the range of 1 to 500 ohms per square. In some embodiments, the sheet resistance of the conductive micropattern falls within the range of 1 to 50 ohms per square. In other embodiments, the sheet resistance of the conductive micropattern falls within the range of 5 to 500 ohms per square. In other embodiments, the sheet resistance of the conductive micropattern falls within the range of 5 to 100 ohms per square. In other embodiments, the sheet resistance of the conductive micropattern falls within the range of 5 to 40 ohms per square. In other embodiments, the sheet resistance of the conductive micropattern falls within the range of 10 to 30 ohms per square. In prescribing the sheet resistance that may characterize a conductive micropattern or a region of a conductive micropattern, the micropattern or region of micropattern is said to have a sheet resistance of a given value if it has that sheet resistance value for electrical conduction in any direction.

Appropriate micropatterns of conductor for achieving transparency of the sensor and viewability of a display through the sensor have certain attributes. First of all, regions of the conductive micropattern through which the display is to be viewed should have an area fraction of the sensor that is shadowed by the conductor of less than 50%, or less than 25%, or less than 20%, or less than 10%, or less than 5%, or less than 4%, or less than 3%, or less than 2%, or less than 1%, or in a range from 0.25 to 0.75%, or less than 0.5%.

The open area fraction (or open area or Percentage of Open Area) of a conductive micropattern, or region of a conductive micropattern, is the proportion of the micropattern area or region area that is not shadowed by the conductor. The open area is equal to one minus the area fraction that is shadowed by the conductor, and may be expressed conveniently, and interchangeably, as a decimal or a percentage. Area fraction that is shadowed by conductor is used interchangeably with the density of lines for a micropatterned conductor. Micropatterned conductor is used interchangeably with electrically conductive micropattern and conductive micropattern. Thus, for the values given in the above paragraph for the fraction shadowed by conductor, the open area values are greater than 50%, greater than 75%, greater than 80%, greater than 90%, greater than 95%, greater than 96%, greater than 97%, greater than 98%, greater than 99%, 99.25 to 99.75%, 99.8%, 99.85%, 99.9% and even 99.95. In some embodiments, the open area of a region of the conductor micropattern (e.g., a visible light transparent conductive region) is between 80% and 99.5%, in other embodiments between 90% and 99.5%, in other embodiments between 95% and 99%, in other embodiments between 96% and 99.5%, in other embodiments between 97% and 98%, and in other embodiments up to 99.95%. With respect to the reproducible achievement of useful optical properties (e.g. high transmission and invisibility of conductive pattern elements) and electrical properties, using practical manufacturing methods, preferred values of open area are between 90 and 99.5%, more preferably between 95 and 99.5%, most preferably between 95 and 99.95%.

To minimize interference with the pixel pattern of the display and to avoid viewability of the pattern elements (e.g., conductor lines) by the naked eye of a user or viewer, the minimum dimension of the conductive pattern elements (e.g., the width of a line or conductive trace) should be less than or equal to approximately 50 micrometers, or less than or equal to approximately 25 micrometers, or less than or equal to approximately 10 micrometers, or less than or equal to approximately 5 micrometers, or less than or equal to approximately 4 micrometers, or less than or equal to approximately 3 micrometers, or less than or equal to approximately 2 micrometers, or less than or equal to approximately 1 micrometer, or less than or equal to approximately 0.5 micrometer.

In some embodiments, the minimum dimension of conductive pattern elements is between 0.5 and 50 micrometers, in other embodiments between 0.5 and 25 micrometers, in other embodiments between 1 and 10 micrometers, in other embodiments between 1 and 5 micrometers, in other embodiments between 1 and 4 micrometers, in other embodiments between 1 and 3 micrometers, in other embodiments between 0.5 and 3 micrometers, and in other embodiments between 0.5 and 2 micrometers. With respect to the reproducible achievement of useful optical properties (e.g. high transmission and invisibility of conductive pattern elements with the naked eye) and electrical properties, and in light of the constraint of using practical manufacturing methods, preferred values of minimum dimension of conductive pattern elements are between 0.5 and 5 micrometers, more preferably between 1 and 4 micrometers, and most preferably between 1 and 3 micrometers.

In general, the deposited electrically conductive material reduces the light transmission of the touch sensor, undesirably. Basically, wherever there is electrically conductive material deposited, the display is shadowed in terms of its viewability by a user. The degree of attenuation caused by the conductor material is proportional to the area fraction of the sensor or region of the sensor that is covered by conductor, within the conductor micropattern.

In general, it is desirable for a transparent touch screen sensor to exhibit a low value of haze. Haze refers to a property related to the scattering of light as it passes through a medium, e.g. as measured by a Haze-Gard instrument (Haze-Gard plus, BYK Gardner, Columbia, Md.). In some embodiments, the touch screen sensor exhibits haze less than 10%, in some embodiments less than 5%, in some embodiments less than 4%, in some embodiments less than 3%, in some embodiments less than 2%. Embodiments are disclosed which achieve a desirable combination of high transmission (also referred to as visible light transmittance), low haze, and low conductor trace visibility for regions including conductor micropatterns. The conductor micropatterns are thus especially useful when used as part of a sensing area or region of a touch screen sensor display, e.g. when the micropattern overlays a viewable region of the display.

In some embodiments, in order to generate a visible light transparent display sensor that has uniform light transmission across the viewable display field, even if there is a non-uniform distribution of sheet resistance, e.g. derived from a non-uniform mesh of conductive material, the sensors include isolated conductor deposits added to the conductor micropattern that serve to maintain the uniformity of light transmittance across the pattern. Such isolated conductor deposits are not connected to the drive device (e.g., electrical circuit or computer) for the sensor and thus do not serve an electrical function. For example, a metal conductor micropattern that includes a first region with a mesh of square grid geometry of 3 micrometer line width and 200 micrometer pitch (3% of the area is shadowed by the metal, i.e., 97% open area) and second region with a mesh of square grid geometry of 3 micrometer line width and 300 micrometer pitch (2% of the area is shadowed by the metal, i.e., 98% open area) can be made optically uniform in its average light transmission across the two regions by including within each of the open cells of the 300 micrometer pitch grid region one hundred evenly spaced 3 micrometer by 3 micrometer squares of metal conductor in the pattern. The one hundred 3 micrometer by 3 micrometer squares (900 square micrometers) shadow an additional 1 percent of the area for each 300 micrometer by 300 micrometer cell (90000 square micrometers), thus making the average light transmission of the second region equal to that of the first region. Similar isolated metal features can be added in regions of space between contiguous transparent conductive regions, e.g. contiguous transparent conductive regions that include micropatterned conductors in the form of two dimensional meshes or networks, in order to maintain uniformity of light transmittance across the sensor, including the transparent conductive regions and the region of space between them. In addition to isolated squares of conductor, other useful isolated deposits of conductor for tailoring optical uniformity include circles and lines. The minimum dimension of the electrically isolated deposits (e.g., the edge length of a square feature, the diameter of a circular feature, or the width of a linear feature) is less than 10 micrometers, less than 5 micrometers, less than 2 micrometers, or even less than 1 micrometer.

With respect to the reproducible achievement of useful optical properties (e.g. high transmission and invisibility of conductive pattern elements), using practical manufacturing methods, the minimum dimension of the electrically isolated deposits is preferably between 0.5 and 10 micrometers, more preferably between 0.5 and 5 micrometers, even more preferably between 0.5 and 4 micrometers, even more preferably between 1 and 4 micrometers, and most preferably between 1 and 3 micrometers. In some embodiments, the arrangement of electrically isolated conductor deposits is designed to lack periodicity. A lack of periodicity is preferred for limiting unfavorable visible interactions with the periodic pixel pattern of an underlying display. For an ensemble of electrically isolated conductor deposits to lack periodicity, there need only be a single disruption to the otherwise periodic placement of at least a portion of the deposits, across a region having the deposits and lacking micropattern elements that are connected to decoding or signal generation and/or processing electronics. Such electrically isolated conductor deposits are said to have an aperiodic arrangement, or are said to be an aperiodic arrangement of electrically isolated conductor deposits. In some embodiments, the electrically isolated conductor deposits are designed to lack straight, parallel edges spaced closer than 10 micrometers apart, e.g. as would exist for opposing faces of a square deposit with edge length of 5 micrometers. More preferably the isolated conductor deposits are designed to lack straight, parallel edges spaced closer than 5 micrometers apart, more preferably 4 micrometers apart, even more preferably 3 micrometers apart, even more preferably 2 micrometers apart. Examples of electrically isolated conductor deposits that lack straight, parallel edges are ellipses, circles, pentagons, heptagons, and triangles. The absence within the design of electrically isolated conductor deposits of straight, parallel edges serves to minimize light-diffractive artifacts that could disrupt the viewability of a display that integrates the sensor.

The impact of the conductor micropattern on optical uniformity can be quantified. If the total area of the sensor, and hence the conductor micropattern, that overlays a viewable region of the display is segmented into an array of 1 millimeter by 1 millimeter regions, preferred sensors include conductor micropatterns wherein none of the regions have a shadowed area fraction that differs by greater than 75 percent from the average for all of the regions. More preferably, none have a shadowed area fraction that differs by greater than 50 percent. More preferably, none have a shadowed area fraction that differs by greater than 25 percent. Even more preferably, none have a shadowed area fraction that differs by greater than 10 percent. If the total area of the sensor, and hence the conductor micropattern, that overlays a viewable region of the display is segmented into an array of 5 millimeter by 5 millimeter regions, preferred sensors include conductor micropatterns wherein none of the regions have a shadowed area fraction that differs by greater than 50 percent from the average for all of the regions. Preferably, none have a shadowed area fraction that differs by greater than 50 percent. More preferably, none have a shadowed area fraction that differs by greater than 25 percent. Even more preferably, none have a shadowed area fraction that differs by greater than 10 percent.

The disclosure advantageously allows for the use of metals as the conductive material in a transparent conductive sensor, as opposed to transparent conducting oxides (TCO's), such as ITO. ITO has certain drawbacks, such as corrosion-related degradation in certain constructions, a tendency to crack when flexed, high attenuation of transmitted light (due to reflection and absorption) when deposited as a coating with sheet resistance below 100 to 1000 ohms per square, and increasing cost due to the scarcity of indium. ITO is also difficult to deposit with uniform and reproducible electrical properties, leading to the need for more complex and expensive electronics that couple to the conductive pattern to construct a touch screen sensor.

Examples of useful metals for forming the electrically conductive micropattern include gold, silver, palladium, platinum, aluminum, copper, nickel, tin, alloys, and combinations thereof. In some embodiments, the conductor is a transparent conducting oxide. In some embodiments the conductor is ITO. The conductor may have a thickness between 5 nanometers and 5 micrometers, or between 10 nanometers and 500 nanometers, or between 15 nanometers and 250 nanometers. In many embodiments, the thickness of the conductor is less than one micrometer. A desired thickness for the conductor can be calculated by starting with the desired sheet resistance and considering the micropattern geometry (and in turn its effect on the current-carrying cross-section in the plane) and the bulk resistivity of the conductor, as is known in the art. For complicated geometries of micropattern, there are computational methods in the art, e.g. finite difference methods or finite element methods that can be used to calculate sheet resistance, referred to herein as modeling the properties of a micropattern. Sheet resistance can be measured using a number of techniques, including four-point probe techniques and non-contact eddy-current methods, as are known in the art.

Examples of useful displays with which sensors of the invention can be integrated include liquid crystal displays, cathode ray tube displays, plasma display panels, and organic light emitting diode displays.

Conductor patterns according to the invention can be generated by any appropriate patterning method, e.g. methods that include photolithography with etching or photolithography with plating (see, e.g., U.S. Pat. No. 5,126,007; U.S. Pat. No. 5,492,611; U.S. Pat. No. 6,775,907). Additionally, the conductor patterns can be created utilizing one of several other exemplary methods (each discussed in more detail below):

1. Laser cured masking (curing of a mask layer on a metal film, and then etching);
2. Inkjet printing (of masking material or of seed material for subsequent metal plating);
3. Gravure printing (of a seed material for subsequent metal plating);
4. Micro-replication (form micro-grooves in a substrate, then fill with conductive material or with a seed material for subsequent metal plating); or,
5. Micro-contact printing (stamping or rotary printing of self-assembled monolayer (SAM) patterns on a substrate's surface).

Utilizing high volume, high resolution printing methods generally allow for precision placement of the conductive elements, and also allows for the (pseudo-random) variation of the microconductors at a scale compatible with commercially available display pixels, to limit optical anomalies (for example moiré patterns) that might otherwise occur.

Certain embodiments discussed herein may employ flat-sided "wire-like" conductors that enable greater light transmission than existing sensors that utilize transparent conductors. These flat-sided "wire-like" conductors, in some embodiments, provide greater scalability and control of conductor placement than is possible with existing round wire solutions. Micro-conductors discussed herein include conductors with maximum cross sectional dimension of 10 micrometers or less. Less than 3 micrometers is preferred for many sensor applications. Methods of utilizing masking and etching typically produce a low-aspect (0.05 to 0.5 μm thick×1 μm to 10 μm wide) microconductor. Micro-replicated grooves can produce higher aspect ratio microconductors, up to greater than 1:1.

Laser cured masking can be used to create microconductors by selectively curing a pattern with an ultraviolet laser. Such a process typically works with either film- (for example, PET) or glass-based substrates. An exemplary laser cured masking process may include the following steps:

1. A substrate is plated with metal, (for example, silver or copper is sputter coated onto glass or PET film);
2. UV curable masking ink is coated uniformly onto the plated substrate, (for example, spin coating, and dip coating);
3. A laser cures a portion of the printed ink, to form microconductor electrodes in the active area of the touch sensor, and may also cure (wider) lines that interconnect electrodes to connector pads (beam width of the laser may be reduced by a photo mask);
4. Uncured ink is removed (washed off); and
5. Metal plated on the substrate is removed by etching, except for the pattern under the masking ink.

Inkjet Printing and plating of seed ink can be used to create microconductors by printing of the desired pattern using relatively wide lines of seed ink (catalytic ink), followed by selective curing with a UV laser, and similar to the laser cured masking process described above. The substrate for this process may be either film- (for example, PET) or glass.

FIG. 3a and FIG. 3b show such a process, whereby:

1. Seed ink 66 is inkjet printed onto a substrate 67;
2. A laser 65 cures a portion of the printed ink, to form microconductor electrodes 68 in active area(s) of the touch sensor, and may also cure (wider) lines that interconnect electrodes to connector pads (the beam width of the laser may be reduced by a photo mask);
3. Uncured ink is removed (washed off); and,
4. The cured pattern of seed ink is electroless plated, (with a conductive metal).

The inkjet printing process minimizes the amount of ink used, so it should be considered where inks are expensive, (for example, seed inks). If ink has relatively low cost, inkjet printing can be replaced by another process (for example, spin coating or dip coating) that coats the whole substrate uniformly. Ink material and processing for the Inkjet printing and plating of seed ink process described above are available from Conductive Inkjet Technology division of Carclo Technical Plastics, Cambridge, UK.

Gravure printing requires that the image to be printed is "etched" into a metal plate which rotates on a drum. As the drum turns, the etched surface is filled with ink which then gets deposited on the surface of the film being printed as the ink-filled etched plate and the film contact each other. The process is diagramed in FIG. 4, which shows a film substrate 76 being printed with ink lines 74 from ink bath 73. Impression cylinder 70 is rolled against printing drum 75, which has etches 72 that fill with ink from inkbath 73. Such a process could be used to make stock material for later processing or could be used to make specific X or Y components of a high volume sensor.

Seed inks (or catalytic inks) may be printed by any of the methods described above. After printing and curing, the inks can be electroless plated with metals such as copper, resulting in high conductivity. Seed ink manufacturers include Conductive Inkjet Technology, a division of Carclo, located in Cambridge, UK and QinetiQ Company in Farnborough, England. Cabot Printable Electronics and Displays of Albuquerque, N. Mex. make inkjet printable silver conductive inks.

Micro-replication is yet another process that can be used to form microconductors. The diagram in FIG. 5 shows a cross sectional view of filled, or partially filled, micro-replicated channels. The channels may be filled with seed ink 81 and then plated (see metallization layer 80) to make them conductive. Alternatively the channels could be filled with an ink that by itself is conductive, eliminating the need for the plating process. A third alternative is to coat the substrate with a metal, then mask the portions of metal in the (bottom of) the grooves, then etch away the unmasked metal, (see, for example, patent application Nos. 61/076,731 ("Method of Forming a Microstructure") and 61/076,736 ("Method of Forming a Patterned Substrate.")) The actual shape of the channels can be altered to optimize the cross sectional shape and size that provides the lowest level of optical interference while still ensuring high conductivity and high production yields.

Filled micro-replicated channels can provide a conductor with a high aspect ratio cross section (relative to masked metal films). Thus maximum conductivity may be achieved with minimum optical visibility, (narrow cross section in the direction of viewing). A method of filling micro-replicated channels and desirable shapes of channels with high aspect ratio are described in co-assigned US patent application US2007/0160811 (Gaides, et. al.).

Figure 6:
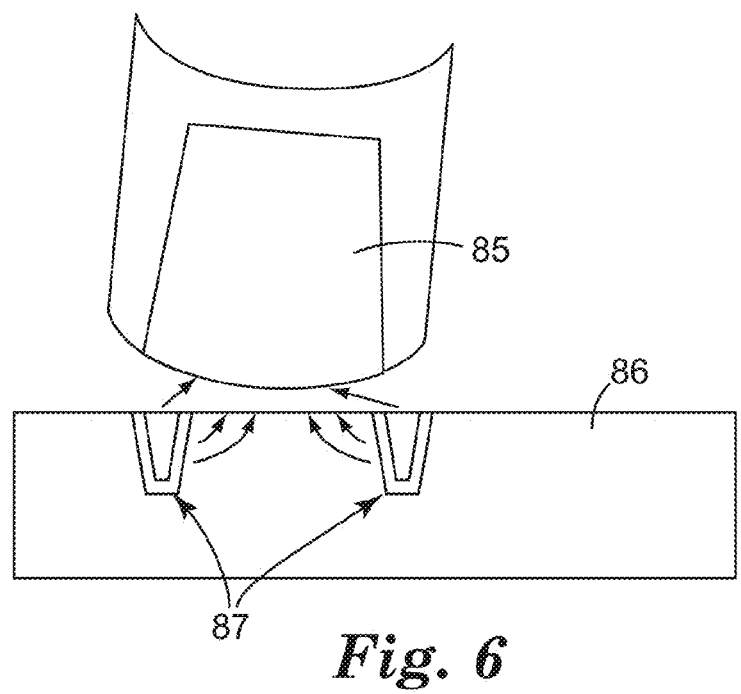
FIG. 6 illustrates a finger capacitively coupling with microreplicated channels filled with conductive material.

FIG. 6 shows a cross-profile of a high aspect ratio touch-surface having micro-replicated electrodes that are deeper than they are wide. In one embodiment, a micro-replicated structure that has a ratio of depth to width greater than 1:1 will yield better performance Generally, the thinner width of the micro-replicated structure will allow more of the light exiting the display to pass through the touch sensor. Further, deeper rather than wider channels will reduce the surface area that will limit reflection of light entering the sensor from the first surface. These advantages are gained while not losing capacitive signal. FIG. 6 shows a finger 85 capacitively coupling with a printed copper electrodes 87 of touch sensor 86 not only to the top surface but also to the sides of the sensor.

Micro-contact printing is yet another process that can be used to form microconductors. Micro-contact printing is the stamping or rotary printing of self-assembled monolayer (SAM) patterns on substrate surfaces. The approach exhibits several technologically important features, including the ability to be carried out for very fine scale patterns (e.g., feature size of one tenth of a micrometer) and with the extension of the patterned monolayer to the patterning of metals, ceramics, and polymers.

An exemplary micro-contact printing process is as follows:
1. A substrate is coated with metal, (for example, silver or copper is sputter coated or plated onto glass or PET film);
2. A self-assembled mono-layer mask is stamped onto the plated substrate; and,
3. Metal coated on the substrate is removed by etching, except for the pattern under the mask.

A micro-contact printing process is described in, for example, U.S. Pat. No. 5,512,131 (Kumar) and in co-pending 3M patent application No. 61/032,273 ("Methods of Patterning a Conductor on a Substrate"). Micro-contact printing is generally substrate independent. For example, substrates can be PET, glass, PEN, TAC, or opaque plastic. As is known in the art, micro-contact printing can be combined with metal deposition processes to yield an additive patterning process (for example, including electroless plating).

Figure 7A:
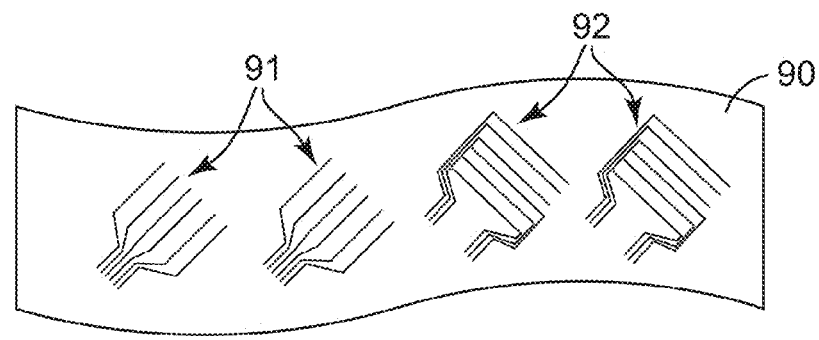
FIGS. 7a and 7b illustrates patterns of microconductors produced on a flexible substrate, useful for producing touch sensors.
Figure 7B:
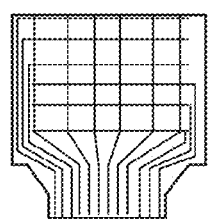

FIG. 7a shows a matrix sensor for a small capacitive touch screen. Two patterns (91 and 92) of electrodes, interconnects, and connector pads are printed on a flexible substrate (for example, PET). The two patterns are then assembled together to form two layers of electrodes on parallel planes, with electrodes on the top plane orthogonal to conductors on the lower plane as shown (see FIG. 7b). Sometimes, a shield (not shown) is required below the lower electrode plane.

The patterns represented in FIG. 7 may be printed using one of the methods described herein, and a single printing process step was used to simultaneously print the <10 μm micro-conductors that form electrodes, and the interconnects lines (typically >10 μm) that carry signals from electrodes to connector pads, and also the connector pads themselves may be formed in the same print process. For example, the micro-contact printing process was used to simultaneously print patterns of 3 μm microconductors and 500 μm conductive traces 706 as described with respect to FIG. 27. This particular embodiment yielded several advantages:
1. Alignment of electrodes with interconnects is automatic and very accurate;
2. Interconnects can be printed much narrower and more closely spaced than with other interconnect printing processes, (for example, silkscreen printing of conductive inks); and
3. The thickness of interconnects (perpendicular to the plane of the substrate) is much less than with prior interconnect printing processes, (for example, silkscreen printing of conductive inks). Thick interconnects cause gaps between laminated layers which are visible and can undermine the seal between laminated layers.

Figure 8:
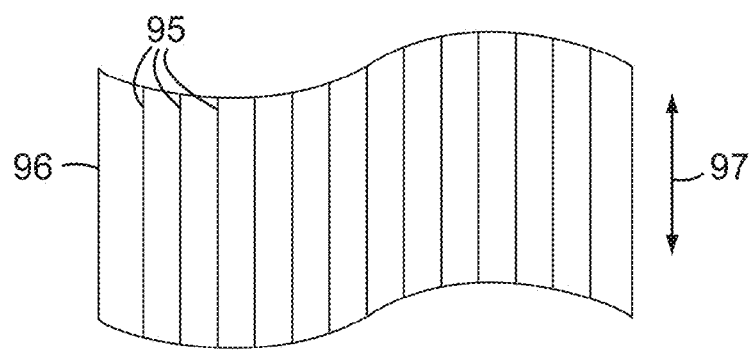
FIG. 8 illustrates parallel microconductors printed on a flexible web material in the downweb direction.

FIG. 8 shows the micro-replicated and filled "stock" construction material with parallel micro-conductors 95 on a substrate 96 surface. Web orientation is verticle (97). The substrate may be PET, PEN, or polycarbonate, and the microconductors may be deposited in micro-replicated grooves as disclosed herein and/or in 3M patent applications No. 61/076,731 ("Method of Forming a Microstructure") and 61/076,736 ("Method of Forming a Patterned Substrate"). Spacing of micro-conductors is, in one embodiment, preferably between 50 µm and 500 µm.

Figure 9:
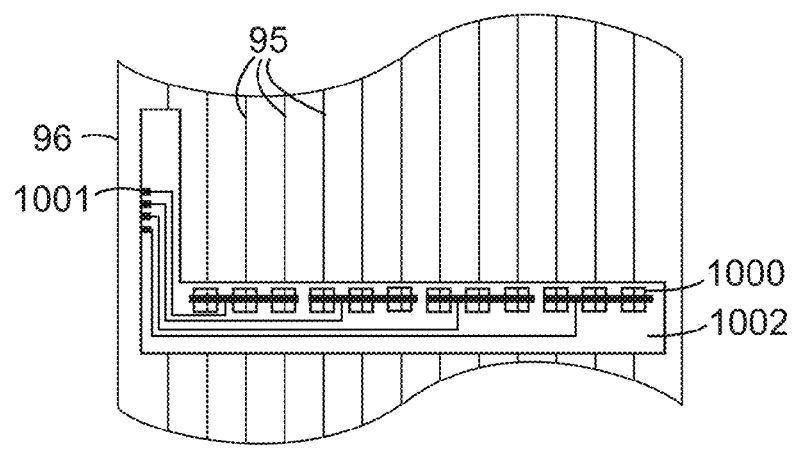
FIG. 9 illustrates a section of the flexible material from FIG. 8 having additional interconnecting conductors added.

This stock material may be processed into touch sensor components (for example, electrodes or shields) by interconnecting selected micro-conductors with printed (for example, inkjetted, or silkscreened) dielectrics that provide insulating cross-overs whereby post-printed (for example, inkjetted or silkscreened) conductive inks (printed using the methods described herein) can bridge over some micro-conductors and make contact only with selected micro-conductors. Thus interconnects and connector pads are made for a sensor as shown in FIG. 9, which shows an inkjet-printed dielectric surface 1002 with through-holes 1000 through the dielectric, and conductive traces 1001 also printed by inkjet. While FIG. 8 and FIG. 9 show micro-conductors printed in the direction of the substrate web, it is sometimes advantageous to print micro-conductors in a direction perpendicular to the substrate web.

Figure 10:
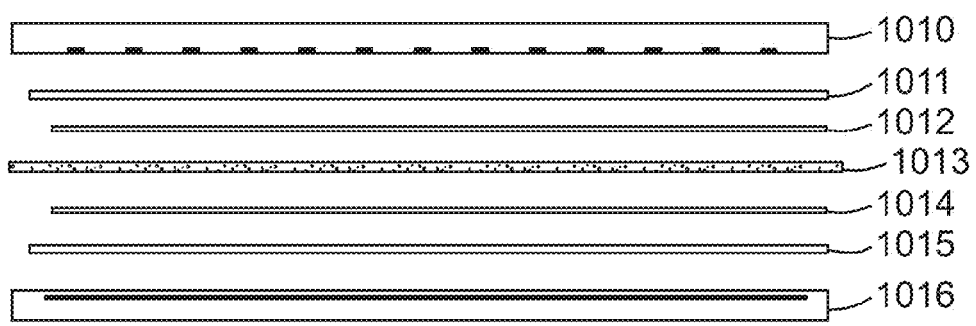
FIG. 10 illustrates a cross section of an example of a matrix touch sensor constructed from two layers of the materials from FIG. 9.

FIG. 10 shows a cross section of an example of a matrix touch sensor constructed with two layers of the stock micro-replicated micro-conductor material, and two layers of post-printed inkjet conductive traces, separated. The topmost layer 1010 includes micro-replicated micro-conductors; the next layer 1011 is a printed dielectric; the next layer 1012 includes post-processed conductors; the next layer 1013 is an adhesive; the next layer 1014 is a post-processed conductor; the next layer 1015 is a printed dielectric, and the final layer 1016 includes micro-replicated microconductors.

In some embodiments, transparent conductive regions with different sheet resistance in at least one direction are created by including selective breaks in conductive traces within an otherwise continuous and uniform mesh. This approach of selective placement of breaks is especially useful for generating articles including patterns of visible transparent conductive regions where the optical transmittance across the article is uniform. The starting mesh can be isotropic or anisotropic. For example, an elongated rectangular transparent conductive bar having a square micromesh can be made to exhibit periodic sheet resistance along its long axis by creating a periodic series of breaks, the breaks being in traces that have a vector component in the direction of the long axis and the periodicity being in the direction of the long axis. This periodicity in sheet resistance can be useful for decoding the position of an object (e.g., a finger) near the rectangular bar. By selecting the width, thickness, and area density of traces, together with the population of breaks, one can design periodic variation in the resistance per unit length along a transparent conductive element characterized by peaks in resistance per unit length that are at least 2 times the minimum in resistance per unit length, preferably at least 5 times their minimum, more preferably at least 10 times their minimum.

In other embodiments that include selective breaks in an otherwise continuous and uniform mesh, the breaks can be placed in order to create approximately continuously varying sheet resistance in a given direction. The continuously varying sheet resistance can be useful for amplifying the non-linearity of electric field along a transparent conductive element, beyond that which would be created only by the overall shape of the element. E.g., as is known in the art, a transparent conductive element with uniform sheet resistance, in the form of an elongated isosceles triangle with an electrical potential applied to its base relative to its apex, exhibits non-linear electric field from base to apex due to the gradient in resistance per unit length along the field direction (created by the narrowing width of the triangle). For touch sensors based on interdigitated arrays of such triangular transparent conductive elements, it would be advantageous for the non-linearity in electric field to be even greater, leading to greater signal-to-noise ratio for circuitry used to decode the position of an object (e.g., a finger) near the array. By selecting the width, thickness, and area density of traces, together with the population of breaks, one can design sheet resistance per unit length along a transparent conductive element that increases by a factor of at least 1.1 over a distance of 1 centimeter, or at least 1.2, or at least 1.5, or at least 2.

In some embodiments, two transparent conductive regions with different sheet resistance in at least one direction are created by including in each of the two regions a contiguous mesh with its own design, each mesh not necessarily including selectively placed breaks. Examples of two meshes with designs that lead to different values of sheet resistance for current passing in a single direction, e.g. the x direction in FIG. 2, include two meshes with the same thickness (dimension in the z direction in FIG. 2) of the same conductive material deposit but with different amounts with current-carrying cross-sectional area (y-z plane in FIG. 2) per unit width in the y direction. One example of such a pair of mesh regions are two square grid regions each comprising conductive traces of width 2 micrometers but with different pitch, e.g. 100 micrometers and 200 micrometers. Another example of such a pair of mesh regions are two rectangular grid regions (non-square, with 100 micrometer pitch in the one direction and 200 micrometer pitch in the orthogonal direction) each comprising conductive traces of width 2 micrometers but with different orientation, e.g. with the long axes of the rectangular cells in the first regions oriented at 90 degrees with respect to the rectangular cells in the second region.

In some embodiments, the sensors include an insulating visible light transparent substrate layer that supports a pattern of conductor, the pattern includes a visible light transparent micropattern region and a region having a larger feature that is not transparent, wherein the visible light transparent micropattern region and the larger feature region include a patterned deposit of the same conductor (e.g., a metal) at approximately the same thickness. The larger feature can take the form of, e.g., a wide conductive trace that makes contact to a visible light transparent conductive micropattern region or a pad for making contact with an electronic decoding, signal generation, or signal processing device. The width of useful larger features, in combination on the same insulating layer with visible light transparent conductive micropattern regions, is e.g. between 25 micrometers and 3 millimeters, between 25 micrometers and 1 millimeter, between 25 micrometers and 500 micrometers, between 25 micrometers and 250 micrometers, or between 50 micrometers and 100 micrometers.

One illustrative touch screen sensor includes a visible light transparent substrate and an electrically conductive micropattern disposed on or in the visible light transparent substrate. The micropattern includes a first region micropattern within a touch sensing area and a second region micropattern. The electrically conductive micropattern includes metallic linear electrically conductive features having a thickness of less than 500 nanometers and a width between 0.5 and 5 micrometers. The first region micropattern has a first sheet resistance value in a first direction between 5 and 500 ohm per square, is visible light transparent, and has between 95% and 99.5% open area. The second region micropattern has a second sheet resistance value in the first direction that is different than the first sheet resistance value.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 0.5 and 5 micrometers. The first region micropattern has an anisotropic first sheet resistance with a difference in sheet resistance values for orthogonal directions of a factor of at least 1.5, is visible light transparent, and has between 95% and 99.5% open area.

Another illustrative touch screen sensor includes a visible light transparent substrate and an electrically conductive micropattern disposed on or in the visible light transparent substrate. The micropattern includes a first region micropattern within a touch sensing area and a second region micropattern. The electrically conductive micropattern includes metallic linear electrically conductive features having a thickness of less than 500 nanometers and a width between 1 and 4 micrometers. The first region micropattern has a first sheet resistance value in a first direction between 5 and 100 ohm per square, is visible light transparent, and has between 96% and 99.5% open area. The second region micropattern has a second sheet resistance value in the first direction that is different than the first sheet resistance value.

Another illustrative touch screen sensor includes a visible light transparent substrate and an electrically conductive micropattern disposed on or in the visible light transparent substrate. The micropattern includes a first region micropattern within a touch sensing area and a second region micropattern. The electrically conductive micropattern includes metallic linear electrically conductive features having a thickness of less than 500 nanometers and a width between 0.5 and 5 micrometers. The first region micropattern has a first sheet resistance value in a first direction between 5 and 500 ohm per square, is visible light transparent, and has between 95% and 99.5% open area. The second region micropattern has a second sheet resistance value in the first direction that is different than the first sheet resistance value. The micropattern also includes electrically isolated conductor deposits. For all 1 millimeter by 1 millimeter square regions of the sensor that lie in the visible light transparent sensing area, none of the regions have a shadowed area fraction that differs by greater than 75 percent from the average for all of the regions.

Another illustrative touch screen sensor includes a visible light transparent substrate and an electrically conductive micropattern disposed on or in the visible light transparent substrate. The micropattern includes a first region micropattern within a touch sensing area and a second region micropattern. The electrically conductive micropattern includes metallic linear electrically conductive features having a thickness of less than 500 nanometers and a width between 0.5 and 5 micrometers. The first region micropattern has a first sheet resistance value in a first direction between 5 and 500 ohm per square, is visible light transparent, and has between 95% and 99.5% open area. The second region micropattern has a second sheet resistance value in the first direction that is different than the first sheet resistance value. The micropattern also includes electrically isolated conductor deposits. For all 5 millimeter by 5 millimeter square regions of the sensor that lie in the visible light transparent sensing area, none of the regions have a shadowed area fraction that differs by greater than 50 percent from the average for all of the regions.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 1 and 4 micrometers. The first region micropattern has an anisotropic first sheet resistance with a difference in sheet resistance values for orthogonal directions of a factor of at least 1.5, is visible light transparent, and has between 96% and 99.5% open area.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 0.5 and 5 micrometers. The first region micropattern has an anisotropic first sheet resistance with a difference in sheet resistance values for orthogonal directions of a factor of at least 1.5, is visible light transparent, and has between 95% and 99.5% open area. The micropattern also includes electrically isolated conductor deposits. For all 1 millimeter by 1 millimeter square regions of the sensor that lie in the visible light transparent sensing area, none of the regions have a shadowed area fraction that differs by greater than 75% from the average for all of the regions.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 0.5 and 5 micrometers. The first region micropattern has an anisotropic first sheet resistance with a difference in sheet resistance values for orthogonal directions of a factor of at least 1.5, is visible light transparent, and has between 95% and 99.5% open area. The micropattern also includes electrically isolated conductor deposits. For all 5 millimeter by 5 millimeter square regions of the sensor that lie in the visible light transparent sensing area, none of the regions have a shadowed area fraction that differs by greater than 50 percent from the average for all of the regions.

Another illustrative touch screen sensor includes a visible light transparent substrate and an electrically conductive micropattern disposed on or in the visible light transparent substrate. The micropattern includes a first region micropattern within a touch sensing area. The first region micropattern includes metallic linear electrically conductive features having a width between 0.5 and 5 micrometers. The first region micropattern is visible light transparent, and has between 95% and 99.5% open area. For all 1 millimeter by 1 millimeter square regions of the first region micropattern, none of the square regions have a shadowed area fraction that differs by greater than 75 percent from the average for all of the square regions. In one embodiment the first region micropattern also includes electrically isolated conductor deposits. In one embodiment, the metallic linear electrically conductive features have a thickness of less than 500 nanometers. In one embodiment, the first region micropattern has a first sheet resistance value in a first direction between 5 and 100 ohm per meter.

Another illustrative touch screen sensor includes a visible light transparent substrate and an electrically conductive micropattern disposed on or in the visible light transparent substrate. The micropattern includes a first region micropattern within a touch sensing area. The first region micropattern includes metallic linear electrically conductive features having a width between 0.5 and 5 micrometers. The first region micropattern is visible light transparent, and has between 95% and 99.5% open area. For all 5 millimeter by 5 millimeter square regions of the first region micropattern, none of the square regions have a shadowed area fraction that differs by greater than 50 percent from the average for all of the square regions. In one embodiment, the metallic linear electrically conductive features have a thickness of less than 500 nanometers. In one embodiment, the first region micropattern also includes electrically isolated conductor deposits.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 0.5 and 5 micrometers. The first region micropattern has a first sheet resistance value in a first direction between 5 and 100 ohm per square, is visible light transparent, and has between 95% and 99.5% open area. The micropattern also includes electrically isolated conductor deposits. For all 1 millimeter by 1 millimeter square regions of the sensor that lie in the visible light transparent sensing area, none of the regions have a shadowed area fraction that differs by greater than 75 percent from the average for all of the regions.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 0.5 and 5 micrometers. The first region micropattern has a first sheet resistance value in a first direction between 5 and 100 ohm per square, is visible light transparent, and has between 95% and 99.5% open area. The micropattern also includes electrically isolated conductor deposits. For all 5 millimeter by 5 millimeter square regions of the sensor that lie in the visible light transparent sensing area, none of the regions have a shadowed area fraction that differs by greater than 50 percent from the average for all of the regions.

Another illustrative touch screen sensor includes a visible light transparent substrate and an electrically conductive micropattern disposed on or in the visible light transparent substrate. The micropattern includes a first region micropattern within a touch sensing area and a second region micropattern. The electrically conductive micropattern includes metallic linear electrically conductive features having a thickness of less than 500 nanometers and a width between 0.5 and 5 micrometers. The first region micropattern has a first sheet resistance value in a first direction between 5 and 500 ohm per square, is visible light transparent, and has between 95% and 99.5% open area. The second region micropattern has a second sheet resistance value in the first direction that is different than the first sheet resistance value. The sensor also includes larger electrically conductive features disposed on or in the visible light transparent substrate, the larger features comprising a continuous conductor deposit of the same material and thickness as included in the micropattern and measuring at least 25 micrometers in minimum dimension.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 0.5 and 5 micrometers. The first region micropattern has an anisotropic first sheet resistance with a difference in sheet resistance values for orthogonal directions of a factor of at least 1.5, is visible light transparent, and has between 95% and 99.5% open area. The sensor also includes larger electrically conductive features disposed on or in the visible light transparent substrate, the larger features comprising a continuous conductor deposit of the same material and thickness as included in the micropattern and measuring at least 25 micrometers in minimum dimension.

Another illustrative touch screen sensor includes a visible light transparent substrate and an electrically conductive micropattern disposed on or in the visible light transparent substrate. The micropattern includes a first region micropattern within a touch sensing area and a second region micropattern. The electrically conductive micropattern includes metallic linear electrically conductive features having a thickness of less than 500 nanometers and a width between 0.5 and 5 micrometers. The first region micropattern has a first sheet resistance value in a first direction between 5 and 500 ohm per square, is visible light transparent, and has between 95% and 99.5% open area. The second region micropattern has a second sheet resistance value in the first direction that is different than the first sheet resistance value. The sensor also includes larger electrically conductive features disposed on or in the visible light transparent substrate, the larger features comprising a continuous conductor deposit of the same material and thickness as included in the micropattern and measuring at least 500 micrometers in minimum dimension.

Another illustrative touch screen sensor includes a visible light transparent substrate and an electrically conductive micropattern disposed on or in the visible light transparent substrate. The micropattern includes a first region micropattern within a touch sensing area. The electrically conductive micropattern includes metallic linear electrically conductive features having a thickness of less than 500 nanometers and a width between 0.5 and 5 micrometers. The first region micropattern has an anisotropic first sheet resistance with a difference in sheet resistance values for orthogonal directions of a factor of at least 1.5, is visible light transparent, and has between 95% and 99.5% open area. The sensor also includes larger electrically conductive features disposed on or in the visible light transparent substrate, the larger features comprising a continuous conductor deposit of the same material and thickness as included in the micropattern and measuring at least 500 micrometers in minimum dimension.

Another illustrative touch screen sensor includes a visible light transparent substrate and an electrically conductive micropattern disposed on or in the visible light transparent substrate. The micropattern includes a first region micropattern within a touch sensing area. The first region micropattern includes conductive traces with width between 0.5 and 10 micrometers. The first region micropattern is visible light transparent and has between 90% and 99.95% open area, preferably between 95% and 99.95% open area, and more preferably between 97% and 98% open area. For all 5 millimeter by 5 millimeter square regions of the first region micropattern, none of the square regions have a shadowed area fraction that differs by greater than 75%, preferably differs by greater than 50%, more preferably differs by greater than 25%, and most preferably differs by greater than 10% from the average for all the square regions. In one embodiment, the first region micropattern includes conductive traces with width between 0.5 and 5 micrometers, preferably between 1 and 3 micrometers.

Another illustrative touch screen sensor includes a visible light transparent substrate and an electrically conductive micropattern disposed on or in the visible light transparent substrate. The micropattern includes a first region micropattern within a touch sensing area. The first region micropattern includes conductive traces with width between 1 and 10 micrometers. The first region micropattern is visible light transparent and has between 90% and 99.5% open area. The first region micropattern includes selective breaks in conductive traces within an otherwise continuous and uniform mesh.

Another illustrative touch screen sensor includes a visible light transparent substrate and an electrically conductive micropattern disposed on or in the visible light transparent substrate. The micropattern includes a first region micropattern within a touch sensing area. The first region micropattern includes conductive traces with width of about [X+0.5] in units of micrometers and an open area fraction between [95−X]% and 99.5%. wherein $0 \leq X \leq 4.5$. In one embodiment, the touch screen sensor within the first region micropattern exhibits a haze value less than 10% and transmission greater than 75%. In another embodiment the touch screen sensor within the first region micropattern exhibits a haze value less than 5% and transmission greater than 85%. In one embodiment, the first region micropattern includes conductive traces with width of about [98.5−(2.5X÷3.5)]% and [99.5−(X÷3.5)]% wherein $0 \leq X \leq 3.5$.

Another illustrative touch screen sensor includes a visible light transparent substrate and an electrically conductive micropattern disposed on or in the visible light transparent substrate. The micropattern includes a first region micropattern within a touch sensing area. The first region micropattern includes parallel conductive traces spaced 4 mm apart with width of about 9.6 um, yielding an open area fraction of 99.75%. This embodiment of microreplicated electrodes comprises parallel conductors with a width of about 4 um, to 10 um, separated by a distance of 0.5 mm to about 5 mm center to center. Conductors may be formed lengthwise to a web of PET substrate, so lengths of conductors may be greater than 1 m. Groups of adjacent conductors may be electrically interconnected to form electrodes of 1 mm to 12 mm total width, for example, using the process described with respect to FIG. 8 and FIG. 9. Conductors of adjacent electrodes may be interconnected such that electrodes are interleaved as disclosed in, for example, co-pending US Patent Application Publication No. 2007/0074914.

EXAMPLES

The following describe exemplary touch screen sensor designs. They can be fabricated using known photolithographic methods, e.g. as described in U.S. Pat. No. 5,126,007 or U.S. Pat. No. 5,492,611. The conductor can be deposited using physical vapor deposition methods, e.g. sputtering or evaporation, as is known in the art. Unless otherwise noted, the examples below include conductors patterned by a microcontact printing technique (see technique description above and also co-pending U.S. Patent Application No. 61/032,273). Each conductive pattern exemplified herein is useful as a transparent touch screen sensor, when connected to decoding circuitry, as is known in the art (e.g., U.S. Pat. No. 4,087,625; U.S. Pat. No. 5,386,219; U.S. Pat. No. 6,297,811; WO 2005/121940 A2).

Example 1

Figure 11:
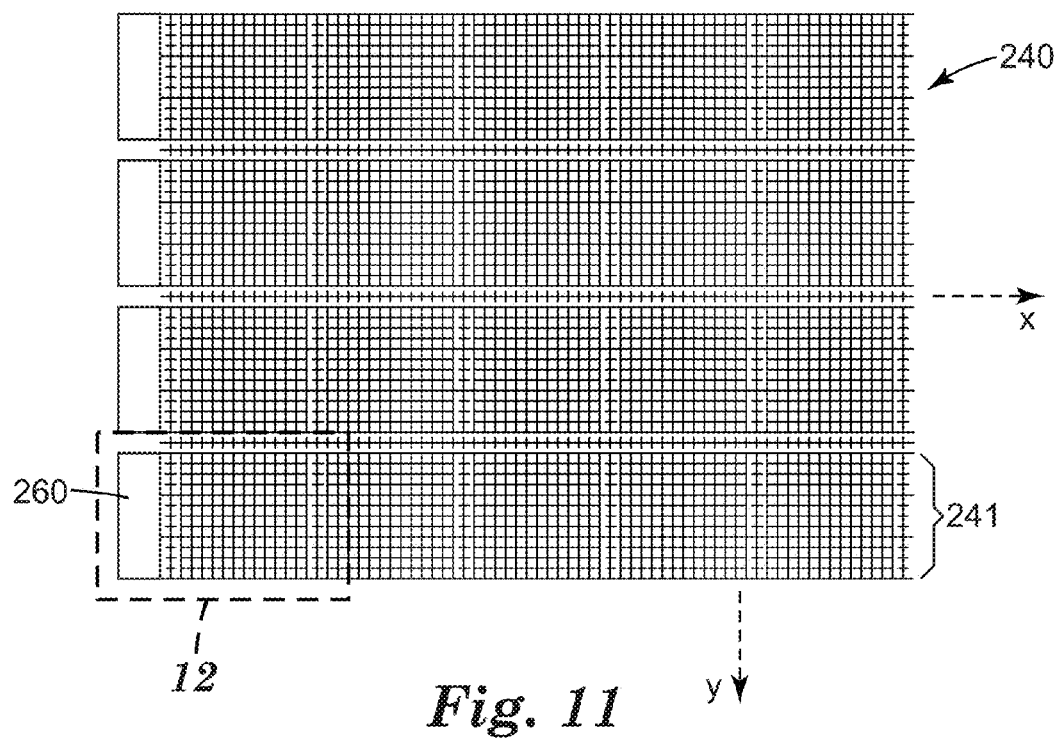
FIG. 11 illustrates the conductor micropattern for one embodiment of the touch screen sensor.
Figure 12:
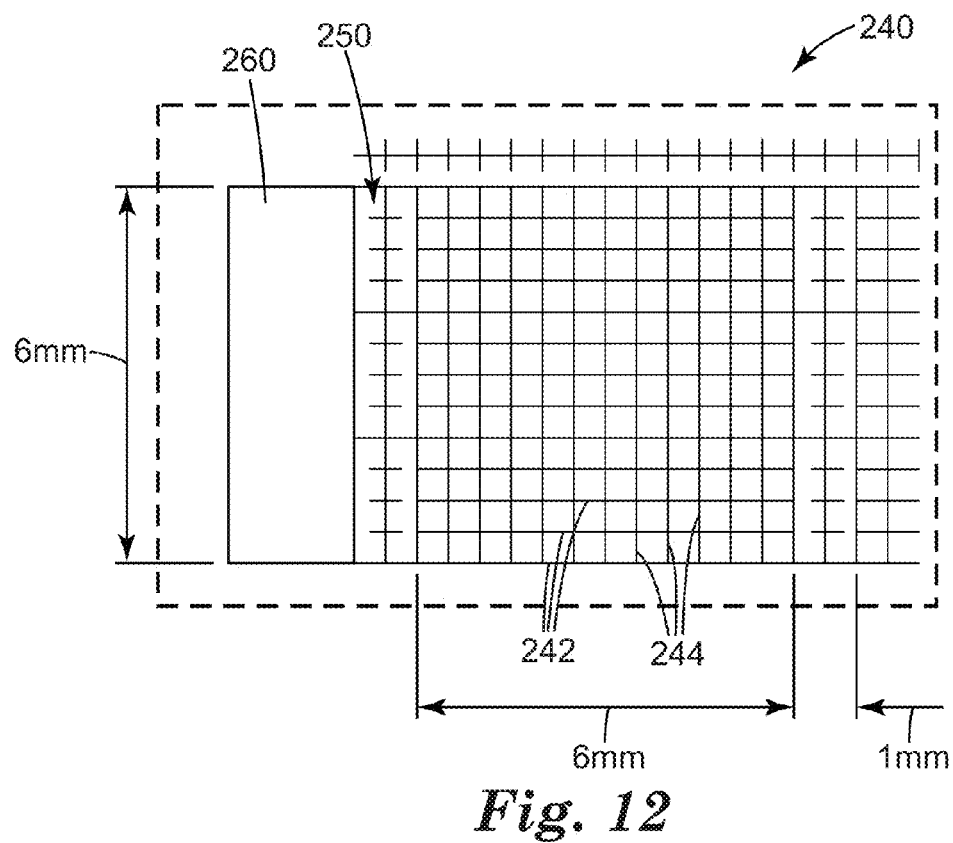
FIG. 12 illustrates a portion of the conductor micropattern illustrated in FIG. 3, the portion including a conductive mesh with selective breaks for modulating the local sheet resistance as well as a larger feature in the form of a contact pad.
Figure 13:
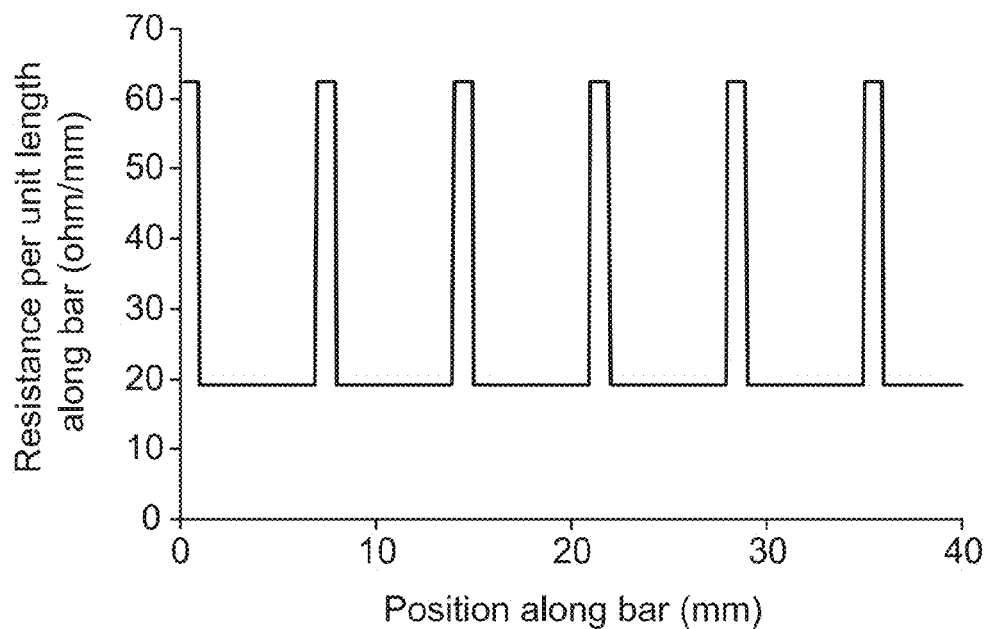
FIG. 13 illustrates a modulation in resistance along the horizontal mesh bars given in FIG. 3, created by selective breaks in the contiguous mesh.
Figure 14:
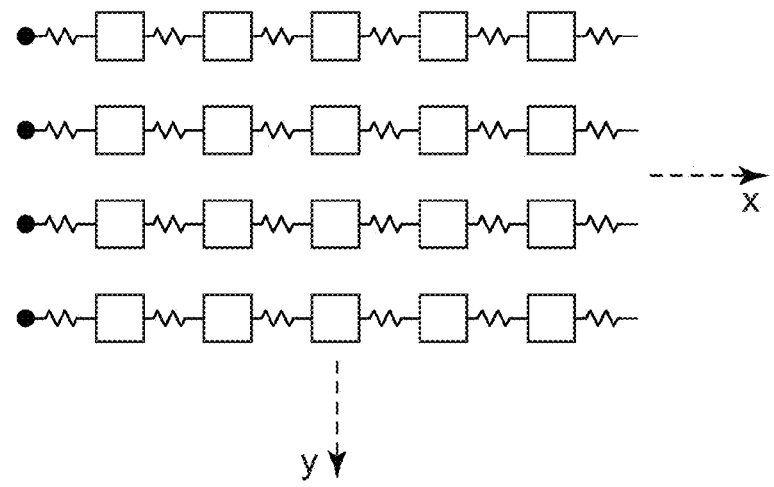
FIG. 14 is a circuit diagram that approximates the properties of the conductor micropattern illustrated in FIG. 3, where capacitive plates are separated by resistive elements.

A micropattern of thin film gold according to the following description is deposited onto a thin sheet of colorless glass (approximately 1 millimeter in thickness). The micropattern 240 is depicted in FIG. 11 and FIG. 12. The thickness or height of the gold layer is about 100 nanometers. The micropattern 240 involves a series of horizontal (x-axis) mesh bars 241 comprising horizontal narrow traces 242, the traces 242 measuring approximately 2 micrometers in width. Four of these horizontal mesh traces 242 are in electrical communication with a larger feature contact pad 260. The mesh bars measure approximately 6 millimeters in width. Accordingly, with thirteen evenly spaced traces 244 traversing a width (y-axis) of 6 millimeters and thirteen evenly spaced traces 242 traversing a length (x-axis) of 6 millimeters, the pitch of the square grid of traces is 500 micrometers. As depicted in FIG. 12, certain traces have breaks 250, measuring approximately 25 micrometers (exaggerated in the figures, for ease in locating). For a square grid with 2 micrometers wide opaque traces on a 500 micrometer pitch, the fill factor for opaque traces is 0.80%, thus leading to an open area of 99.20%. For the same square grid, except with a 25 micrometer break every 500 micrometers, the fill factor is 0.78%, thus leading to an open area of 99.22%. Thus, the design includes 1 mm×6 mm regions with 99.22% open area and 6 mm×6 mm regions with 99.20% open area. The average visible transmittance of the glass article with mesh is approximately 0.92*0.992=91% (with the factor of 0.92 related to interfacial reflection losses in light transmission in the non-conductor-deposited areas of the pattern). Along the horizontal bar direction, there is a series of complete grid regions connected together by four traces of gold. Assuming an effective bulk resistivity of 5E-06 ohm-cm for sputtered thin film gold, each 2 micrometer wide, 500 micrometer long segment of thin film gold has a resistance of approximately 125 ohms. The regions with a completed grid, for current passing in the direction of the bars, have an effective sheet resistance of approximately 115 ohms per square. The four traces connecting the regions with completed grids create approximately 62.5 ohms of resistance between the regions. The above described arrangement of conductive trace elements leads to a spatially varying resistance per unit length along the bar direction as plotted in FIG. 13. FIG. 14 illustrates an equivalent circuit for the array of horizontal mesh bars. The circuit has a series of plates connected by resistors.

Example 2

Figure 15:
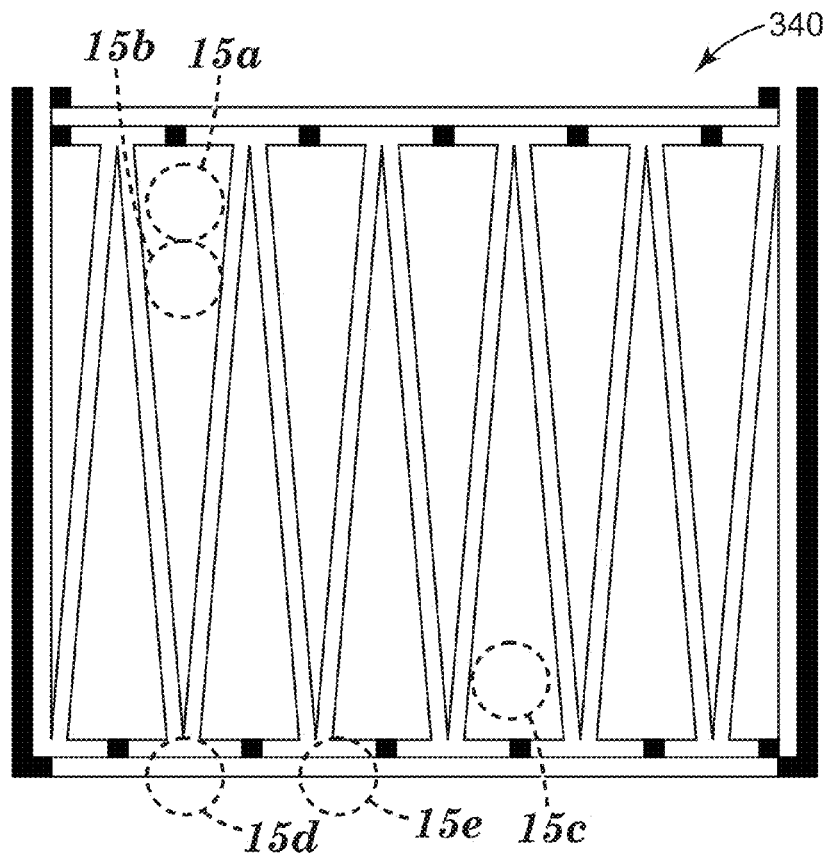
FIG. 15 illustrates the conductor micropattern for one embodiment of the touch screen sensor, the micropattern including regions labeled 15a-15e with different sheet resistance created in part by selective breaks in the electrically conductive micropattern mesh.
Figure 15A:
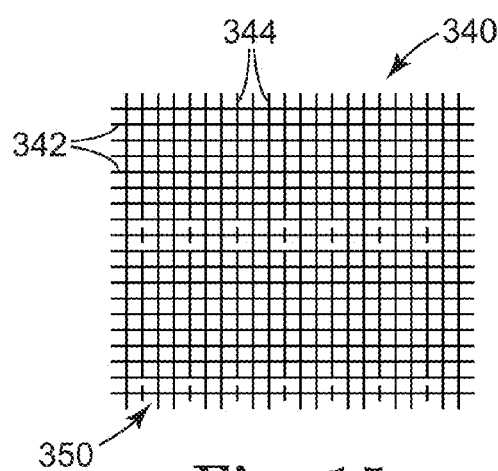
Figure 15B:
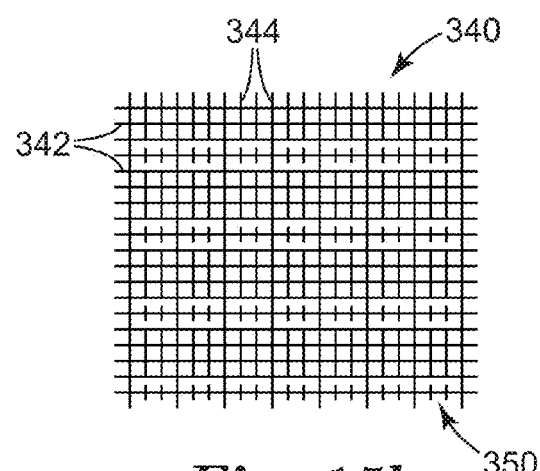

A micropattern of thin film gold according to the following description is deposited onto a thin sheet of colorless glass (approximately 1 millimeter in thickness). The micropattern 340 is depicted in FIG. 15. The thickness of the gold is about 100 nanometers. The micropattern 340 has transparent conductive regions in the form of a series of interdigitated wedges or triangles. Each wedge is comprised of a mesh made up of narrow metallic traces 342, 344, the traces 342, 344 (see FIG. 15a-FIG. 15c) measuring approximately 2 micrometers in width. The mesh wedges measure approximately 1 centimeter in width at their base and approximately six centimeters in length. The pitch of the square grid of traces 342, 344 is 500 micrometers. Within selected regions of the mesh (see FIG. 15a-FIG. 15b), within a wedge, breaks 350 measuring approximately 25 micrometers in length are placed intentionally to affect the local sheet resistance within the wedge, for current passing along its long axis. As depicted in FIG. 15a and FIG. 15b, regions 15a and 15b (the regions being separated by approximately 1 centimeter in FIG. 15), breaks 350 are included in the mesh that increase the sheet resistance in the direction of the long axis by a factor greater than 1.2. The overall design also includes region 15c (as depicted in FIG.

15c), which is electrically isolated and spaced apart from regions 15a and 15b, and which has a mesh of with sheet resistance value less than those of regions 15a and 15b. The mesh region 15c has an open area of 99.20%, while the mesh regions 15a and 15b have open area fractions of 99.20% and 99.21% respectively. The overall design also includes regions 15d and 15e (as depicted in FIG. 15d and FIG. 15e) with meshes of larger pitch than regions 15a, 15b and 15c, but with the same width of traces, leading to increased sheet resistance and visible transmittance.

FIG. 16 illustrates the effect of engineering the mesh properties as described above on the gradient in resistance along a wedge, versus the use of a standard ITO coating for the same shape of region. The overall design also includes larger conductive features in the form of conductive leads along the left and right sides of the pattern, the leads being approximately 1 millimeter wide and patterned from thin film gold with approximately 100 nanometers thickness.

Example 3

Figure 17:
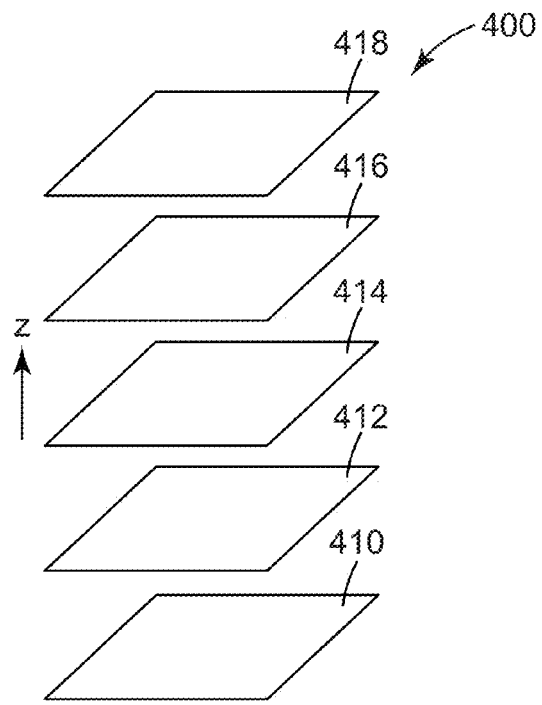
FIG. 17 illustrates the arrangement of layers that are laminated together to form one embodiment of the touch screen sensor, an X-Y grid type projected capacitive touch screen sensor.

A transparent sensor element 400 for a touch screen sensor is illustrated in FIG. 17. The sensor element 400 includes two patterned conductor layers 410, 414, (e.g., an X axis layer and a Y axis layer) two optically clear adhesive layers 412, 416, and a base plate 418, laminated together and depicted as separated in FIG. 17 for clarity. Layers 410 and 414 include transparent conductive mesh bars where one layer is oriented in the x axis direction and the other layer is orientated in the y axis direction, with reference to FIG. 2. The base plate 418 is a sheet of glass measuring 6 centimeter by 6 centimeters in area and 1 millimeter in thickness. A suitable optically clear adhesive is Optically Clear Laminating Adhesive 8141 from 3M Company, St. Paul, Minn. For each of the X-layer and the Y-layer, a clear polymer film with a micropattern of metal is used. A micropattern of thin film gold according to the following description is deposited onto a thin sheet of PET. Suitable PET substrates include ST504 PET from DuPont, Wilmington, Del., measuring approximately 125 micrometers in thickness.

Figure 18:
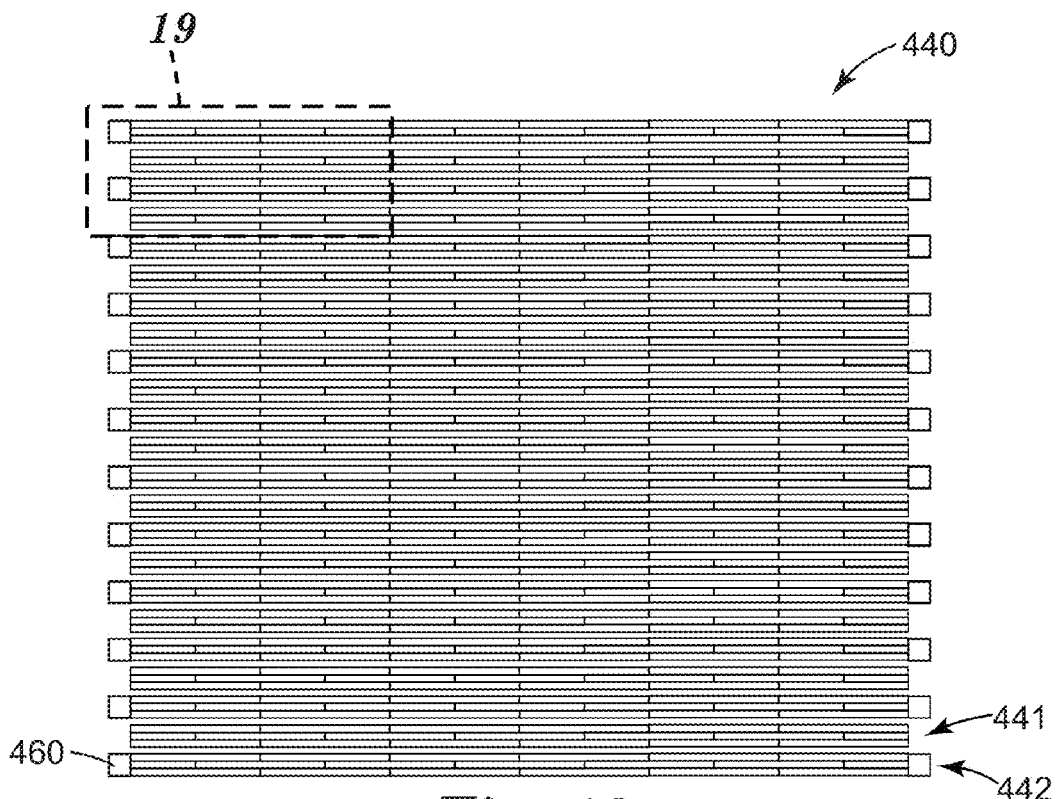
FIG. 18 illustrates the conductor micropattern for the X-layer or the Y-layer of an embodiment of the touch screen sensor according to FIG. 17.
Figure 19:
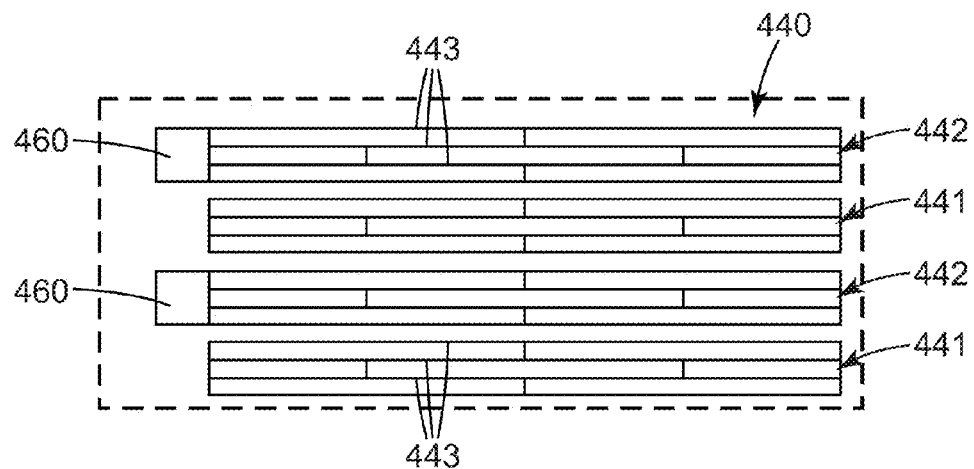
FIG. 19 illustrates a portion of the conductor micropattern illustrated in FIG. 10, the portion including a visible light transparent conductive mesh contacting a larger feature in the form of a contact pad, as well as electrically isolated conductor deposits in the space between the mesh regions.

The micropattern 440 is depicted in FIG. 18 and FIG. 19. The thickness of the gold is about 100 nanometers. The micropattern has transparent conductive regions in the form of a series of parallel mesh bars 442. In addition to mesh bars that are terminated with square pads 460 (approximately 2 millimeters by 2 millimeters in area, comprising continuous conductor in the form of thin film gold with thickness approximately 100 nanometers) for connection to an electronic device for capacitive detection of finger touch to the base plate, there are mesh bars 441 that are electrically isolated from the electronic device. The isolated mesh bars 441 serve to maintain optical uniformity across the sensor. Each bar is comprised of a mesh made up of narrow metallic traces 443, the traces 443 measuring approximately 5 micrometers in width. The mesh bars each measure approximately 2 millimeters in width and 66 millimeters in length. Within each mesh bar are rectangular cells measuring approximately 0.667 millimeters in width and 12 millimeters in length. This mesh design serves to provide ties between long-axis traces in each mesh bar, to maintain electrical continuity along the mesh bar, in case of any open-circuit defects in the long axis traces. However, as opposed to the use of a square mesh with 0.667 millimeter pitch having such ties, the rectangular mesh of FIG. 18 and FIG. 19 trades off sheet resistance along the mesh bar with optical transmittance more optimally. More specifically, the mesh bar depicted in FIG. 18 and FIG. 19 and a 2 millimeter wide mesh bar comprising a square mesh with 0.667 millimeter pitch would both have essentially the same sheet resistance along the long axis of the mesh bar (approximately 50 ohms per square); however, the square grid would occlude 1.5% of the area of the transparent conductive region and the mesh depicted in FIG. 18 and FIG. 19 occludes only 0.8% of the area of the transparent conductive region.

Example 4

A transparent sensor element for a touch screen sensor is described. The sensor element includes two patterned conductor layers, two optically clear adhesive layers, and a base plate as depicted in FIG. 17. The base plate is a sheet of glass measuring 6 centimeter by 6 centimeters in area and 1 millimeter in thickness, laminated together as depicted in FIG. 17. A suitable optically clear adhesive is Optically Clear Laminating Adhesive 8141 from 3M Company. For each of the X-layer and the Y-layer, a clear polymer film with a micropattern of metal is used. A micropattern of thin film gold according to the following description is deposited onto a thin sheet of PET. Suitable PET substrates include ST504 PET from DuPont, measuring approximately 125 micrometers in thickness.

Figure 20:
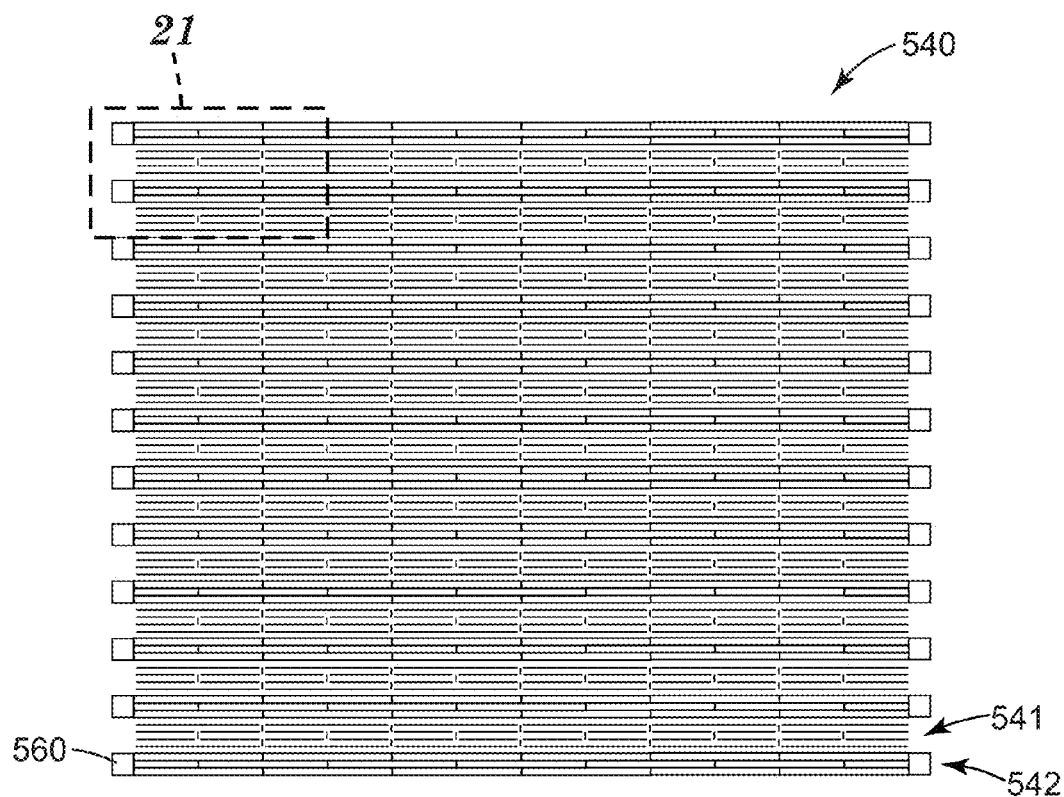
FIG. 20 illustrates the conductor micropattern for the X-layer or the Y-layer of another embodiment of the touch screen sensor according to FIG. 9.
Figure 21:
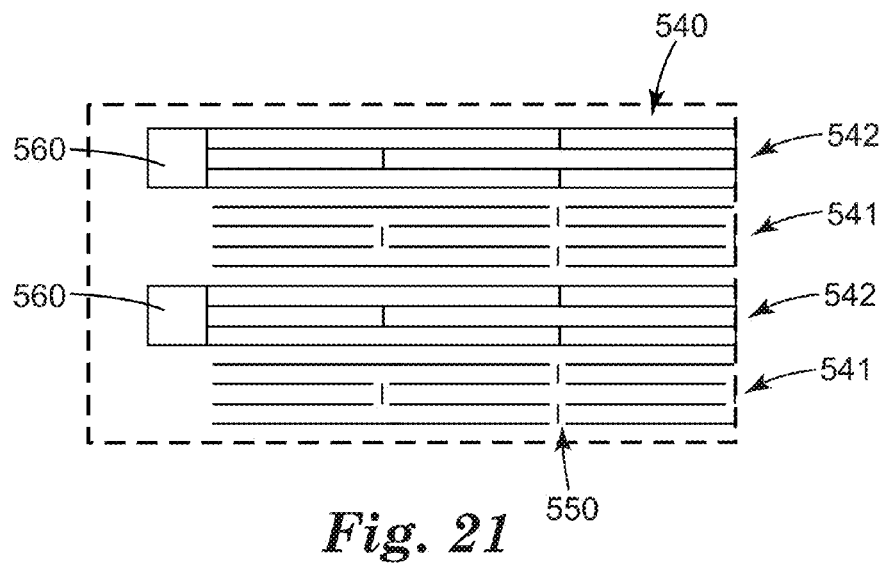
FIG. 21 illustrates a portion of the conductor micropattern given in FIG. 12, the portion including a visible light transparent conductive mesh contacting a larger feature in the form of a contact pad, as well as electrically isolated conductor deposits in the space between the mesh regions.

The micropattern 540 is depicted in FIG. 20 and FIG. 21. The thickness of the gold is 100 nanometers. The micropattern 540 has transparent conductive regions in the form of a series of parallel mesh bars 542. In addition to mesh bars 542 that are terminated with square pads 560 for connection to an electronic device for capacitive detection of finger touch to the base plate, there are straight line segments 541 that are electrically isolated from the electronic device. The straight line segments 541 lie in regions between the mesh bars 542, with essentially the same geometry as the mesh bars, except for approximately 25 micrometer breaks 550 as depicted in FIG. 13. The isolated line segments 541 serve to maintain optical uniformity across the sensor. Each bar 542 is comprised of a mesh made up of narrow metallic traces, the traces measuring approximately 5 micrometers in width. The mesh bars 542 each measure approximately 2 millimeters in width and 66 millimeters in length. Within each mesh bar 542 are rectangular cells measuring approximately 0.667 millimeters in width and 12 millimeters in length. The mesh 542 depicted in FIG. 12 and FIG. 13 occludes 0.8% of its area within the transparent conductive region. The isolated line segments 541 depicted in FIG. 12 and FIG. 13 also occlude 0.8% of the area within the region they occupy between the mesh bars 542.

Example 5

A transparent sensor element for a touch screen sensor is described. The sensor element includes two patterned conductor layers, two optically clear adhesive layers, and a base plate as depicted in FIG. 17. The base plate is a sheet of glass measuring 6 centimeter by 6 centimeters in area and 1 millimeter in thickness, laminated together as depicted in FIG. 17. A suitable optically clear adhesive is Optically Clear Laminating Adhesive 8141 from 3M Company. For each of the X-layer and the Y-layer, a clear polymer film with a micropattern of metal is used. A micropattern of thin film gold according to the following description is deposited onto a thin sheet of PET. Suitable PET substrates include ST504 PET from DuPont, measuring approximately 125 micrometers in thickness.

Figure 22:
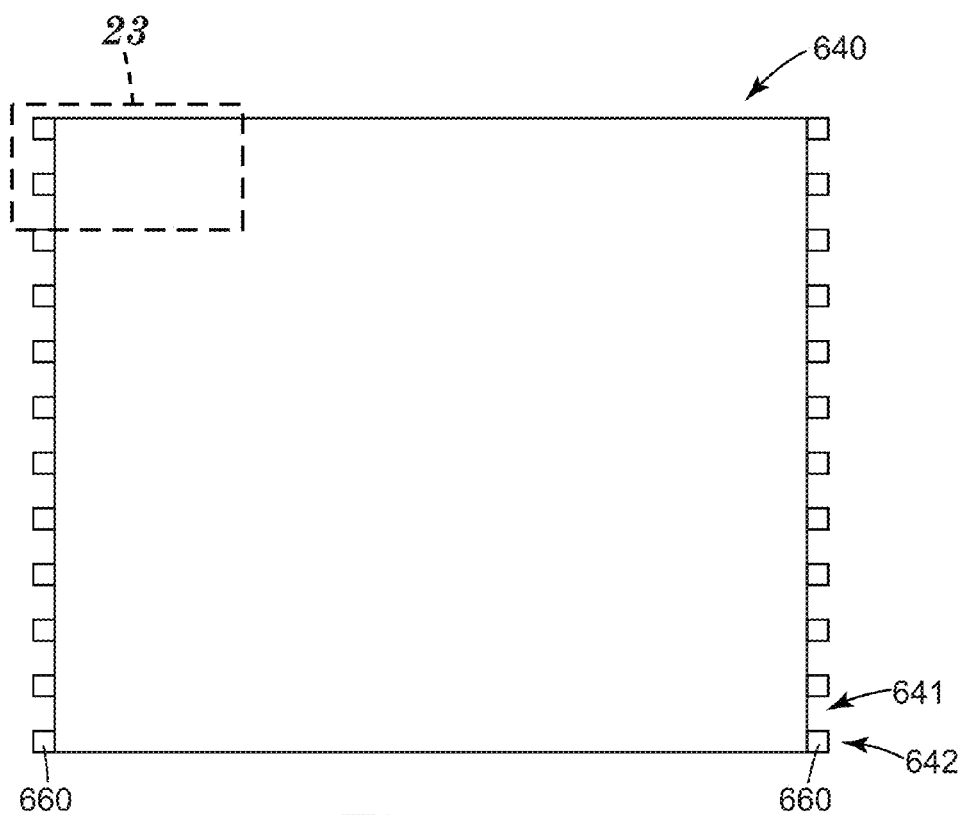
FIG. 22 illustrates the conductor micropattern for the X-layer or the Y-layer of another embodiment of the touch screen sensor according to FIG. 17.
Figure 23:
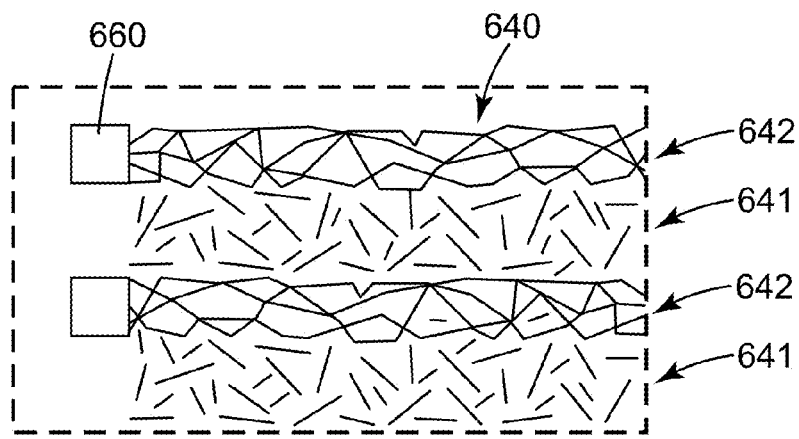
FIG. 23 illustrates a portion of the conductor micropattern given in FIG. 22, the portion including a visible light transparent conductive mesh contacting a larger feature in the form of a contact pad, as well as electrically isolated conductor deposits in the space between the mesh regions.

The micropattern 640 is depicted in FIG. 22 and FIG. 23. The thickness of the gold is about 100 nanometers. The micropattern 640 has transparent conductive regions in the form of a series of parallel mesh bars 642. In addition to mesh bars 642 that are terminated with square pads 660 for connection to an electronic device for capacitive detection of finger touch to the base plate, there are straight line segments 641 that are electrically isolated from the electronic device. The straight line segments 641 lie in regions between the mesh bars, with a similar geometry to the line segments of the mesh bars. The electrically isolated line segments 641 serve to maintain optical uniformity across the sensor. Each bar 641, 642 is comprised of narrow metallic traces, the traces measuring approximately 3 micrometers in width. The mesh bars 642 each measure approximately 2 millimeters in width and 66 millimeters in length. Within each mesh bar 642 comprising randomly shaped cells. The mesh 642 depicted in FIG. 22 and FIG. 23 occludes less than 5 percent of its area within the transparent conductive region. The isolated line segments 641 depicted in FIG. 22 and FIG. 23 also occlude less than 5 percent of the area within the region they occupy between the mesh bars.

Preparation of Metalized Polymer Film Substrates e.g.s 6 Through 40

A polymer film substrate was provided, polyethyleneterephthalate (PET) (ST504, E. I. DuPont de Nemours and Company, Wilmington, Del.). The optical properties of the ST504 PET film were determined by Haze-Gard. The haze and the transmission measured approximately 0.67% and 92.9%, respectively.

Some substrate films were coated with gold and some were coated with silver. The gold-coated substrates were prepared by thermal evaporation (DV-502A, Denton Vacuum, Moorestown, N.J.). For gold-coated substrates, the substrate surface was first coated with 20 angstroms of chromium and then coated with 100 nanometers of gold. In the case of silver-coated substrates, two different methods were used. Some silver-coated substrates were prepared by both thermal evaporation (DV-502A, Denton Vacuum, Moorestown, N.J.) and some were prepared by sputtering (3M). The substrate surface was coated with 100 nanometers of silver in all cases.

Stamp Fabrication

Two different master tools for molding elastomeric stamps were generated by preparing patterns of photoresist (Shipley1818, Rohm and Haas Company, Philadelphia, Pa.) on 10-centimeter diameter silicon wafers using photolithography. The different master tools were based on two different mesh shapes, herein referred to as "Hex" and "Square". Hex refers to a pattern comprising a network of lines that define enclosed areas having the shape of a regular hexagon. Square refers to a pattern comprising a network of lines that define enclosed areas having the shape of squares. An elastomeric stamp was molded against the master tool by pouring uncured polydimethylsiloxane (PDMS, Sylgard™ 184, Dow Corning, Midland Mich.) over the tool to a thickness of approximately 3.0 millimeters. The uncured silicone in contact with the master was degassed by exposing to a vacuum, and then cured for 2 hours at 70° C. After peeling from the master tool, a PDMS stamp was provided with a relief pattern comprising raised features approximately 1.8 micrometers in height. For both hex mesh and square mesh stamps, the raised features were the lines defining the respective mesh geometry, as described above.

Inking

The stamp was inked by contacting its back side (flat surface without relief pattern) to a solution of octadecylthiol ("ODT" 00005, TCI AMERICA, Wellesley Hills, Mass.) in ethanol for 20 hours. 10 mM of ODT solution was used for the stamp with square mesh pattern, and 5 mM of ODT solution was used for the stamp with hex mesh pattern.

Stamping

Metalized polymer film substrates were stamped with inked stamps as described above. For stamping, the metalized film was contacted to the stamp relief patterned-surface, which was face up, by first contacting an edge of the film sample to the stamp surface and then rolling the film into contact across the stamp, using a foam roller with diameter of approximately 3.0 centimeters. The rolling step required less than 1 second to execute. After rolling step, the substrate was contacted with the stamp for 10 seconds. Then, the substrate was peeled from the stamp, a step that required less than 1 second.

Etching

After stamping, the metallized film substrate with printed pattern was immersed into an etchant solution for selective etching and metal patterning. For printed metalized film substrates bearing a gold thin film, the etchant comprised 1 gram of thiourea (T8656, Sigma-Aldrich, St. Louis, Mo.), 0.54 milliliter of concentrated hydrochloric acid (HX0603-75, EMD Chemicals, Gibbstown, N.J.), 0.5 milliliter of hydrogen peroxide (30%, 5240-05, Mallinckrodt Baker, Phillipsburg, N.J.), and 21 grams of deionized water. To pattern the gold thin film, the printed metalized film substrate was immersed in the etch solution for 50 seconds. For printed metalized film substrates bearing a silver thin film, the etchant comprised 0.45 grams of thiourea (T8656, Sigma-Aldrich, St. Louis, Mo.), 1.64 grams of ferric nitrate (216828, Sigma-Aldrich, St. Louis, Mo.), and 200 milliliter of deionized water. To pattern the silver thin film, the printed metalized film substrate was immersed in the etch solution for 3 minutes. After patterned etching of the gold, residual chromium was etched using a solution of 2.5 grams of potassium permanganate (PX1551-1, EMD Chemicals, Gibbstown, N.J.), 4 grams of potassium hydroxide (484016, Sigma-Aldrich, St. Louis, Mo.), and 100 milliliters of deionized water.

Characterization

After selective etching and metal patterning, the metal patterns were characterized using an optical microscope (Model ECLIPSE LV100D equipped with a DS-Fil digital camera and NIS-Elements D software, Nikon, Melville, N.Y.), scanning electron microscope (SEM, Model JSM-6400, JEOL Ltd, Tokyo, Japan), and Haze-Gard (Haze-Gard plus, BYK Gardner, Columbia, Md.). The microscopic techniques were used to determine the width of line features in the metal pattern. Haze-Gard was used to determine the transmission and the haze for the mesh-grid coated films. The Haze-Gard measurements were done after laminating the patterned film on a glass with an optical clear adhesive (3M Product). The visibility factor of high, medium, and low was assigned to describe the degree of visibility of line features in the metal pattern (human observation with unaided eye).

Example 6

A hexagonal mesh grid pattern of thin film gold was fabricated and characterized according to the procedures described above. The ink solution comprised octadecylthiol dissolved in ethanol at a concentration of 5 mM. The ink solution was contacted to the back side of the stamp for 20 hours. The stamping time was 10 seconds. FIG. 1 gives an SEM photomicrograph recorded from the completed thin film gold micropattern. The actual line width measured approximately 1.63 micrometers. The percentage of open area was recalculated based on the measured line width and the designed edge-to-edge width of 400 micrometers, which is 99.2%. The optical properties of the gold Hex mesh grid coated film were determined by Haze-Gard. The haze and the transmission measured approximately 1.14% and 91.6%, respectively. High visibility was assigned to this example because the gold Hex mesh pattern with a line width of 1.63 micrometers and an edge-to-edge width of 400 micrometers can be easily seen.

Examples 7 to 15

Hexagonal mesh grid patterns of thin film gold were fabricated and characterized according to the procedures described in Example 1. The actual line width for each example was measured using SEM and listed in Table 1. The percentage of open area was then recalculated based on the actual line width and designed edge-to-edge width and listed in Table 1. Table 1 also gives the haze value and the transmission value for each example measured by Haze-Gard and the visibility factors assigned to each example.

Example 16

A square mesh grid pattern of thin film gold was fabricated and characterized according to the procedures described above. The ink solution comprised octadecylthiol dissolved in ethanol at a concentration of 10 mM. The ink solution was contacted to the back side of the stamp for 20 hours. The stamping time was 10 seconds. The actual line width measured approximately 4.73 micrometers using optical microscope. The percentage of open area was recalculated based on the measured line width and the designed pitch of 320 micrometers, which is 97.0%. The optical properties of the gold Square mesh grid coated film were determined by Haze-Gard. The haze and the transmission measured approximately 1.58% and 88.6%, respectively. High visibility was assigned to this example because the gold Square mesh pattern with a line width of 4.73 micrometers and a pitch of 320 micrometers can be easily seen.

Examples 17-23

Square mesh grid patterns of thin film gold were fabricated and characterized according to the procedures described in Example 11. The actual line width for each example was measured using optical microscope and listed in Table 1. The percentage of open area was then recalculated based on the actual line width and designed pitch and listed in Table 1. Table 1 also gives the haze value and the transmission value for each example measured by Haze-Gard and the visibility factors assigned to each example.

Example 24

A hex mesh grid pattern of thin film silver was fabricated and characterized according to the procedures described above. The silver-coated substrates were prepared by sputtering. The ink solution comprised octadecylthiol dissolved in ethanol at a concentration of 5 mM. The ink solution was contacted to the back side of the stamp for 20 hours. The stamping time was 10 seconds. FIG. 2 gives an SEM photomicrograph recorded from the completed thin film silver micropattern. The actual line width measured approximately 2.43 micrometers. The percentage of open area was recalculated based on the measured line width and the designed edge-to-edge width of 600 micrometers, which is 99.2%. The optical properties of the gold Hex mesh grid coated film were determined by Haze-Gard. The haze and the transmission measured approximately 1.19% and 91.8%, respectively. High visibility was assigned to this example because the silver Hex mesh pattern with a line width of 2.43 micrometers and an edge-to-edge width of 600 micrometers can be easily seen.

Examples 25 to 32

Hex mesh grid patterns of thin film silver were fabricated and characterized according to the procedures described in Example 19. The actual line width for each example was measured using SEM and listed in Table 1. The percentage of open area was then recalculated based on the actual line width and designed edge-to-edge width and listed in Table 1. Table 1 also gives the haze value and the transmission value for each example measured by Haze-Gard and the visibility factors assigned to each example.

Example 33

A Square mesh grid pattern of thin film silver was fabricated and characterized according to the procedures described above. The silver-coated substrates were prepared by thermal evaporation.

The ink solution comprised octadecylthiol dissolved in ethanol at a concentration of 10 mM. The ink solution was contacted to the back side of the stamp for 20 hours. The stamping time was 10 seconds. The actual line width measured approximately 5.9 micrometers using optical microscope. The percentage of open area was recalculated based on the measured line width and the designed pitch of 320 micrometers, which is 96.3%. The optical properties of the silver Square mesh grid coated film were determined by Haze-Gard. The haze and the transmission measured approximately 1.77% and 88.9%, respectively. High visibility was assigned to this example because the silver Square mesh pattern with a line width of 5.9 micrometers and a pitch of 320 micrometers can be easily seen.

Examples 34-40

Square mesh grid patterns of thin film silver were fabricated and characterized according to the procedures described in Example 28. The actual line width for each example was measured using optical microscope and listed in Table 1. The percentage of open area was then recalculated based on the actual line width and designed pitch and listed in Table 1. Table 1 also gives the haze value and the transmission value for each example measured by Haze-Gard and the visibility factors assigned to each example.

TABLE 1

| Example number | Metal type | Mesh geometry | Line width (μm) | Open area fraction (%) | Haze (%) | Transmission (%) | Visibility of Lines | Region[1] |
|---|---|---|---|---|---|---|---|---|
| 6 | Gold | Hex | 1.63 | 99.2 | 1.14 | 91.6 | High | 2 |
| 7 | Gold | Hex | 2.92 | 99.0 | 1.04 | 91.6 | High | 2 |
| 8 | Gold | Hex | 2.91 | 99.0 | 1.2 | 91.5 | High | 2 |
| 9 | Gold | Hex | 1.92 | 98.7 | 1.37 | 91.4 | Medium | 1 |

TABLE 1-continued

| Example number | Metal type | Mesh geometry | Line width (μm) | Open area fraction (%) | Haze (%) | Transmission (%) | Visibility of Lines | Region[1] |
|---|---|---|---|---|---|---|---|---|
| 10 | Gold | Hex | 2.14 | 97.9 | 1.61 | 91.2 | Low | 1 |
| 11 | Gold | Hex | 1.84 | 98.2 | 1.62 | 90.9 | Low | 1 |
| 12 | Gold | Hex | 2.65 | 98.2 | 1.42 | 90.8 | Medium | 1 |
| 13 | Gold | Hex | 2.69 | 97.3 | 1.76 | 90.6 | Low | 1 |
| 14 | Gold | Hex | 1.13 | 97.7 | 2.57 | 90.3 | Low | 2 |
| 15 | Gold | Hex | 2.27 | 97.7 | 1.78 | 90.3 | Low | 1 |
| 16 | Gold | Square | 4.73 | 97.0 | 1.58 | 88.6 | High | 2 |
| 17 | Gold | Square | 3.01 | 96.2 | 2.33 | 88.4 | Medium | 2 |
| 18 | Gold | Square | 4.7 | 94.1 | 1.95 | 86.0 | Medium | 2 |
| 19 | Gold | Square | 3.01 | 92.5 | 3.77 | 85.6 | Low | 2 |
| 20 | Gold | Square | 4.49 | 91.4 | 2.77 | 83.3 | Low | 2 |
| 21 | Gold | Square | 3.18 | 87.3 | 5.45 | 81.1 | Low | 3 |
| 22 | Gold | Square | 4.73 | 88.2 | 3.11 | 80.9 | Low | 3 |
| 23 | Gold | Square | 2.82 | 86.9 | 6.68 | 79.1 | Low | 3 |
| 24 | Silver | Hex | 2.43 | 99.2 | 1.19 | 91.8 | High | 2 |
| 25 | Silver | Hex | 2.18 | 99.3 | 1.45 | 91.7 | High | 2 |
| 26 | Silver | Hex | 1.92 | 99.0 | 1.39 | 91.5 | High | 2 |
| 27 | Silver | Hex | 2.44 | 98.4 | 1.62 | 91.3 | Medium | 1 |
| 28 | Silver | Hex | 0.94 | 99.1 | 1.92 | 91.2 | Low | 1 |
| 29 | Silver | Hex | 2.18 | 98.6 | 1.92 | 91.0 | Medium | 1 |
| 30 | Silver | Hex | 2.55 | 97.5 | 1.93 | 90.8 | Low | 1 |
| 31 | Silver | Hex | 1.81 | 98.2 | 1.96 | 90.7 | Low | 1 |
| 32 | Silver | Hex | 2.89 | 97.1 | 2.04 | 90.0 | Low | 1 |
| 33 | Silver | Square | 5.9 | 96.3 | 1.77 | 88.9 | High | 3 |
| 34 | Silver | Square | 3.35 | 95.8 | 2.46 | 88.0 | Medium | 2 |
| 35 | Silver | Square | 5.57 | 93.1 | 2.55 | 86.2 | Medium | 3 |
| 36 | Silver | Square | 2.76 | 93.1 | 3.99 | 85.0 | Low | 2 |
| 37 | Silver | Square | 5.74 | 89.1 | 3.49 | 83.6 | Low | 3 |
| 38 | Silver | Square | 5.7 | 85.8 | 4.09 | 80.8 | Low | 3 |
| 39 | Silver | Square | 2.98 | 88.1 | 5.69 | 80.2 | Low | 3 |
| 40 | Silver | Square | 2.78 | 87.1 | 7.0 | 77.6 | Low | 3 |

Figure 24:
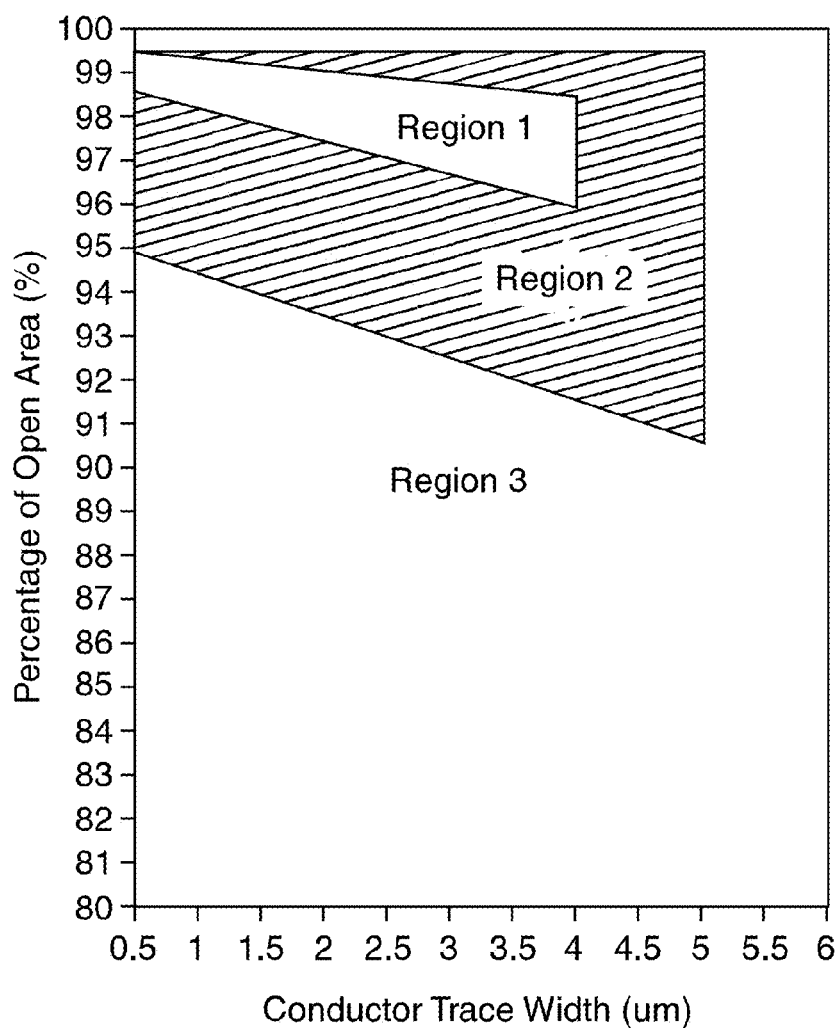
FIG. 24 illustrates a graph to reflect optical quality of the touch screen sensor, the graph being a plot of Percent of Open Area vs. conductor trace width (in micrometers), with Region 3 being good optical quality that can be used for a touch screen sensor, Region 2 being better in optical quality as compared to Region 2, and Region 1 having the best optical quality of the three regions. Percent of Open Area is used interchangeably with open area fraction herein.
Figure 25:
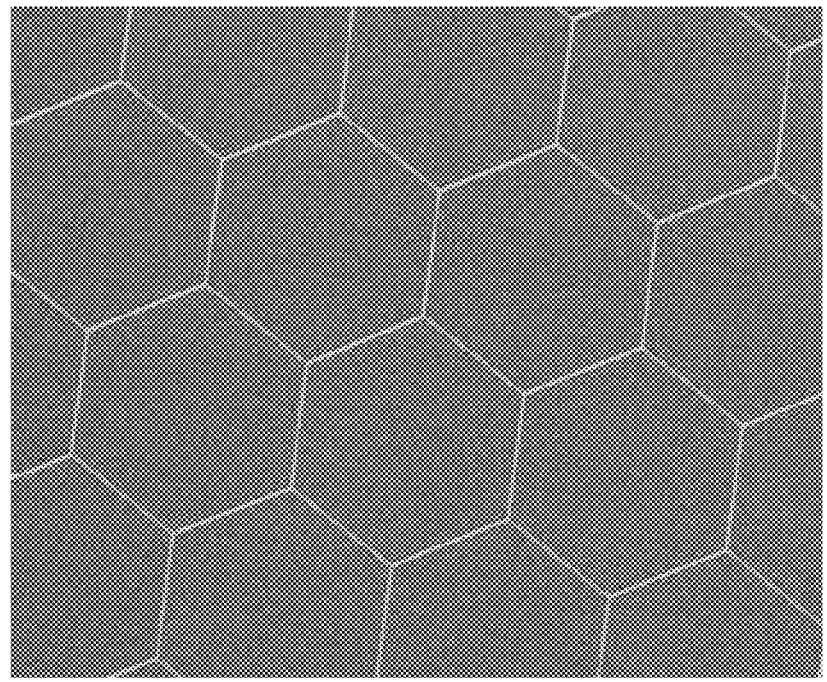
FIG. 25 and FIG. 26 illustrate scanning electron photomicrographs of the geometry for the hexagonal mesh (sometimes referred to as "hex" mesh) and square mesh that are characteristic of Examples 6 through 40. The light shade lines in each image represent the pattern of the metal conductor and the dark area represents the substrate used in the Examples.
Figure 26:
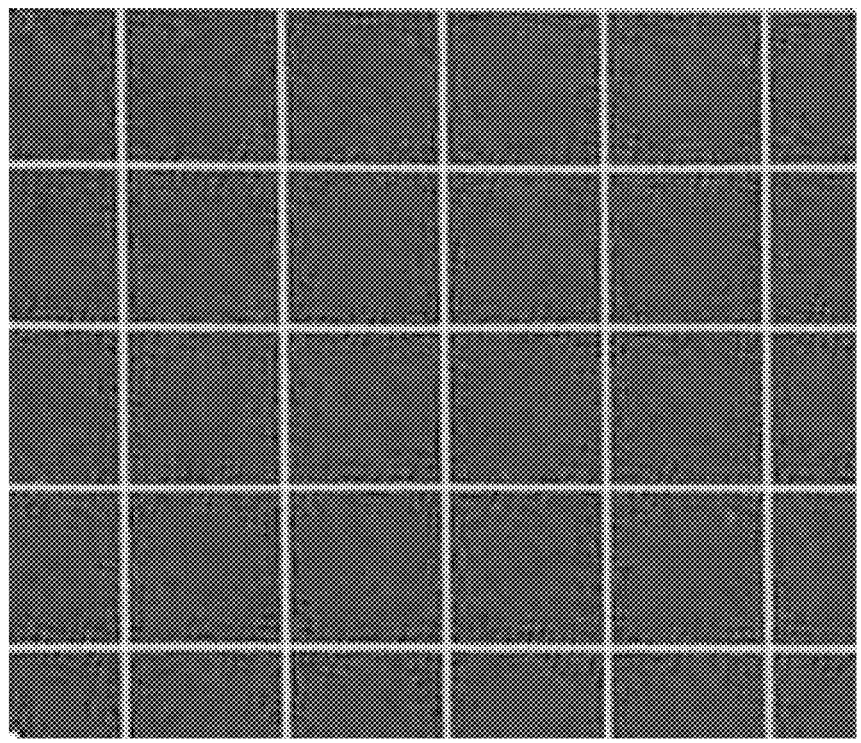

[1]Region refers to the different regions as shown and labeled in FIG. 24.

Example 41

Figure 28:
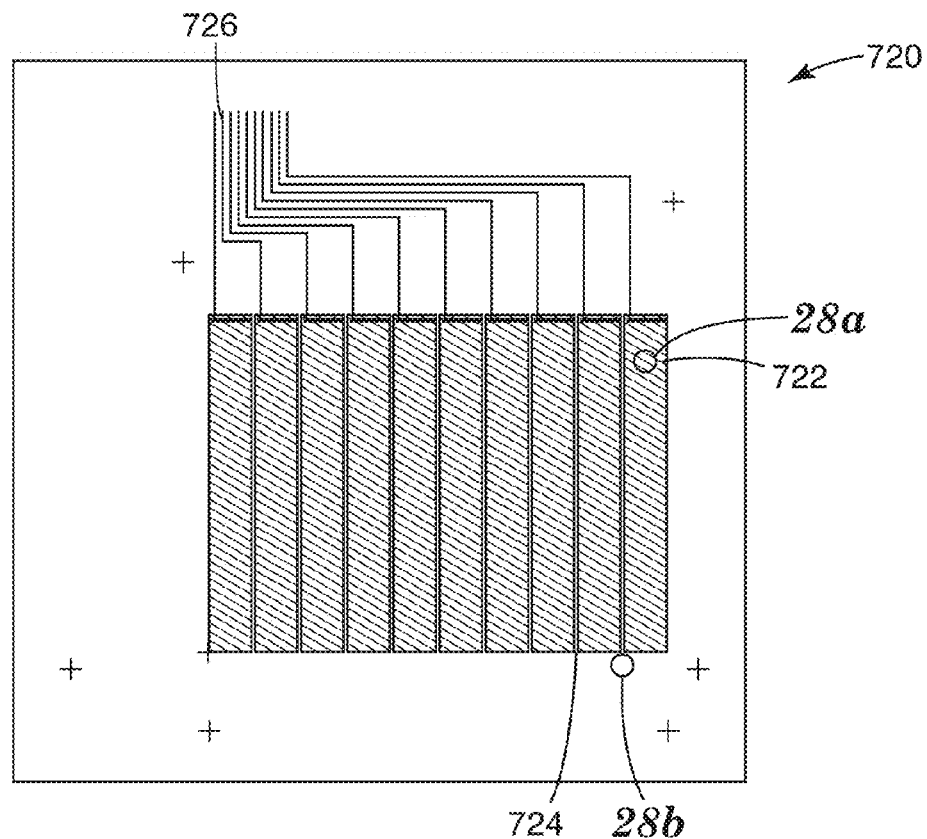
FIGS. 28, 28a, and 28b illustrate various portions of a second patterned substrate.
Figure 29:
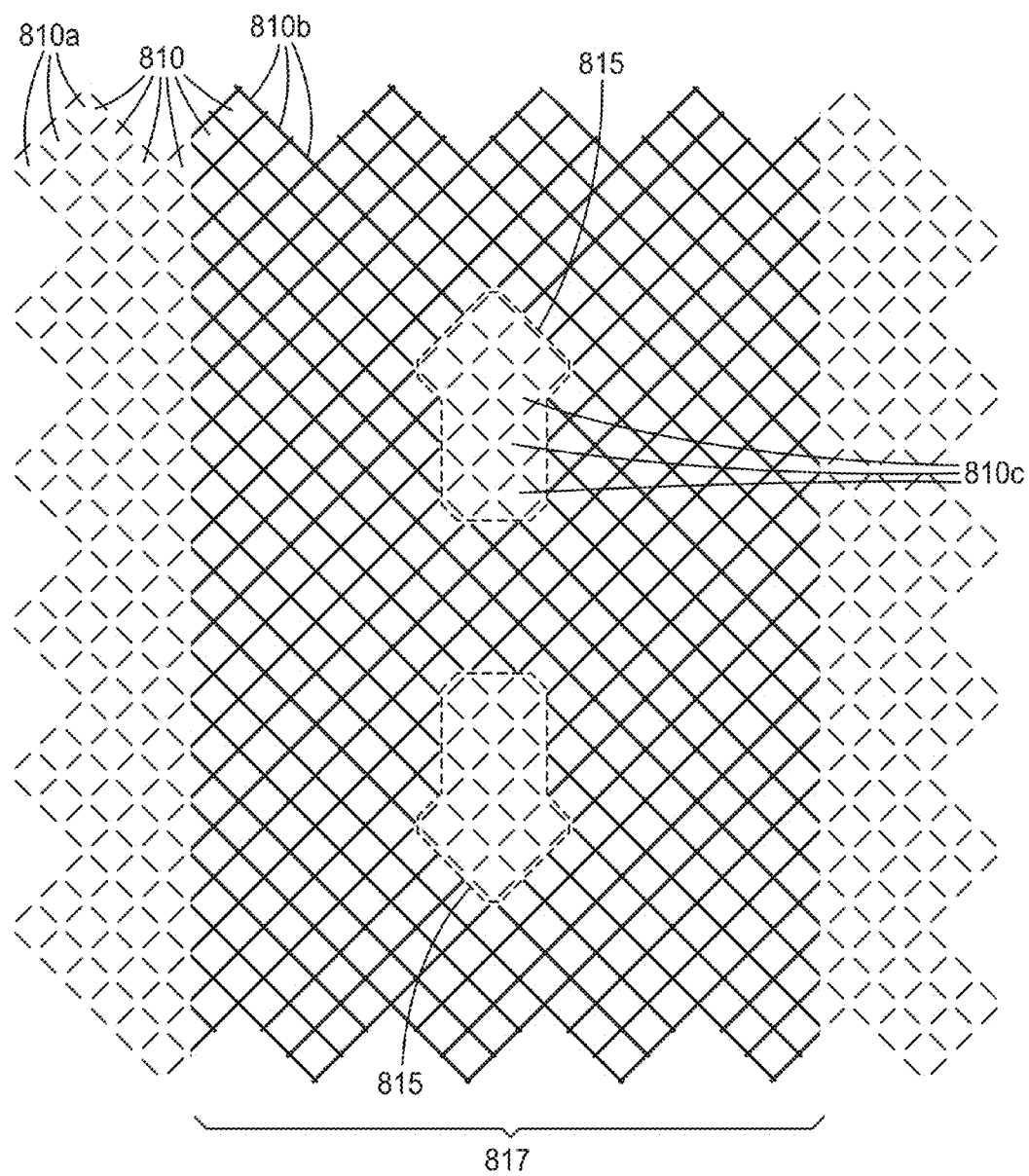
FIGS. 29, 30a, 30b, 31a, 31b, 31c, 32, 33, 34, 35, and 36 illustrate various electrode configurations including an open area.

A transparent sensor element was fabricated and combined with a touch sensor drive device as generally shown in FIGS. 27, 28 and 29 using microcontact printing and etching as described in co-assigned U.S. Provisional application 61/032,273. The device was then integrated with a computer processing unit connected to a display to test the device. The device was able to detect the positions of multiple single and or simultaneous finger touches, which was evidenced graphically on the display. This example used micro-contact printing and etching techniques (see also co-pending U.S. Patent App. No. 61/032,273) to form the micro-conductor pattern used in the touch sensor.

Formation of a Transparent Sensor Element
First Patterned Substrate

A first visible light substrate made of polyethylene terephthalate (PET) having a thickness of 125 micrometers (μm) was vapor coated with 100 nm silver thin film using a thermal evaporative coater to yield a first silver metalized film. The PET was commercially available as product number ST504 from E.I. du Pont de Nemours, Wilmington, Del. The silver was commercially available from Cerac Inc., Milwaukee, Wis. as 99.99% pure 3 mm shot.

A first poly(dimethylsiloxane) stamp, referred to as PDMS and commercially available as product number Sylgard 184, Dow Chemical Co., Midland, Mich., having a thickness of 3 mm, was molded against a 10 cm diameter silicon wafer (sometimes referred to in the industry as a "master") that had previously been patterned using standard photolithography techniques. The PDMS was cured on the silicon wafer at 65° C. for 2 hours. Thereafter, the PDMS was peeled away from the wafer to yield a first stamp having two different low-density regions with patterns of raised features, a first continuous hexagonal mesh pattern and a second discontinuous hexagonal mesh pattern. That is, the raised features define the edges of edge-sharing hexagons. A discontinuous hexagon is one that contains selective breaks in a line segment. The selective breaks had a length less than 10 μm. The breaks were designed and estimated to be approximately 5 μm. In order to reduce their visibility, it found that, preferably, the breaks should be less than 10 μm, more preferably, 5 μm or less, e.g., between 1 and 5 μm. Each raised hexagon outline pattern had a height of 2 um, had 1% to 3% area coverage, corresponding to 97% to 99% open area, and line segments that measured from 2 to 3 μm in width. The first stamp also included raised features defining 500 μm wide traces. The first stamp has a first structured side that has the hexagonal mesh pattern regions and the traces and an opposing second substantially flat side.

The stamp was placed, structured side up, in a glass Petri dish containing 2 mm diameter glass beads. Thus, the second, substantially flat side was in direct contact with the glass beads. The beads served to lift the stamp away from the base of the dish, allowing the following ink solution to contact essentially all of the flat side of the stamp. A 10 millimolar ink solution of 1-octadecanethiol (product number C18H3CS, 97%, commercially available from TCI America, Portland Oreg.) in ethanol was pipetted into the Petri dish beneath the stamp. The ink solution was in direct contact with the second substantially flat side of the stamp. After sufficient inking time (e.g., 3 hours) where the ink has diffused into the stamp, the first stamp was removed from the petri dish. The inked stamp was placed, structured side up, onto a working surface. The first silver metalized film was applied using a hand-held roller onto the now inked structured surface of the stamp such that the silver film was in direct contact with the structured surface. The metalized film remained on the inked stamp for 15 seconds. Then the first metalized film was removed from the inked stamp. The removed film was placed for three minutes into a silver etchant solution, which contained (i) 0.030 molar thiourea (product number T8656, Sigma-Aldrich, St. Louis, Mo.) and (ii) 0.020 molar ferric nitrate (product number 216828, Sigma-Aldrich) in deionized water. After the etching step, the resulting first substrate was rinsed with deionized water and dried with nitrogen gas to yield a first patterned surface. Where the inked stamp made contact with the silver of the first metalized substrate, the silver remained after etching. Thus silver was removed from the locations where contact was not made between the inked stamp and silver film.

FIGS. 27, 27a and 27b show a first patterned substrate 700 having a plurality of first continuous regions 702 alternating between a plurality of first discontinuous regions 704 on a first side of the substrate, which is the side that contained the now etched and patterned silver metalized film. The substrate has an opposing second side that is substantially bare PET film. Each of the first regions 702 has a corresponding 500 um wide conductive trace 706 disposed at one end. FIG. 27a shows an exploded view of the first region 702 having a plurality of continuous lines forming a hexagonal mesh structure. FIG. 27b shows an exploded view of the first discontinuous region 704 having a plurality of discontinuous lines (shown as selective breaks in each hexagon) forming a discontinuous hexagonal mesh structure. Each mesh structure of regions 702 and 704 had 97% to 99% open area. Each line segment measured from 2 to 3 µm.

Second Patterned Substrate

The second patterned substrate was made as the first patterned substrate using a second visible light substrate to produce a second silver metalized film. A second stamp was produced having a second continuous hexagonal mesh pattern interposed between a second discontinuous hexagonal mesh pattern.

Figure 28A:
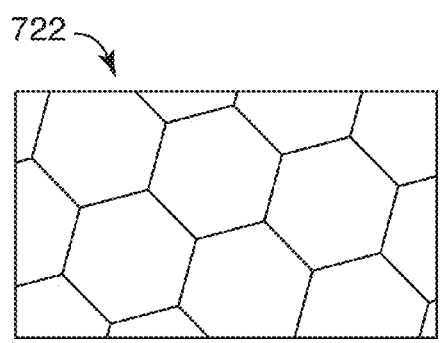
Figure 28B:
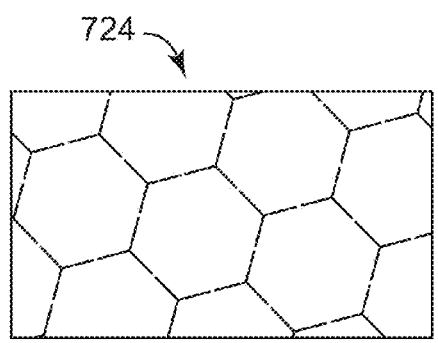

FIGS. 28, 28a and 28b show a second patterned substrate 720 having a plurality of second continuous regions 722 alternating between a plurality of second discontinuous regions 724 on a first side of the second substrate. Each of the second regions 722 has a corresponding 500 um wide second conductive trace 726 disposed at one end. FIG. 28a shows an exploded view of one second region 722 having a plurality of continuous lines forming a hexagonal mesh structure. FIG. 28b shows an exploded view of one second discontinuous region 724 having a plurality of discontinuous lines (shown as selective breaks in each hexagon) forming discontinuous hexagonal mesh structure. The selective breaks had a length less than 10 µn. The breaks were designed and estimated to be approximately 5 µm. In order to reduce their visibility, it found that, preferably, the breaks should be less than 10 µm, more preferably, 5 µm or less, e.g., between 1 and 5 µm. Each mesh structure of region 722 and 724 had 97% to 99% open area. Each line segment measured from 2 to 3 µm.

Formation of a Projected Capacitive Touch Screen Sensor Element

The first and second patterned substrates made above were used to produce a two-layer projected capacitive touch screen transparent sensor element as follows.

The first and second patterned substrates were adhered together using Optically Clear Laminating Adhesive 8141 from 3M Company, St. Paul, Minn. to yield a multilayer construction. A handheld roller was used to laminate the two patterned substrates with the regions of the first and second conductive trace regions 706 and 726 being adhesive free. The multilayer construction was laminated to a 0.7 mm thick float glass using Optically Clear Laminating Adhesive 8141 such that the first side of the first substrate was proximate to the float glass. The adhesive free first and second conductive trace regions 706 and 726 allowed electrical connection to be made to the first and second patterned substrates 700 and 720.

The integrated circuits used to make mutual capacitance measurements of the transparent sensor element were PIC18F87J10 (Microchip Technology, Chandler, Ariz.), AD7142 (Analog Devices, Norwood, Mass.), and MM74HC154WM (Fairchild Semiconductor, South Portland, Me.). The PIC18F87J10 was the microcontroller for the system. It controlled the selection of sensor bars which MM74HC154WM drives. It also configured the AD7142 to make the appropriate measurements. Use of the system included setting a number of calibration values, as is known in the art. These calibration values can vary from touch screen to touch screen. The system could drive 16 different bars and the AD7142 can measure 12 different bars. The configuration of the AD7142 included selection of the number of channels to convert, how accurately or quickly to take measurements, if an offset in capacitance should be applied, and the connections for the analog to digital converter. The measurement from the AD7142 was a 16 bit value representing the capacitance of the cross point between conductive bars in the matrix of the transparent sensor element.

After the AD7142 completed its measurements it signaled the microcontroller, via an interrupt, to tell it to collect the data. The microcontroller then collected the data over the SPI port. After the data was received, the microcontroller incremented the MM74HC154WM to the next drive line and cleared the interrupt in the AD7142 signaling it to take the next set of data. While the sampling from above was constantly running, the microcontroller was also sending the data to a computer with monitor via a serial interface. This serial interface allowed a simple computer program, as are known to those of skill in the art, to render the raw data from the AD7142 and see how the values were changing between a touch and no touch. The computer program rendered different color across the display, depending on the value of the 16 bit value. When the 16 bit value was below a certain value, based on the calibration, the display region was rendered white. Above that threshold, based on the calibration, the display region was rendered green. The data were sent asynchronously in the format of a 4 byte header (0xAAAAAAAA), one byte channel (0x00-0x0F), 24 bytes of data (represents the capacitive measurements), and carriage return (0x0D).

Results of Testing of the System

The transparent sensor element was connected to the touch sensor drive device. When a finger touch was made to the glass surface, the computer monitor rendered the position of touch that was occurring within the touch sensing region in the form of a color change (white to green) in the corresponding location of the monitor. When two finger touches were made simultaneously to the glass surface, the computer monitor rendered the positions of touches that were occurring within the touch sensing region in the form of a color change (white to green) in the corresponding locations of the monitor. When three finger touches were made simultaneously to the glass surface, the computer monitor rendered the positions of touches that were occurring within the touch sensing region in the form of a color change (white to green) in the corresponding locations of the monitor.

Example 42

One embodiment of microreplicated electrodes comprises parallel conductors with a width of about 0.5 to about 5 microns (Y dimension in FIG. 5), separated by a distance of about 2 mm to about 5 mm center to center. Groups of adjacent conductors may be electrically interconnected to form electrodes of 1 mm to 10 mm total width, for example, using the process described with respect to FIG. 8 and FIG. 9.

The traces were made by forming rectangular microreplicated grooves 10 um wide (X dimension in FIG. 5), 20 um deep (Z dimension in FIG. 5), spaced 4 mm apart on a transparent substrate of PET using methods described herein and by reference. The parallel array of grooves was 100 mm wide. Grooves were printed in the PET web direction so their length was the length of the web, (>20 meters).

Grooves were filled with a seed ink manufactured by Conductive Inkjet Technologies, (CIT). A thin layer of ink was smoothed over the grooves then excess was removed with a doctor blade in a process similar to silk screening. The seed ink was then cured using UV light. The substrate with ink-filled grooves was then electroless plated with copper. The resulting microconductors were each approximately 9.6 um wide. The ink filling, UV curing, and electroless plating process was performed by CIT. Microconductors with substrates with grooves <10 um wide, 20 um deep, spaced 2 mm were also made using the process described.

Electrode Designs that Utilize Micro-Wire Conductors

Turning now to FIGS. 29-36, a number of different micro-wire electrode embodiments are described. The micro-wire printing techniques described above afford a great deal of design flexibility to individual electrode patterns. Such design flexibility can enhance performance characteristics. For example, as further described in U.S. Patent Application Publication No. US2010/026,664, "Touch Sensitive Devices with Composite Electrodes", it is possible to tailor electrode design to improve a feature referred to as perviousness—that is, the tendency to allow passage of an electric field through an electrode, to capacitively couple with a pointing object, such as a finger. In some arrangements, an upper electrode that is pervious may better allow capacitive coupling between a pointing object (i.e., a finger) and a lower electrode positioned where the upper and lower electrodes cross over one another. This may allow for better signal-to-noise performance of the electrode. However, holes or gaps in an electrode may make them more visually noticeable to a user, which is generally not desirable. Embodiments shown below generally are structured on a reference mesh, and include areas of continuous and discontinuous micro-wire conductors, which may result in both improved electrical performance and consistent visual characteristics that render electrode patterning less noticeable.

FIG. 29 illustrates a portion of a sensor electrode according to a first embodiment of the present invention. The sensor electrode pattern of FIG. 29 could be employed, for instance, in place of the electrodes illustrated in FIG. 28. The sensor electrode of FIG. 29 is built from two coincident micropatterns of cells 810, including a first pattern comprised of a first reference mesh of discontinuous micro-wires with first characteristic average cell spacing (810a), and a second pattern adapted from the network of the first pattern, where the second pattern is coincident with the first pattern, and comprises a network of continuous micro-wire structures that form a single electrode 817 (810b). The electrode includes interior regions 815 of discontinuous micro-wires that follow a third pattern, which may be the same or similar to the first pattern or the second pattern. (In this FIG. 29, the first and second and third patterns are the same pattern modeled after the first lattice mesh—repeating squares 45 degrees off axis—but in other embodiments, the first, second, and third patterns may be the same or may be different). Interior regions 815 have dimensions substantially larger than the first characteristic average cell spacing.

The selection of the first, second, and third patterns, is designed to establish a uniform optical property throughout the active area of the sensing device. In one embodiment, the first second and third patterns are all based on the same pattern, that is, the first lattice mesh, as is seen in FIG. 29. The average cell spacing, along with the width of the patterned micro-wires that form the mesh, determines an average open area of the underlying mesh and an optical density which primarily affects overall sensor properties such as optical transmittance and reflectance. Whether particular local regions of the underlying mesh are conductive (second pattern) or not (first and third patterns) is determined by the patterning of small (and nearly invisible) breaks along the length of the micro-wires. The first pattern, that is, the underlying lattice mesh of FIG. 29, is built from an array of simple squares whose axes are oriented 45 degrees to the printed page. It will be understood that alternative designs may comprise the lattice mesh patterns seen in FIG. 29, including without limitation lattice mesh patterns using triangles, pyramids, trapezoids, parallelograms, hexagons, or other repeating shapes. In some embodiments the cells which make of the array may be polygons with straight sides; in other embodiments the boundaries of the arrayed cells may be curved, convex, or concave. The plurality of cells which make up the array need not be equal in area, although for purposes of optical density, the local average cell spacing is preferably kept uniform throughout the sensing device. In alternative embodiments the principle axes of any of the arrays may be disposed along any arbitrary angle. In some embodiments the first pattern lattice mesh need not be comprised of a regular repeating array of cells, but may be built instead from a random network of metal micro-wires, without any discernable principle axes. It may be preferable that the pseudo-random network of metal wires is still characterized by a local average cell spacing which can establish a uniform optical property. Even a random network of metal micro-wires can be rendered locally conductive or non-conductive by the patterning of the appropriate number of small breaks along the lengths of the wires.

Each of the three patterns is characterized by an average cell spacing. The characteristic cell spacing can vary between 10 microns and 1 millimeter, however for reasons of optical transmittance and pattern visibility the cell spacing in one embodiment is preferably in the range between 100 and 350 microns. The micro-wire conductors can be patterned with widths between 0.2 microns and 10 microns. In one embodiment, the micro-wire widths are less than 3 microns and preferably less than 2 microns.

The second pattern illustrated in FIG. 29, the electrically continuous pattern which comprises electrode 817, is in one embodiment coincident to the mesh of the first pattern. The design of the second pattern establishes the electrical function and circuitry of the electrodes for the touch sensor. The second pattern in FIG. 29 is designed as a continuously conductive electrode oriented vertically, which functions as one of a plurality of upper column electrodes in a sensor electrode array. The pattern shown in FIG. 29 is one of an upper electrode array, but could also be one of a lower electrode array. In alternative embodiments, a second pattern similar to the second pattern of FIG. 29 can form an electrode directed along any arbitrary angle.

The sensor electrode established by the second pattern of FIG. 29 includes interior regions 815 according to the third pattern. The interior regions comprise a mesh of discontinuous, or broken, micro-wires, in some embodiments quite similar to or the same as the first pattern. The interior region in one embodiment includes dimensions greater than 350 microns across in any direction. Within interior region formed by the third pattern, the underlying mesh of the first pattern includes breaks along the micro-wires to render the mesh within the gap non-conductive. The interior region is patterned in one embodiment to be coincident with the first pattern.

The interior regions 815 shown in second pattern of FIG. 29 represent just two of many more interior regions which can be arranged along the length of the sensor electrode 817. For instance one or more of these interior regions may be placed centered over cross-over points associated with lower electrodes, the interior regions having the same pitch as the lower electrode spacing. The presence of a non-conductive interior region or hole within the column electrode of FIG. 29 increases the capacitive difference signal detected by the sensor when a finger or any grounded object is placed near the intersection of one of the row and column electrodes. The presence of the interior region increases the perviousness of the column electrode to electric fields which emanate from the underlying row electrodes. In one embodiment, the interior region in the second pattern of the column electrode spans a distance equal to at least two mesh cells of the first or the second patterns. In a further embodiment, the interior region in the electrode defined by the third pattern should be at least twice as large as the average cell spacing (or mesh size) of the first pattern or the second pattern in any pattern direction. Commonly, an interior region without any patterned micropattern (that is, a bare hole) within a column electrode as large as 350 microns across would be big enough to be noticeable to the human eye. However, in FIG. 29 the interior region is filled with a continuation of the mesh of the first or second pattern (which as mentioned in the embodiment shown in FIG. 29 are the same), to achieve a uniform optical density which renders the interior region virtually invisible to the human eye. In other words, the first pattern may be thought to establish a reference mesh, and the second and third patterns are coincident to this reference mesh. In this fashion interior regions in the electrodes as large as 1 to 5 mm across can be designed into the sensor electrodes with reduced risk of pattern visibility.

The width "A" of the sensor electrode established by the second pattern of FIG. 29 in some embodiments can be in the range of 200 microns to 10 millimeters.

Figure 30A:
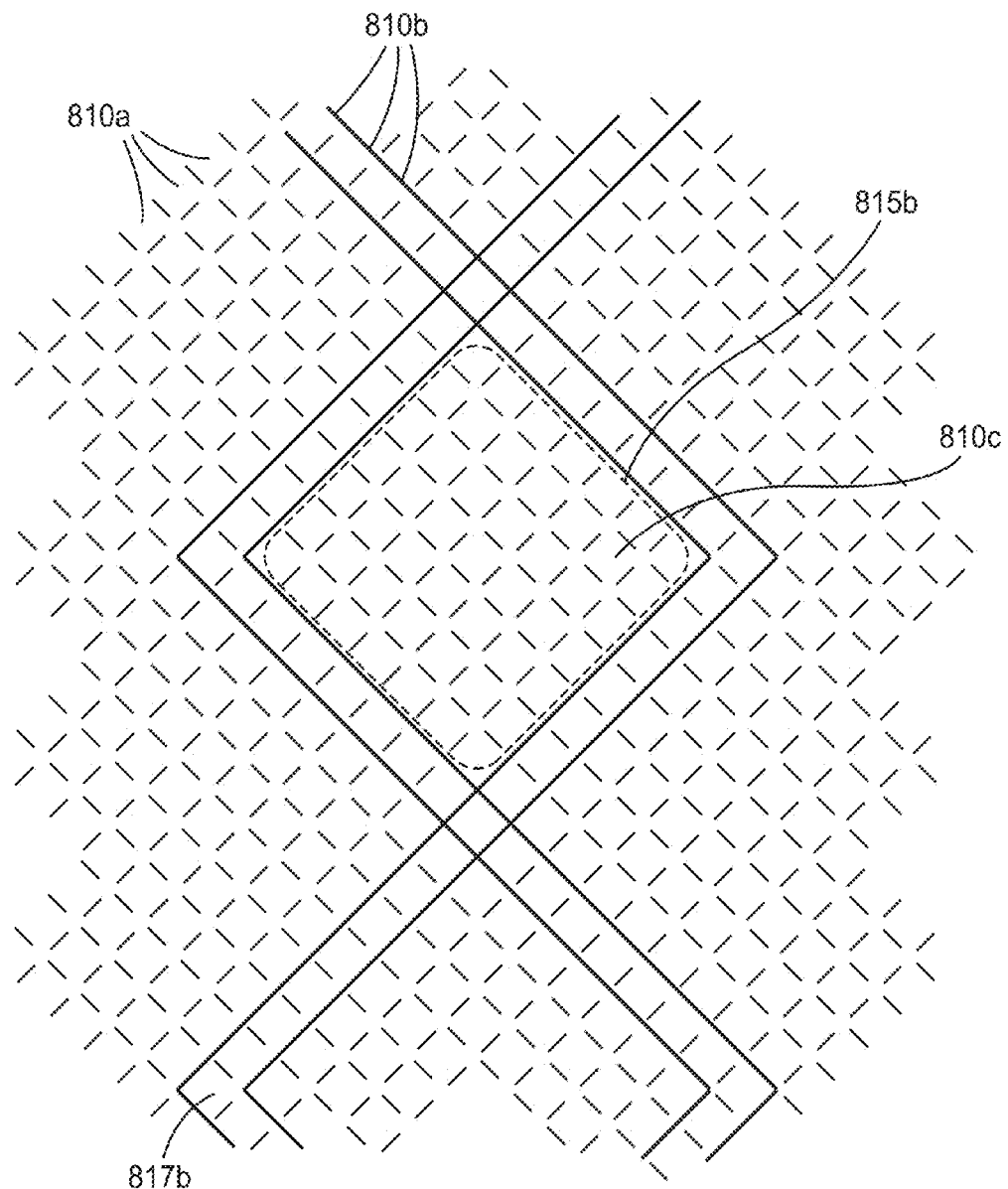

FIG. 30a, illustrates a portion of a sensor electrode according to a second embodiment. The sensor electrode pattern of FIG. 30a could be employed in place of the vertical electrodes illustrated in FIG. 28. The sensor electrode of FIG. 30a is built from coincident micropatterns, including a first pattern comprised of a first mesh with first characteristic average cell spacing, and a second pattern adapted from the network of the first pattern, where the second pattern comprises a conductive electrode 817B, and a third pattern that comprises interior regions 815B in the electrode 817B, the interior regions having interior dimensions substantially larger than the first characteristic average cell spacing. The first micropattern illustrated in FIG. 30a is the same as the underlying mesh pattern employed in FIG. 29. Any of the alternative mesh patterns described with respect to FIG. 29 can be usefully substituted, including regular hexagonal mesh patterns or random networks of metal micro-wires.

The second pattern in FIG. 30a, which establishes the functional geometry of an upper sensor electrode, is built by rendering conductive a continuous chain of underlying mesh cells to create an electrode which is locally only as wide as a single average cell from the first pattern. The complete sensor electrode in FIG. 30a, however, consists of an intertwined ladder or trellis structure of conductive chains which are all built from the cells of the underlying first pattern. In between the rungs of the ladder or between the vines of the trellis of the second pattern, the underlying mesh of the first pattern is rendered non-conductive by means of small breaks in the micro-wires, to form interior regions 815B. In the embodiment shown in FIG. 30a, the third pattern that comprises the interior regions is the same as the first and second patterns. In other embodiments, they may be different. In the particular example of FIG. 30a, the conductive cells of the second pattern are laid-out as a connected array or super-structure of larger diamonds, the pattern extending continuously along the vertical axis of the figure. The distance between conductive chains on opposite sides of the diamond is exactly 7 cells from the underlying mesh structure. In a similar fashion to FIG. 29, therefore, the electrode pattern of FIG. 30 includes a series of non-conductive interior regions by the conductive traces of the second pattern. These large non-conductive regions increase the perviousness of the sensor electrode illustrated in FIG. 30a; the gaps increase the capacitive difference signal detected by the sensor when a grounded object (such as a finger) is placed near the intersection of a row and column electrodes.

The width of the sensor electrode at its widest point established by the second pattern of FIG. 30a in one embodiment is in the range of 200 microns to 10 millimeters.

In FIG. 30a the conductive traces which are used to build the larger diamond super-structure are only as wide as a single cell from the underlying mesh structure, or reference mesh. In alternative embodiments the conductive traces could be as wide as 2, 3, 4 or more cells in width. Additionally, the conductive traces of the super-structure need not be uniform in width along their length. The conductive chains of a second pattern similar to FIG. 30a might be comprised of sections whose width incorporates alternately 1, 2, or 3 cells from the underlying mesh. In an alternate embodiment, if the first micropattern is built from a random network of metal micro-wires, then the width of the conductive sections in the super-structure might be characterized by any average fractional number larger than the characteristic average cell spacing. For instance the effective width of a conductive trace might be 1.1 times the average cell spacing, or 1.6 times, or 2.3 times the average cell spacing.

In FIG. 30a, the micro-wires that form the mesh lattice within the conductive traces of the second pattern super-structure are shown as broken traces. The conductive traces, therefore, have an anisotropic conductive aspect wherein the conductivity in a direction orthogonal to the direction of the conductive traces in the second pattern is very low compared to the conductivity along the length of the conductive trace. In an alternative embodiment, however, all of the micro-wires within the conductive traces can be patterned without breaks, so that the conductivity of the second pattern is maximized and anisotropic.

Figure 30B:
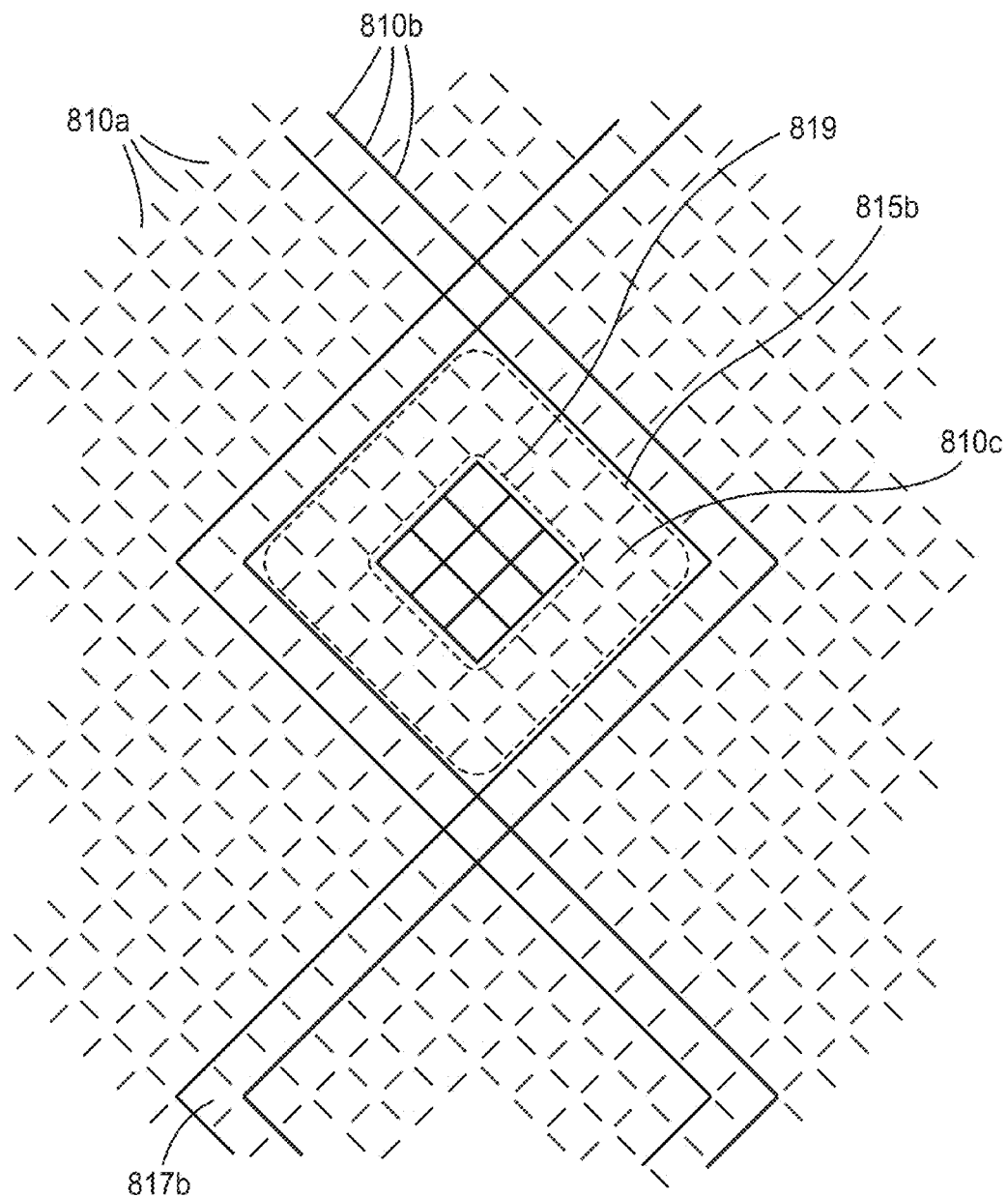

Turning now to FIG. 30b, an electrode configuration similar to that shown with respect to FIG. 30a is shown, but in this case additionally including island 819 which is electrically isolated from electrode 817b, and within the electrically discontinuous interior region 815b. Island 819 is formed of electrically continuous micro-wires according to, and coincident with, the underlying mesh pattern that in this embodiment forms pattern 1, pattern 2, and pattern 3. FIG. 30c shows a further embodiment of a possible electrode configuration.

Figure 31A:
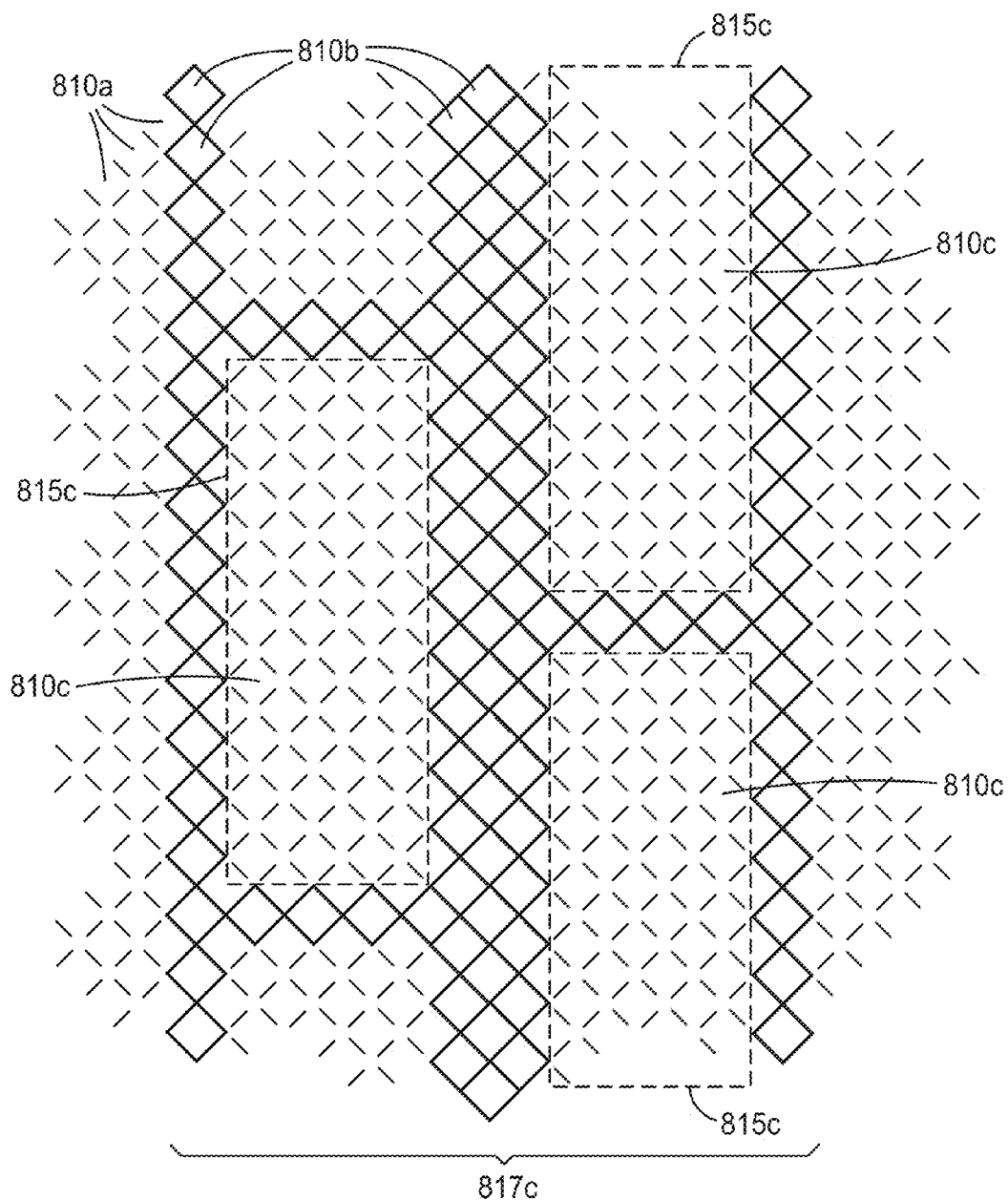

FIG. 31a illustrates a further embodiment of an electrode. The sensor electrode of FIG. 31a is built from coincident micropatterns, including a first pattern comprised of a first mesh with first characteristic average cell spacing, and a second pattern adapted from the network of the first pattern, where the second pattern comprises a conductive electrode 817C, and a third pattern that comprises interior regions 815C in the electrode 817C, the interior regions having interior dimensions substantially larger than the first characteristic average cell spacing. The first micropattern illustrated in FIG. 31a utilizes the same underlying mesh pattern as shown with respect to FIG. 29. Any of the alternative mesh patterns described with respect to FIG. 29 can be usefully substituted, including regular hexagonal mesh patterns or random networks of metal micro-wires. The second pattern of FIG. 31a, which establishes the functional form of the conductive electrode, comprises electrically continuous, or unbroken, conductive cells from the underlying mesh. The conductive traces of the second pattern in FIG. 31a that form electrode 817C are laid-out as a trellis-type structure. In some parts of the trellis structure the conductive traces are the width of 2 cells from the underlying mesh structure, or reference mesh, in other parts of the trellis the conductive traces are only 1 cell wide. The interior regions formed between the conductive traces are 4 cells wide in the horizontal direction and 9 cells tall in the vertical direction. The optical density of the underlying first pattern is kept constant at all positions throughout the sensor, and as a result the particular geometry of the trellis (the conductive super-structure) in FIG. 31a will be virtually unnoticeable to the human eye.

The width of the sensor electrode 817C established by the second pattern of FIG. 31a in some embodiments are in the range of 200 microns to 10 millimeters.

Figure 31B:
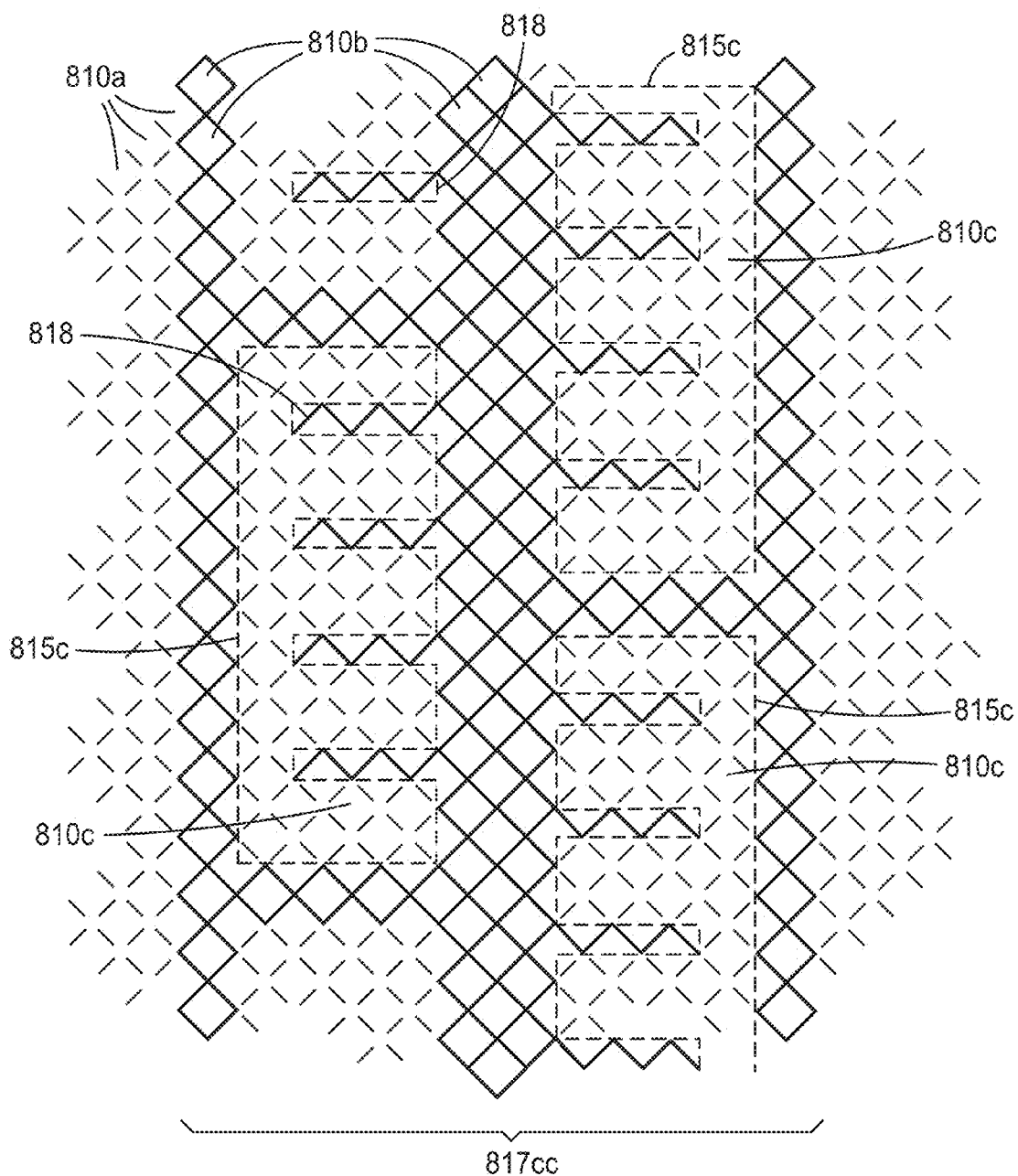

FIG. 31b shows a variation on the electrode configuration shown with respect to FIG. 31a. Electrode 817cc includes branching elements 818 electrically connected to electrode 817cc, extending outward therefrom. In the embodiment shown with respect to FIG. 31a, the branching elements extend into the interior regions. The branching elements are coincident with the third pattern (which is the pattern associated with the interior region). The pattern of the branching elements is also coincident with the reference mesh of the first pattern. The branching elements are comprised of continuous micro-wires.

The distance between any two branching elements is equal to or greater than the average characteristic cell spacing of the underlying mesh. The branching elements 818 shown with respect to electrode 817cc are separated by a distance equal to two characteristic cell spacings within the third-pattern mesh of the interior region 815c. In alternate embodiments a greater or lesser density of branching elements can be provided within interior regions, by increasing or decreasing the separation between branching elements, generally by integer multiples of the underlying reference spacing. In this fashion the quality of perviousness to electric fields associated with these interior regions can be tuned to fit a particular application.

Continuous micro-wire conductors used in electrode 817cc have a characteristic average width, and the width of the branching elements is the same; i.e., the branching elements may have the geometry of the electrically continuous micro-wire conductors that comprise the trunk portion of electrode 817cc.

Figure 31C:
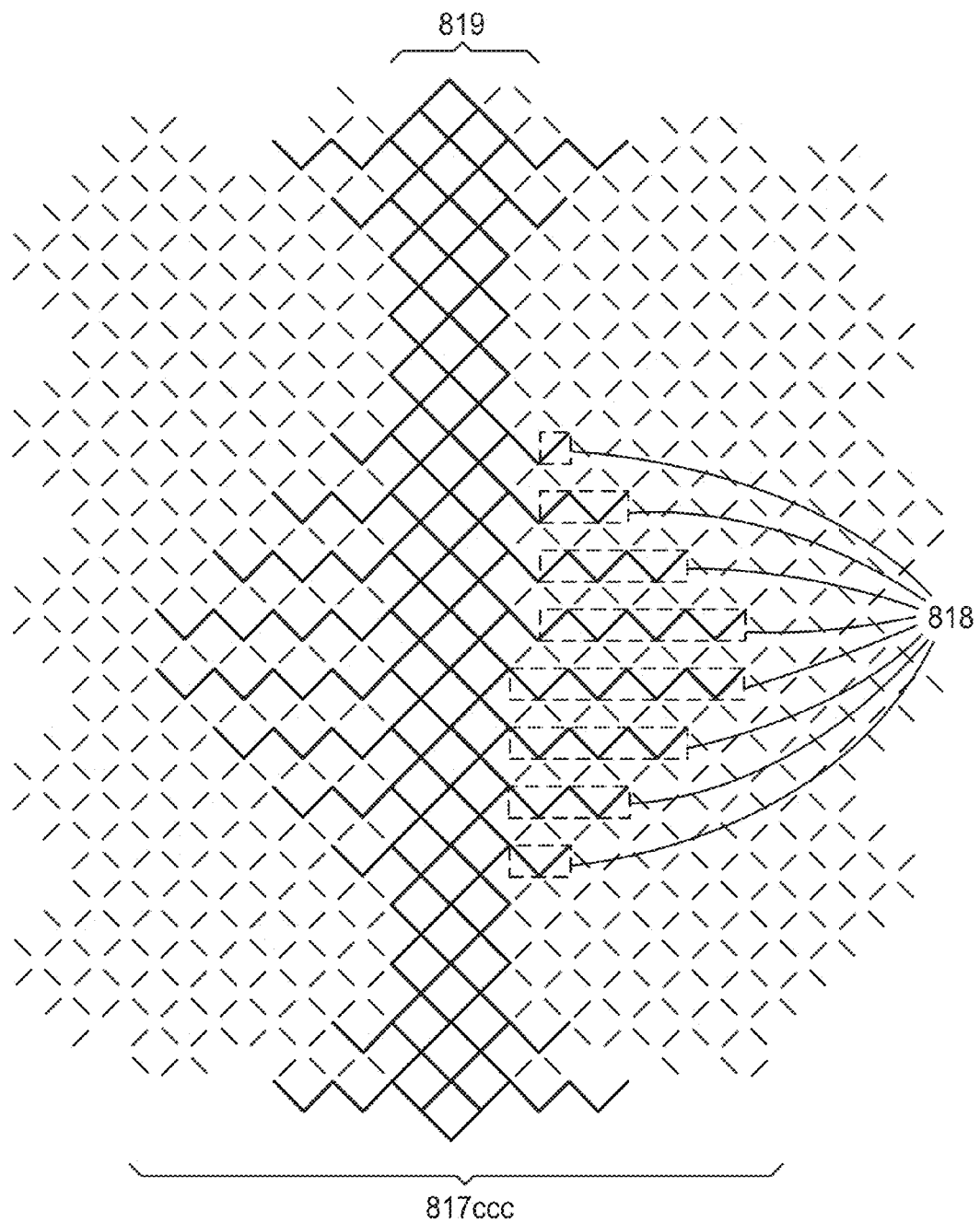

FIG. 31c shows yet a further variation on the electrode configuration shown with respect to FIGS. 31a and 31b. Electrode 817ccc does not include interior regions shown with respect to FIGS. 31a and 31b. Electrode 817ccc has a main electrode trunk 819, and extending outward from the trunk are branching elements 818, each formed of continuous micro-wires coincident with the underlying reference mesh. The branching elements extend outward into the surrounding area of the first pattern, which comprises electrically discontinuous, or broken, micro-wires also coincident with the underlying reference mesh pattern. Each cell of the underlying reference mesh has characteristic average cell spacing, and the distance between branching elements is at least one cell. In the embodiment shown, each branching elements couples to the electrode trunk at no more than one terminal area. The main trunk of electrode 817ccc is disposed along a first direction and the branching elements extend outward along a direction which is substantially transverse to the first direction.

The length of the branching elements 818 are greater than the characteristic average cell spacing of the reference mesh. In some embodiments the branching elements can be more than 5 times longer than the characteristic average cell spacing and in other embodiments the branching elements can be more than 10 times longer than the characteristic average cell spacing. The branching elements 818, which are attached to the electrode 817ccc in FIG. 31c, include a plurality of different lengths. In some embodiments, the lengths are chosen to conform to a preferred outline or shape for the conductive electrode. For instance, the branching elements of electrode 817ccc, taken together, conform to a diamond shape that is centered on the central trunk.

The capacitance sensitivity of the electrode 817ccc, and its perviousness as a function of position, can be tuned by means of designed variations in the length and in the spacing between branching elements 818. For instance, the branching elements of electrode 817ccc are spaced apart by one cell spacing of the underlying reference mesh. In an alternate embodiment the branching elements can be spaced apart by distances of two or three cell spacings.

As illustrated in FIGS. 27 and 28, a touch sensor commonly employs a plurality of electrodes disposed parallel to each other. The capacitive touch response of the sensor, however, is not always uniform with respect to a small object which is passed across and in-between the parallel touch electrodes. Branching elements 818, similar to those illustrated in FIG. 31c, can be used to fill the space between parallel electrodes and smooth out the sensor response. By employing micro-wire branching elements, which extend outward from and are disposed between the parallel touch electrodes, the sensor response of each electrode can be improved while adding relatively little to the total background capacitance. In some embodiments the micro-wire branching elements from neighboring electrodes can be interleaved or intermingled in the spaces between touch electrodes. This intermingling of touch electrodes ensures that a touch response can be recorded simultaneously from each of two neighboring electrodes regardless of the small size of a touch object. Since touch position is often calculated as an interpolation of capacitance signals from neighboring electrodes, the ability to provide an intermingling of branching elements between parallel electrodes improves the accuracy of reports from the touch sensor.

Figure 32:
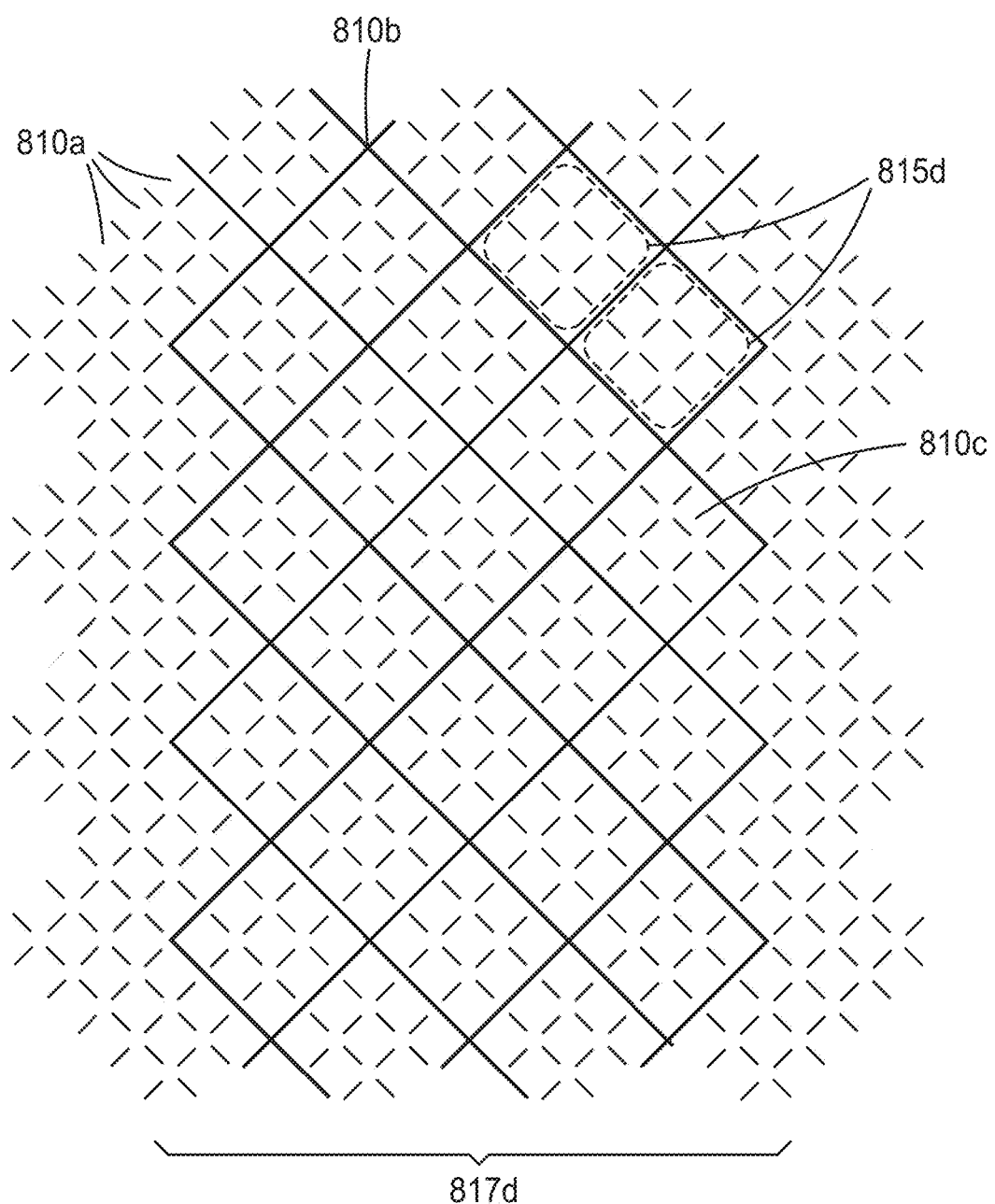

FIG. 32 illustrates a further electrode embodiment. The sensor electrode of FIG. 32 is built from coincident micropatterns, including a first underlying reference mesh pattern comprised of cells with a characteristic average cell spacing, and a second pattern adapted from the network of the first pattern, where the second pattern comprises a conductive electrode 817c, and a third pattern that comprises interior regions 815d in the electrode 817d. The second pattern, as compared with the first pattern, has larger characteristic cell spacing. The second pattern includes an array of super-cells, where each of the super-cells comprises an integer multiple of cells from the first pattern (nine first-pattern cells are included in the super-cell for shown in FIG. 32). The characteristic cell spacing of the second pattern is an integer multiple (greater than or equal to 2) of the first characteristic cell spacing (the multiple is 3 in FIG. 32). The micro-wires that define the electrode 817*d* are all patterned without breaks and are continuously conductive. The interior regions of the electrode 817*d* are patterned according to the third pattern (which in this embodiment is the same as the first pattern) and rendered non-conductive by means of breaks along the length of the micro-wires, rendering the interior regions electrically isolated regions.

The sensor electrode 817*d* of FIG. 32 is established by an array of super-cells in the second pattern. The second pattern super-cell array of FIG. 32 establishes electrode 817*d* which is continuously conductive along the vertical axis and could be employed, for instance, as one of the column electrodes illustrated in FIG. 28. The second pattern in FIG. 32 has a width which is established by an alternation between two and three of the super-cells. The effective electrode width in FIG. 32 can be anywhere in the range of 200 microns to 10 millimeters.

Any of the alternative mesh patterns described with respect to FIG. 29 can be implemented in a coincident lattice structure as shown in FIG. 32. For instance the second conductive pattern could be comprised of hexagonal cells which could be 900 microns across while the first pattern is comprised of hexagonal cells 300 microns across. In an embodiment where the mesh of the first pattern is formed from a pseudo-random network of micro-wires, the second pattern can also be designed as a random network of micro-wires. In this pseudo-random embodiment it is possible for the second characteristic cell spacing to be any distance greater than the first characteristic cell spacing. However, in order to achieve a useful increase in perviousness, it is preferred that the second characteristic cell spacing be at least twice the first characteristic cell spacing.

When compared to the simply-connected electrode geometry illustrated in FIGS. 27 and 28, the inclusion of interior regions for the upper electrode in FIG. 32 (and the corresponding interior regions described with respect to other embodiments discussed herein) may present several advantages. The perviousness of the electrode structure of FIG. 32 is considerably enhanced. For instance, while the underlying mesh in both electrodes may be comprised of cells with a characteristic spacing of 200 microns (a spacing which determines the pervasive optical density of the pattern), the super-structure conductive mesh in FIG. 32 (the second pattern that forms electrode 17D) can have a much larger characteristic cell spacing of 800, 1000, or 1200 microns. The interior regions in-between the conductive traces of the second pattern allow for the penetration of electric fields from the underlying bottom electrode. Proportionally, a larger fraction of the electric field which couples the top and bottom electrodes becomes a fringing field which extends above the sensor where it can usefully interact with a nearby finger or conductive object. The proportion or usefulness of these fringing fields may depend on the ratio of the spacing in the conductive second pattern in FIG. 32 to either a) the thickness of the dielectric that separates the upper and lower electrodes; or b) the thickness of the covering dielectric that separates the upper electrode from a finger placed upon the sensor. In one embodiment, it may be preferable if the cell spacing of the conductive second pattern be at least ¼ of either or both of the thicknesses defined above, and more preferable if the cell spacing is at least ½ of either or both of those thicknesses. Since the super-structure conductive mesh, in the second pattern of FIG. 32, allows for cell spacing which is greater than 350 microns, and in some embodiments greater than 600 microns, the superstructure mesh allows for pervious sensor designs with covering dielectrics thicker than 1 millimeter and in some embodiments thicker than 2 millimeters.

The embodiments described herein, which include patterned interior regions of the electrode that are electrically isolated from the electrode, make possible electrode structures where the conductive traces of the second pattern cover less than 1 percent of the surface area of the electrode, and in many cases less than 0.5% of the surface area. These small percentages are characteristic of improved perviousness.

Embodiments described herein may present another advantage for the performance of projected capacitance sensors. The capacitive difference signal detected by the sensor in the presence of a finger increases with the perviousness of the sensor electrode, and at the same time the absolute capacitive coupling between the finger and the sensor electrode decreases in comparison to a less pervious electrode. Since noise signals, which can disrupt the sensing function, tend to scale with the capacitance between sensor electrode and finger, the pervious nature (or the small relative surface area covered by the metal traces) of the conductive super-structure in FIG. 32 improves the sensing signal while at the same time reducing the noise susceptibility of the sensor.

Figure 33:
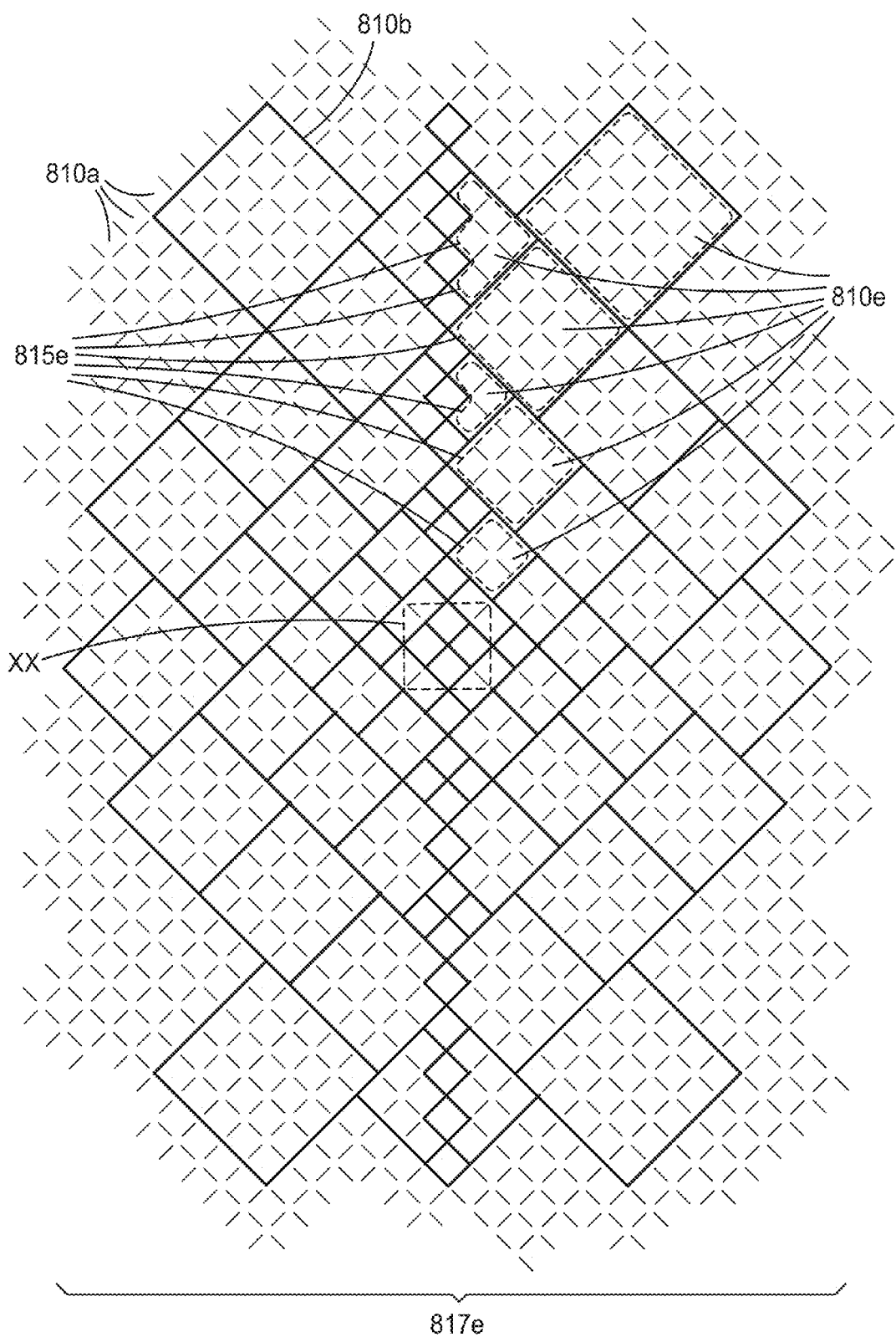

FIG. 33 illustrates a further embodiment. The sensor electrode of FIG. 33 is built from coincident micropatterns, including a first pattern comprised of a first mesh with first characteristic average cell spacing, and a second pattern adapted from the network of the first pattern, where the second pattern comprises a conductive electrode 817*e*, and a third pattern that comprises interior regions 810*e* in the electrode 817*e*, the interior regions having a variety of different sizes and shapes. The micro-wires that define the electrode 817*e* are patterned without breaks and are continuously conductive. The cells of the third pattern which comprise the interior regions of electrode 810*e* are rendered electrically isolated from electrode 817*e* by means of breaks along the length of the micro-wires.

The third pattern, that is, the interior regions 815*e* of electrode 817*e* by contrast to those shown with respect to the electrode configuration shown in FIG. 32, are not uniform. Near the left and right edges of the electrode shown in FIG. 33, the interior regions are four times larger than the cells of the underlying mesh pattern (the first pattern). Near the center axis of electrode 817*e*, the cells of interior regions 815*e* are only twice that of the first pattern.

The second pattern, which comprises the conductive electrode, is characterized by a cell spacing which is not uniform. The conductive electrode illustrated in FIG. 32 was characterized as a super-cell with a fixed and characteristic cell spacing, while by contrast the super-structure cell spacing in electrode 817*e* varies as a function of position. The cell spacing of the continuous mesh located along the left and right edges of electrode 817*e* is larger than the cell spacing found along the central axis.

The mesh cells that comprise the conductive second pattern in FIG. 33 are generally isotropic, meaning that the cell dimensions are nearly equal in two orthogonal directions and an integer multiple (greater than or equal to 2) of the cell dimensions from the underlying mesh.

Any of the alternative mesh patterns described with respect to FIG. 29 can be employed in a coincident lattice structure as shown in FIG. 33. For instance the second conductive pattern could be comprised of hexagonal cells whose dimensions are a multiple of two or greater than the dimensions of the hexagonal cells from the first pattern. In an embodiment where the mesh of the first pattern is formed from a pseudo-random network of micro-wires, the conductive second pattern and the electrically isolated interior regions thereof can also be designed as a pseudo-random network of micro-wires. In this pseudo-random embodiment the average distance between wires in the conductive second pattern may be at least twice the average characteristic cell spacing of the underlying first pattern.

Along the center axis of electrode 817e in FIG. 33, a conductive trace, or trunk, similar to that of the embodiment shown in FIG. 31a, b, and c, has been designed. This conductive trunk is comprised of a chain of connected and conductive mesh cells where the central trunk is only as wide as a single cell from the underlying first pattern or reference mesh structure.

In one electrical design of a touch sensor, the capacitive difference signal of the touch sensor is proportional to the absolute capacitance between the finger and the sensor electrode. For an electrode such as those illustrated in FIGS. 32 and 33, the capacitance between the finger and sensor electrode will increase with the number and density of conductive micro-wires in the second pattern. The design of electrode 817e may allow for a variation in capacitance between sensor and object (that is, a finger) as a function of its position along the sensor electrode. An apparent localized center point of the sensor electrode is located at the XX position. The density of the second pattern conductive mesh falls off (or the cell spacing increases) as the object moves away from a vertical line through the XX position to either the left or the right, and the density of the second pattern mesh falls off as one moves away from a horizontal line through the XX position towards either the top or the bottom of the sensor electrode. The density of the superstructure mesh falls off approximately isotropically and radially as a finger is moved away from the center point XX. As a result, the second pattern conductive mesh of FIG. 33 allows for variation in the capacitive difference signal as a function of local distance from the XX center point of the sensor. This designed variation in sensor response enables the sensor to detect and interpret finger position with much better accuracy when compared to a sensor that does not include a similar distribution or variety of interior regions within the electrode structure.

In the particular embodiment shown with respect to FIG. 33, the cell spacing of the second pattern that comprises electrode 817e varies depending on position between 400 and 1000 microns. The density of the second pattern conductive mesh and the local capacitance vary significantly between points on the sensor that are separated by less than 1 mm. The structure is also compatible with a pitch between neighboring sensor electrodes of 5 to 7 millimeters. Such a structure, with a variation of interior regions, may accommodate position detection of small fingers and position detection of styli with diameters as small as 1 mm, even when these objects which are substantially smaller than the pitch between sensor electrodes.

It will be understood that FIG. 33, and other similar illustrations of electrode designs, illustrates only a portion of a longer sensing electrode. The overall mesh pattern shown in FIG. 33 can be repeated at intervals along the whole length of a vertical or column electrode, according to the pitch of the electrodes of the other electrode array, where the electrode is one of a plurality of upper column electrodes in a sensor array. The localized center-point XX of the electrode 817e pattern is coincident with the center-point of the intersection of a row and a column electrode. Since the electrode 817e pattern repeats along the length of each upper electrode, a plurality of localized center points XX will be found at the intersection of each of the row and column electrodes.

The pitch of the sensor electrode center points XX established by the second pattern of FIG. 33 can be in the range of 200 microns to 10 millimeters. The maximum horizontal width or extent of the upper or column electrode can be any width which is a fraction of the pitch, for instance the electrode width may vary between 20% of the pitch to 98% of the pitch. The width of the intersecting row electrode can be any width which is a fraction of the pitch, for instance the width may vary between 30% of the pitch to 98% of the pitch. Preferably the width of the lower or row electrode would be between 70% and 98% of the pitch.

Figure 34:
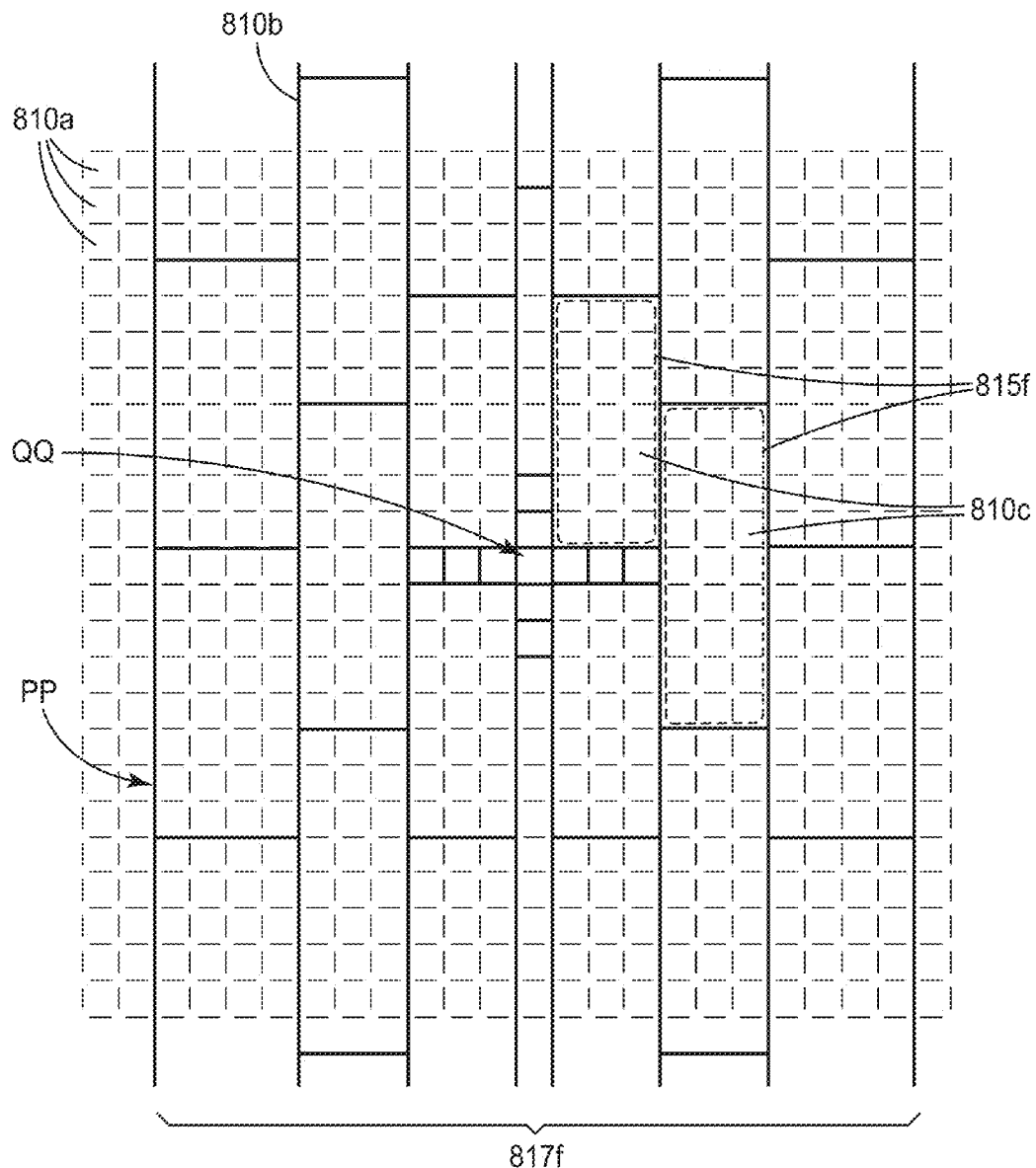

FIG. 34 illustrates a further embodiment of an electrode configuration. The sensor electrode of FIG. 34 is built from coincident micropatterns, including a first pattern comprised of a first mesh with first characteristic average cell spacing, and a second pattern adapted from the network of the first pattern, where the second pattern comprises conductive electrode 817f, and a third pattern that comprises interior regions 815f in electrode 817f, the interior regions having a variety of different sizes and shapes. The micro-wires that define the cells of the second pattern are all provided without breaks and are continuously conductive. The interior regions 815f of electrode 817f are rendered electrically discontinuous and isolated from electrode 817f and non-conductive by means of breaks in the pattern along the length of the micro-wires.

The cell spacings of the second pattern in the electrode shown with respect to FIG. 34 vary with position along the sensor in a manner which is similar to the electrode shown with respect to FIG. 33, except that the cell-size variations in FIG. 33 are not as isotropic as those shown in FIG. 34. Near the left and right edges of FIG. 34 the cells of the conductive second pattern are 4 times larger than the cells of the underlying mesh pattern. Near the vertical center line of FIG. 34, the cells of the second pattern are only three times that of the first pattern. The cells that comprise the superstructure second pattern in FIG. 34 are rectangular. For instance the superstructure cell marked "PP" has a width along the horizontal of four times the cell dimension of the underlying mesh and a height along the vertical of eight times the cell dimension of the underlying mesh.

Any of the alternative mesh patterns described with respect to FIG. 29 can be employed in a coincident lattice structure as shown in FIG. 34. An approximately rectangular super-structure cell can still be formed by bounding a collection of underlying hexagonal cells that are approximately four hexagonal cell widths wide and eight hexagonal cell widths tall. In an embodiment where the mesh of the first pattern is formed from a pseudo-random network of micro-wires, the conductive second pattern can also be designed as a pseudo-random network of micro-wires. In this random embodiment the average distance between wires in the conductive second pattern do not need to be equal along two orthogonal directions.

Along the center line of FIG. 34, a conductive trunk in the second pattern, similar to those employed in the embodiments described earlier is shown. This conductive trunk is comprised of the outlines of single-wide and neighboring mesh cells along the vertical axis. The lateral micro-wires that comprise the interior regions according to the third pattern of this central column of conductive cells are maintained as broken traces.

For the super-structure conductive mesh of FIG. 34 a variation in capacitance has been provided as a function of position along the sensor electrode. An apparent localized center point of the sensor electrode is located at the QQ position. The density of the super-structure conductive mesh falls off as a pointing object moves horizontally away from a vertical line through the QQ position to either the left or the right. As the finger moves vertically away from a horizontal line through QQ, however, the density of the super-structure mesh changes very little. The density of the superstructure mesh therefore does not have an isotropic variation with distance from the center-point QQ. Instead the super-structure shown in the electrode of FIG. 34 is designed to present a density variation which has mirror symmetry about the vertical centerline.

Figure 35:
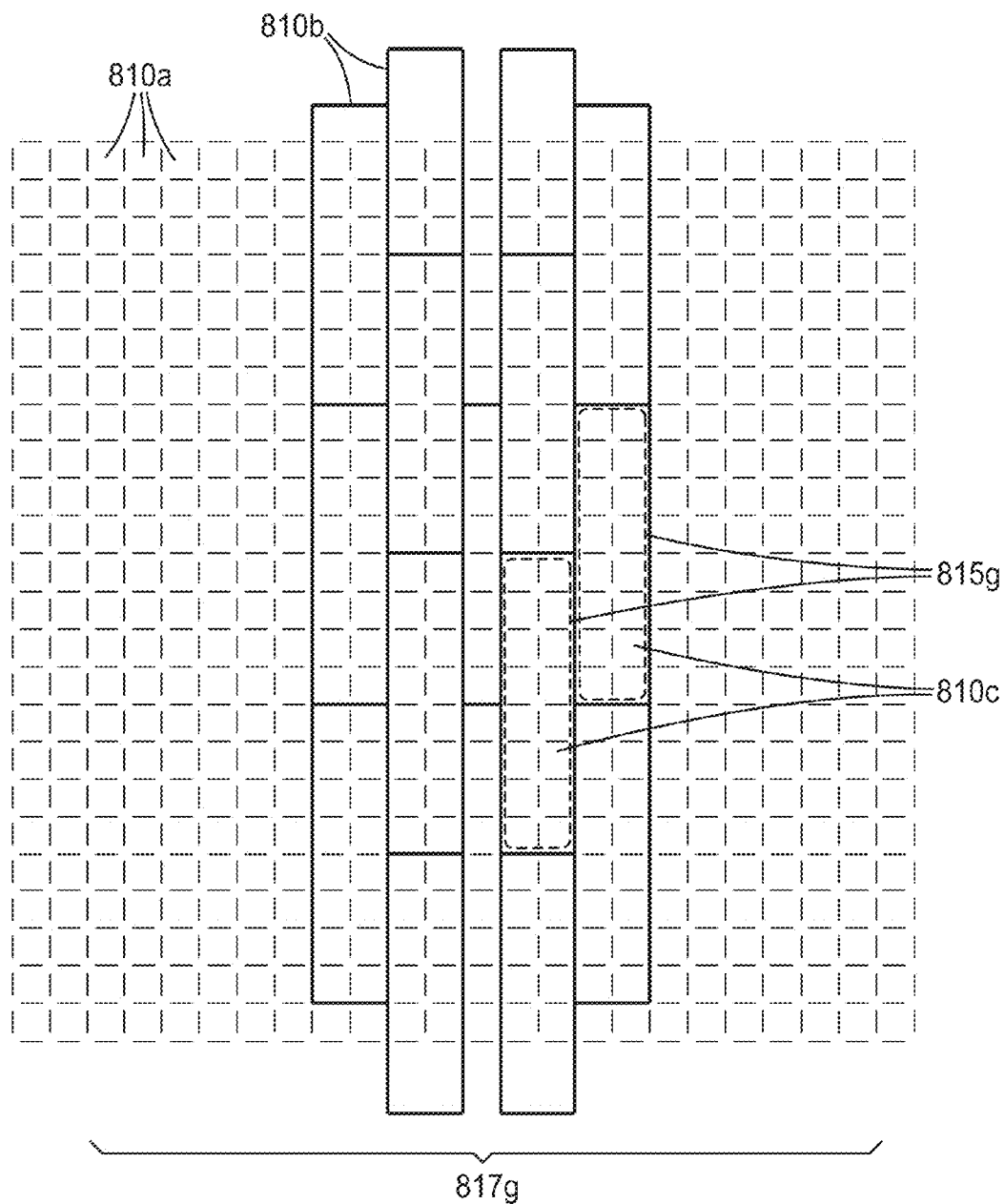

FIG. 35 illustrates a further embodiment of an electrode configuration. The sensor electrode of FIG. 35 is built from two coincident micropatterns, including a first pattern comprised of a first mesh with first characteristic average cell spacing, and a second pattern adapted from the network of the first pattern, where the second pattern comprises a second super-structure mesh with a variety of larger cell spacings. The micro-wires that define the boundaries of the second mesh are all patterned without breaks and are continuously conductive. The cells of the first pattern which lie within the gaps of the second pattern are rendered non-conductive by means of breaks along the length of the micro-wires.

The super-structure of FIG. 35 is similar to that of FIG. 34, except that the overall width or extent of the electrode pattern is FIG. 35 is more narrow than that shown in FIG. 34, and the variations in cell spacing in the super-structure are much less pronounced. The super-structure cells that comprise the conductive second pattern are rectangular and the density variation presents a mirror symmetry about the vertical trunk or centerline.

If one measures across the width of the sensor electrode in FIG. 35 one will note that the super-structure pattern is comprised of six vertical conducting lines, while the pattern in FIG. 34 is comprised of eight vertical conducting lines. As a result, the electrode pattern in FIG. 35 will have a smaller total capacitance between the upper electrode and the finger. In some applications this reduced capacitance to the finger can result in an improved signal-to-noise ratio for the output of the capacitive sensor. The pattern shown in FIG. 34, however, may present an advantage to the sensor manufacturer since an electrode with eight vertical lines along each column presents more redundant paths for the flow of current and may thereby be manufactured with a lower probability of disabling defects due to broken or in-correctly patterned conductive traces.

Because of the larger super-structure cell spacings in the conductive mesh of the electrodes shown with respect to FIGS. 34 and 35, however, the total capacitance to the finger in the sensor patterns of FIGS. 34 and 35 is considerably less than what would be achieved if the sensor pattern was built from eight vertically-running near-neighbor cells of the underlying mesh. As a result, electrodes shown in FIGS. 34 and 35 present a greater amount of perviousness and a lower capacitance to the finger than a simply-connected mesh-based electrode structure with similar width.

In a variation of the embodiment shown in FIG. 35, a lateral trellis or extension of conductive cells (the second pattern) can be added which protrudes to the left and right from the vertical traces along the horizontal centerline of each row and column intersection. This lateral extension of the electrode pattern will add somewhat to the total capacitance between the upper electrode and the finger, but it can also provide for a variation in the capacitive difference signal as the finger moves up and down along the length of the sensor electrode. A lateral extension of the conductive cells can therefore improve the accuracy of position reporting while adding relatively little to the overall capacitance between the sensor electrode and the finger.

Though embodiments with respect to FIGS. 29-35 have been primarily described in the context of upper electrodes, similar designs and patterning could be used for lower electrodes. In other words, a lower electrode could include interior regions, electrically isolated from the lower electrode, but including patterned microconductors with breaks or branch elements.

Figure 36:
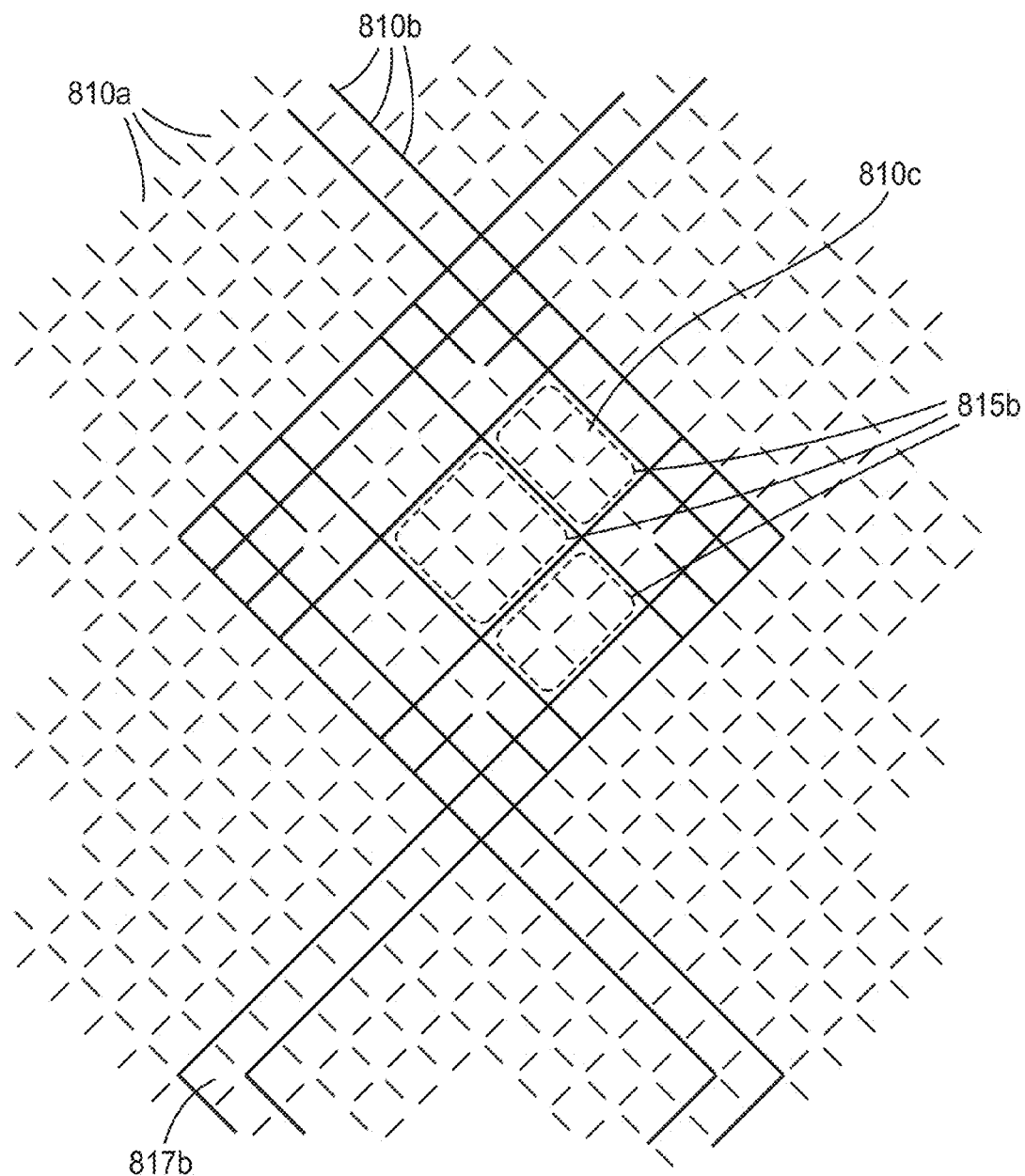

FIG. 36 illustrates a further embodiment of an electrode configuration. The sensor electrode of FIG. 36 is built from coincident micropatterns, including a first pattern comprised of a first mesh with first characteristic average cell spacing, and a second pattern adapted from the network of the first pattern, where the second pattern comprises the conductive electrode, and a third pattern that comprises interior regions 815$b$ in the electrode, the interior regions having a variety of different sizes and shapes. The interior regions 815$b$ of the electrode are rendered electrically discontinuous and isolated from the electrode and non-conductive by means of breaks along the length of the micro-wires.

The cell spacings of the second pattern shown with respect to FIG. 36 vary with position within the electrode. In contrast to the electrodes of FIGS. 33-35, however, the superstructure cells in the embodiment shown in FIG. 36 are larger in the center of the electrode as compared to the edge. Near the center of the diamond pattern in FIG. 36 the super-structure cells of the conductive second pattern are 3 times larger than the cells of the underlying reference mesh. Near the outer corners of the diamond, however, the cell size is smaller.

The electrode shown in FIG. 36 includes interior regions 815$b$. The size of the interior regions varies as a function of position within the electrode. The interior regions in the center of the diamond are larger than those found near the outer edges.

The electrode shown in FIG. 36 allows for a design with capacitance variations between the sensor and an object (i.e. a finger) as a function of the object's position along the sensor electrode. The density of the second-pattern conductive mesh in increases (and the cell spacing decreases) as the object moves from the center of the diamond out towards the edges. The density of the superstructure mesh increases approximately isotropically and radially as a finger is moved away from the center point. This designed variation perviousness or cell spacing may in some embodiments allow for a more gradual variation in sensor response as the finger is moved across the electrode.

Figure 37:
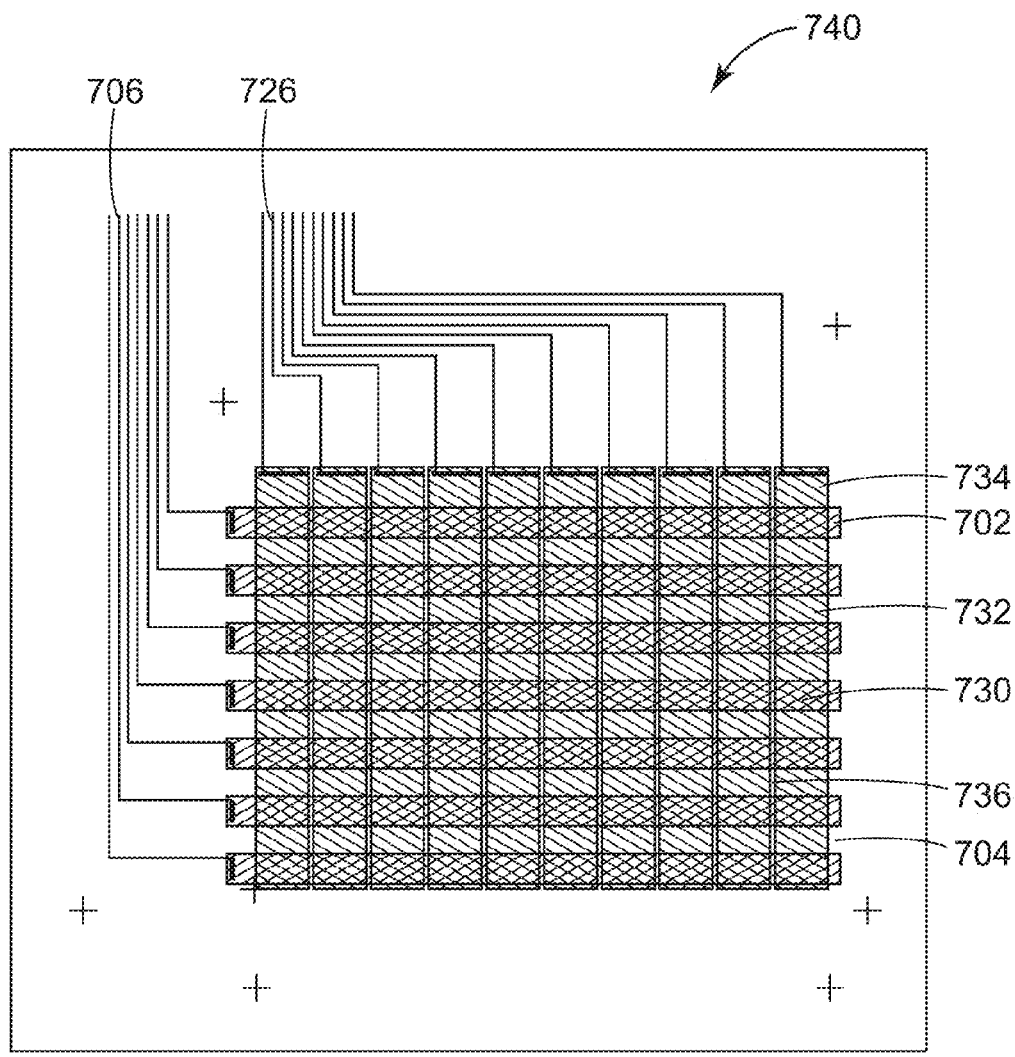
FIG. 37 illustrates a projected capacitive touch screen transparent sensor element constructed from the first and second patterned substrates of FIGS. 27 and 28.

FIG. 37 shows a top plan view of a multilayer touch screen sensor element 740 where the first and second patterned substrate have been laminated. Region 730 represented the overlap of the first and second continuous regions. Region 732 represented the overlap of the first continuous region and the second discontinuous region. Region 734 represented the overlap of the second continuous region and the first discontinuous region. And, region 736 represented the overlap between the first and second discontinuous regions. While there was a plurality of these overlap regions, for ease of illustration, only one region of each has been depicted in the figure. Column or row electrodes of element 740 may be configured according to embodiments described herein.

One skilled in the art will appreciate that the present invention can be practiced with embodiments other than those disclosed. The disclosed embodiments are presented for purposes of illustration and not limitation, and the present invention is limited only by the claims that follow.

The invention claimed is:

1. A touch screen sensor, comprising:
an upper electrode layer comprising an array of composite electrodes comprised of a plurality of continuous microwire conductors disposed in a first pattern;

a lower electrode layer comprising a plurality of electrodes;

wherein the upper and lower electrodes are separated by a dielectric layer, and together define an electrode matrix having nodes where the upper and lower electrodes cross over;

wherein the composite electrodes of the upper electrode layer includes interior regions electrically isolated from the continuous micro-wire conductors, the interior regions comprised of discontinuous micro-wire conductors, each interior region bounded by the continuous micro-wire conductors of one of the composite electrodes; and wherein the discontinuous micro-wire conductors of the interior regions are disposed in a second pattern.

2. The touch screen sensor of claim 1, wherein the first is the same as the second pattern.

3. The touch screen sensor of claim 1, wherein the interior regions are more pervious to electrical fields than electrically continuous regions of the composite electrodes.

4. The touch screen sensor of claim 1, wherein the upper and lower electrode layers are oriented such that the interior regions of the composite electrodes of the upper electrode layer are positioned at the nodes.

5. The touch screen sensor of claim 1, wherein the first or second pattern comprises repeating squares, diamonds, hexagons, or octagons.

6. The touch screen sensor of claim 5, wherein the repeating squares, diamonds, hexagons, or octagons are not all the same size.

7. A micro-wire based electrode for use in a touch sensor, the electrode comprising:

a plurality of continuous micro-conductors that define a first mesh pattern with a first characteristic average cell spacing, the first mesh pattern having interior regions that comprise discontinuous micro-conductors with a second characteristic average cell spacing; and wherein the interior regions extend over an area having lateral dimensions that are larger than the lateral dimensions of the area of the second characteristic average cell spacing.

8. The micro-wire based electrode of claim 7, wherein the first and second characteristic average cell spacings are substantially equal.

9. The micro-wire based electrode of claim 7, wherein the first characteristic average cell spacing is larger than the second characteristic average cell spacing.

10. The micro-wire based electrode of claim 7, wherein the first characteristic average cell spacing is an integral multiple of the second characteristic average cell spacing.

11. The micro-wire based electrode of claim 7, wherein the mesh pattern is a regular polygonal mesh.

12. The micro-wire based electrode of claim 7, wherein the mesh pattern is a pseudo-random mesh.

13. The micro-wire based electrode of claim 7, wherein the first characteristic average cell spacing is greater near the center of the electrode and lesser further away from the center of the electrode.

14. The micro-wire based electrode of claim 7, wherein the first character average cell spacing is variable as a function of location from the center of the electrode.

15. The micro-wire based electrode of claim 7, further comprising islands of electrically continuous micro-wires disposed within the interior regions.

16. The micro-wire based electrode of claim 15, wherein the islands are disposed according to a mesh pattern with a third characteristic average cell spacing that is substantially equal to the first characteristic average cell spacing.

17. The micro-wire based electrode of claim 7, wherein the first characteristic average cell spacing is less near the center of the electrode and greater further away from the center of the electrode.

* * * * *